(12) United States Patent
Tanaka et al.

(10) Patent No.: US 7,732,891 B2
(45) Date of Patent: Jun. 8, 2010

(54) SEMICONDUCTOR DEVICE

(75) Inventors: Hiroyasu Tanaka, Tokyo (JP); Hideaki Aochi, Kawasaki (JP); Ryota Katsumata, Yokohama (JP); Masaru Kidoh, Tokyo (JP); Yoshiaki Fukuzumi, Yokohama (JP); Masaru Kito, Yokohama (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 12/132,181

(22) Filed: Jun. 3, 2008

(65) Prior Publication Data

US 2009/0294844 A1 Dec. 3, 2009

(51) Int. Cl.
H01L 29/93 (2006.01)
H01L 21/76 (2006.01)

(52) U.S. Cl. ...................... 257/522; 438/411

(58) Field of Classification Search .......... 438/221, 438/319, 411, 619; 257/520–522, E21.573, 257/E23.013
See application file for complete search history.

(56) References Cited

U.S. PATENT DOCUMENTS

| | | | | |
|---|---|---|---|---|
| 4,881,105 A | * | 11/1989 | Davari et al. | ............ 257/334 |
| 5,336,917 A | * | 8/1994 | Kohyama | ............ 257/401 |
| 5,599,724 A | | 2/1997 | Yoshida | |
| 6,870,215 B2 | | 3/2005 | Endoh et al. | |
| 2007/0252201 A1 | | 11/2007 | Kito et al. | |

OTHER PUBLICATIONS

U.S. Appl. No. 11/962,862, filed Dec. 21, 2007, Hiroyasu Tanaka et al.
U.S. Appl. No. 12/018,486, filed Jan. 23, 2008, Hiroyasu Tanaka et al.
U.S. Appl. No. 12/392,636, filed Feb. 25, 2009, Ishiduki et al.
U.S. Appl. No. 12/501,142, filed Jul. 10, 2009, Fukuzumi et al.
U.S. Appl. No. 12/325,023, filed Nov. 28, 2008, Fukuzumi et al.

* cited by examiner

*Primary Examiner*—Calvin Lee
(74) *Attorney, Agent, or Firm*—Oblon, Spivak, McClelland, Maier & Neustadt, L.L.P.

(57) ABSTRACT

A semiconductor device has a substrate, a source region formed on the surface portion of the substrate, a first insulating layer formed on the substrate, a gate electrode formed on the first insulating layer, a second insulating layer formed on the gate electrode, a body section connected with the source region, penetrating through the first insulating layer, the gate electrode and the second insulating layer, and containing a void, a gate insulating film surrounding the body section, and formed between the body section and the gate electrode, and a drain region connected with the body section.

4 Claims, 54 Drawing Sheets

US 7,732,891 B2

SEMICONDUCTOR DEVICE

CROSS REFERENCE TO RELATED APPLICATIONS

This application is based upon the Japanese Patent Application No. 2007-733, filed on Jan. 5, 2007, the entire contents of which are incorporated herein by reference.

BACKGROUND OF THE INVENTION

1. Field of the Invention

The present invention relates to a semiconductor device.

2. Related Art

With the scale down of design rules, the miniaturization of memory elements is required. As a technology to break through the limit of highly integrating devices by miniaturization on a two-dimensional silicon substrate, a semiconductor memory device wherein memory elements are vertically (in a vertical direction to the surface of the substrate) disposed has been proposed. In such a vertical transistor, a source, a gate, and a drain are disposed in a vertical direction, and a body of amorphous silicon is formed between the source and the drain.

In such a vertical transistor, when a drain voltage is elevated, a depletion layer extends because the body is filled with amorphous silicon, the potential barrier where the inversion charge flowing from the end of the source into the channel impinges may lower, and the threshold value of the transistor may lower to deteriorate cutoff characteristics. Such a phenomenon is referred to as drain induced barrier lowering (DIBL).

SUMMARY OF THE INVENTION

According to one aspect of the present invention, there is provided a semiconductor device comprising:

a substrate;

a source region formed on the surface portion of the substrate, a first insulating layer formed on the substrate;

a gate electrode formed on the first insulating layer;

a second insulating layer formed on the gate electrode;

a body section connected with the source region, penetrating through the first insulating layer, the gate electrode and the second insulating layer, and containing a void;

a gate insulating film surrounding the body section, and formed between the body section and the gate electrode; and a drain region connected with the body section.

According to one aspect of the present invention, there is provided a semiconductor device comprising:

a source region surrounded by a first insulating film;

a second insulating film formed on the first insulating film and the source region;

a plurality of third insulating films and gate electrodes alternately laminated on the second insulating film;

a body section connected with the source region, penetrating through the plurality of third insulating films, gate electrodes and the second insulating film; and containing a void;

a fourth insulating film surrounding the body section, having a charge accumulating ability formed between the body section and the gate electrode; and a drain region formed on the body section.

According to one aspect of the present invention, there is provided a semiconductor device comprising:

a substrate;

a source region formed on the surface portion of the substrate, a first insulating layer formed on the substrate;

a gate electrode formed on the first insulating layer;

a second insulating layer formed on the gate electrode;

a body section connected with the source region, penetrating through the first insulating layer, the gate electrode and the second insulating layer, and containing a third insulating layer;

a gate insulating film surrounding the body section, and formed between the body section and the gate electrode; and a drain region connected with the body section.

DETAILED DESCRIPTION OF THE INVENTION

A semiconductor device according to the embodiments of the present invention will be described hereunder on the basis of the drawings.

First Embodiment

Figure 1:
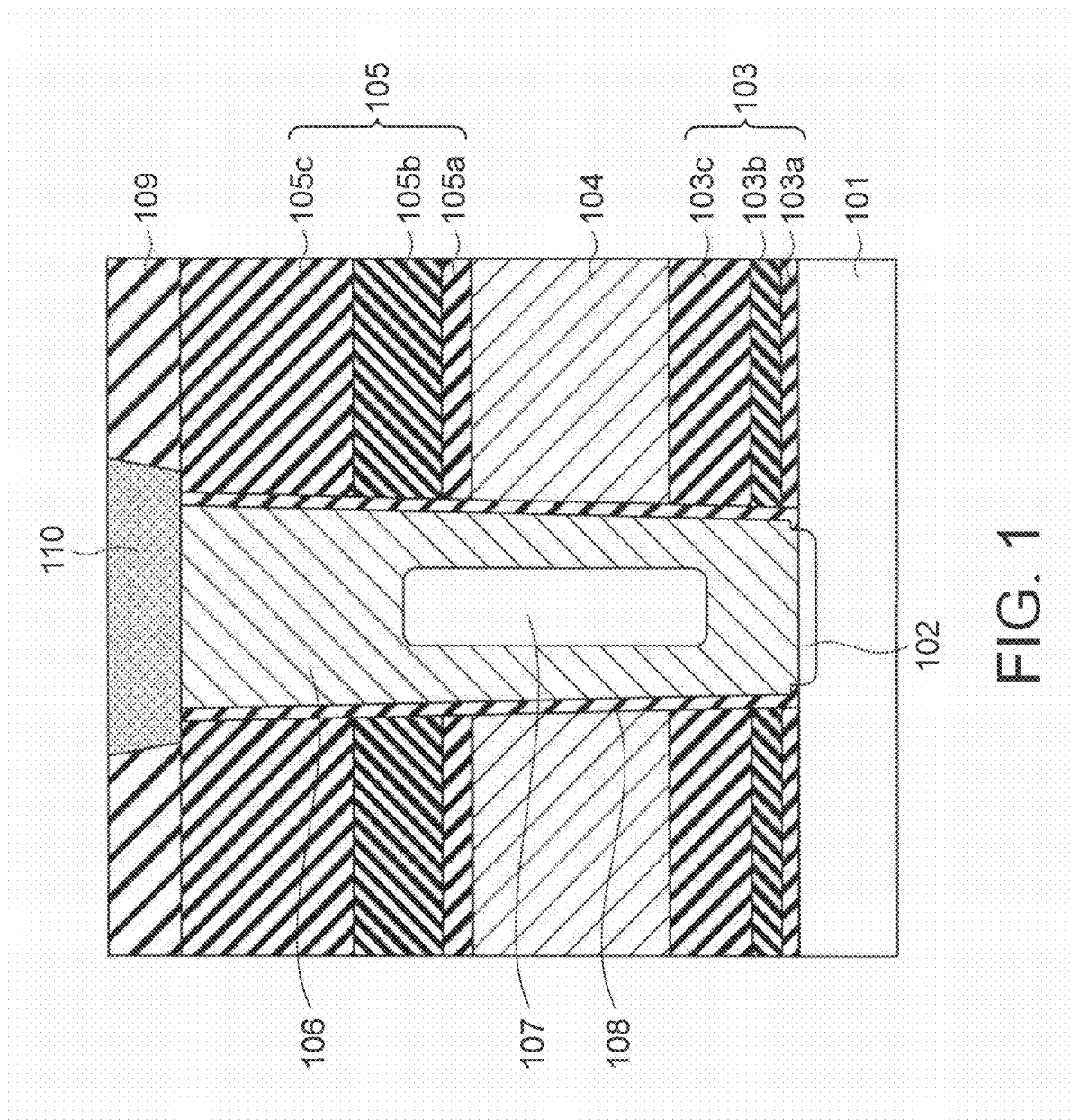
FIG. 1 is a diagram showing the schematic configuration of a semiconductor device according to the first embodiment of the present invention.

FIG. 1 shows the schematic configuration of a semiconductor device according to the first embodiment of the present invention. The semiconductor device is composed of a semiconductor substrate 101, a source region 102 formed on the surface portion of the semiconductor substrate 101, an insulating layer 103 formed on the semiconductor substrate 101, a gate electrode 104 formed on the insulating layer 103, an insulating layer 105 formed on the gate electrode 104, and a void 107. The semiconductor device is also equipped with a body 106 formed so as to penetrate the insulating layer 103, the gate electrode 104 and the insulating layer 105 in a vertical direction to connect with the source region 102; a gate insulating film 108 surrounding the side of the body 106 and formed between the body 106 and the gate electrode 104; an insulating film 109; and a drain region 110 formed on the body 106 so as to be connected with the body 106.

The insulating layer 103 has a laminated structure formed of a silicon oxide film 103a, a silicon nitride film 103b, and a silicon oxide film 103c. The insulating layer 105 has a laminated structure formed of a silicon oxide film 105a, a silicon nitride film 105b, and a silicon oxide film 105c. The gate insulating film 108 is a silicon oxide film, the body 106 is formed of amorphous silicon, and the insulating film 109 is a silicon oxide film. The gate electrode 104 is formed of amorphous silicon.

In the semiconductor device, since the void 107 is present in the body 106, the body 106 below the gate electrode 104 (lateral direction in FIG. 1) is thin. Thereby, when the drain voltage is elevated, the expansion of the deplete layer is restricted, DIBL can be suppressed, and cutoff characteristics can be improved. The body 106 below the gate electrode 104 (lateral direction in FIG. 1) may be thinned by burying the void 107 with silicon oxide.

A method for fabricating a semiconductor device according to the present embodiment will be described.

Figure 2:
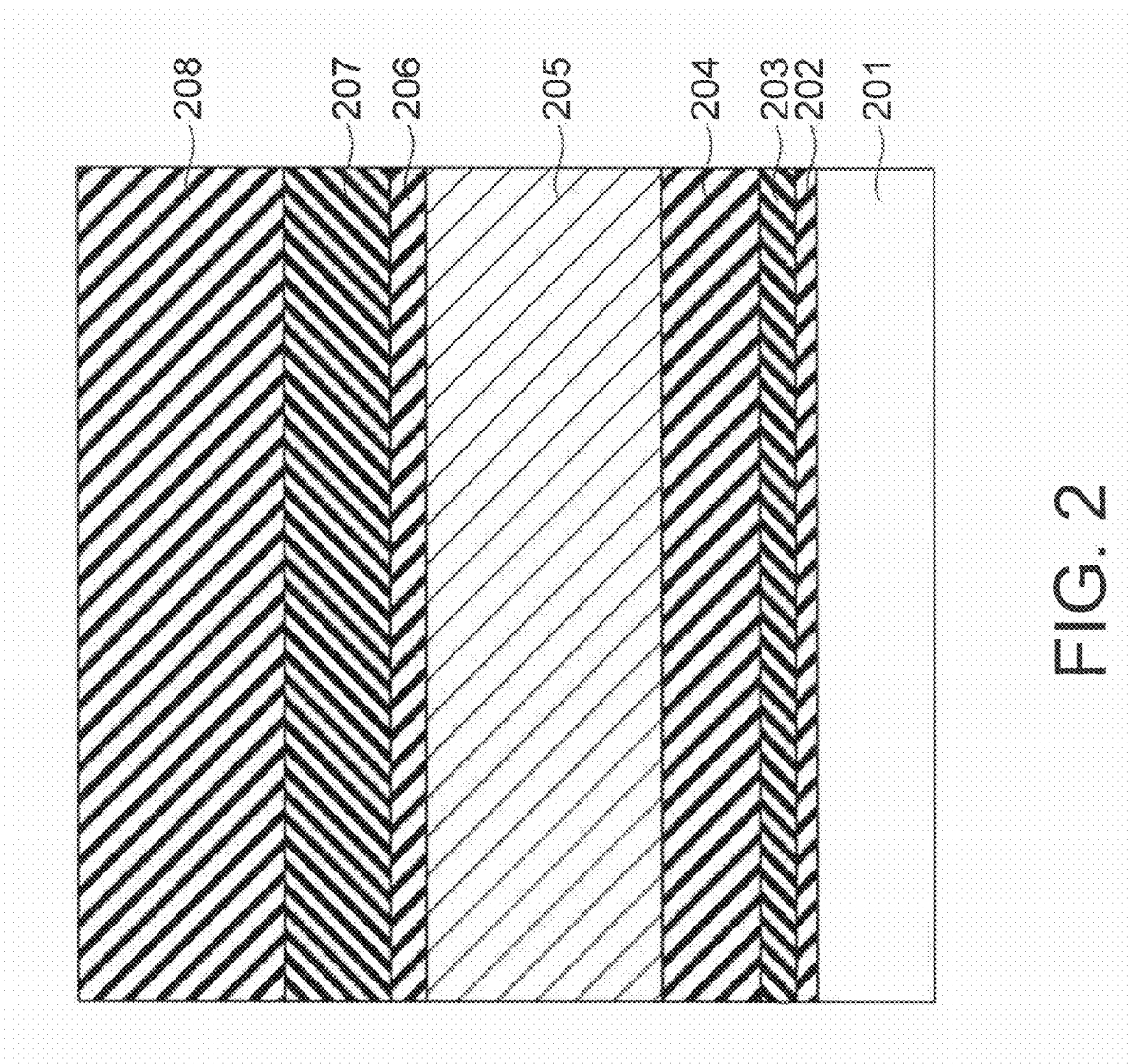
FIG. 2 is a sectional view illustrating one step of a method for manufacturing a semiconductor device according to the first embodiment.

As shown in FIG. 2, on a substrate 201, a silicon oxide film 202 having a thickness of 10 nm, a silicon nitride film 203 having a thickness of 15 nm, a silicon oxide film 204 having a thickness of 60 nm, an amorphous silicon 205 having a thickness of 200 nm, a silicon oxide film 206 having a thickness of 15 nm, a silicon nitride film 207 having a thickness of 70 nm, and a silicon oxide film 208 having a thickness of 300 nm are sequentially deposited using a chemical vapor deposition (CVD) method. On the surface portion of the substrate 201, a source region (not shown) is formed by the implantation and activation of an impurity, such as phosphorus.

Figure 3:
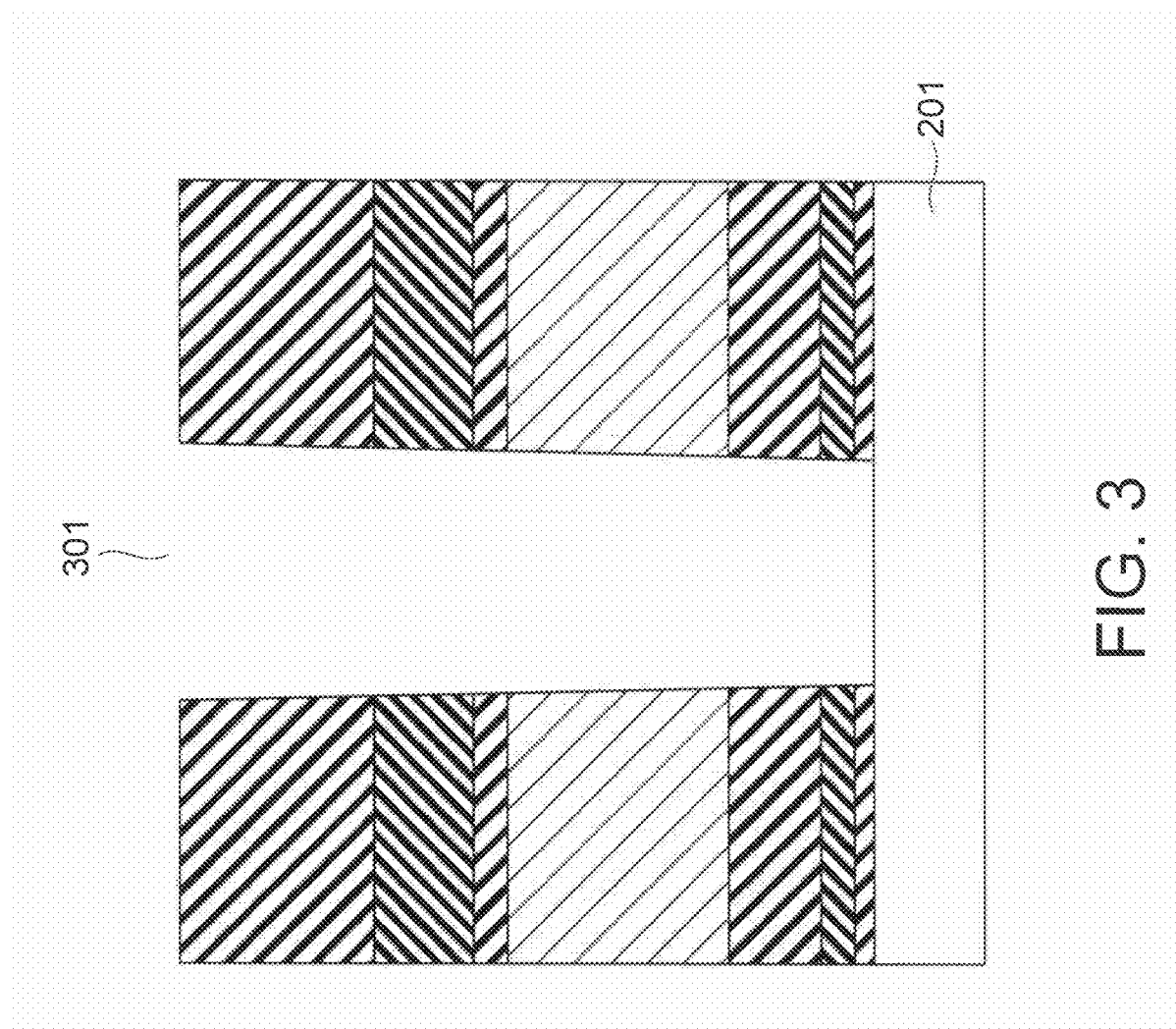
FIG. 3 is a sectional view showing a step subsequent to FIG. 2.

As shown in FIG. 3, a hole 301 that exposes the upper surface of the substrate 201 is formed using lithography and a reactive ion etching (RIE). The diameter of the hole 301 is, for example, 90 nm.

Figure 4:
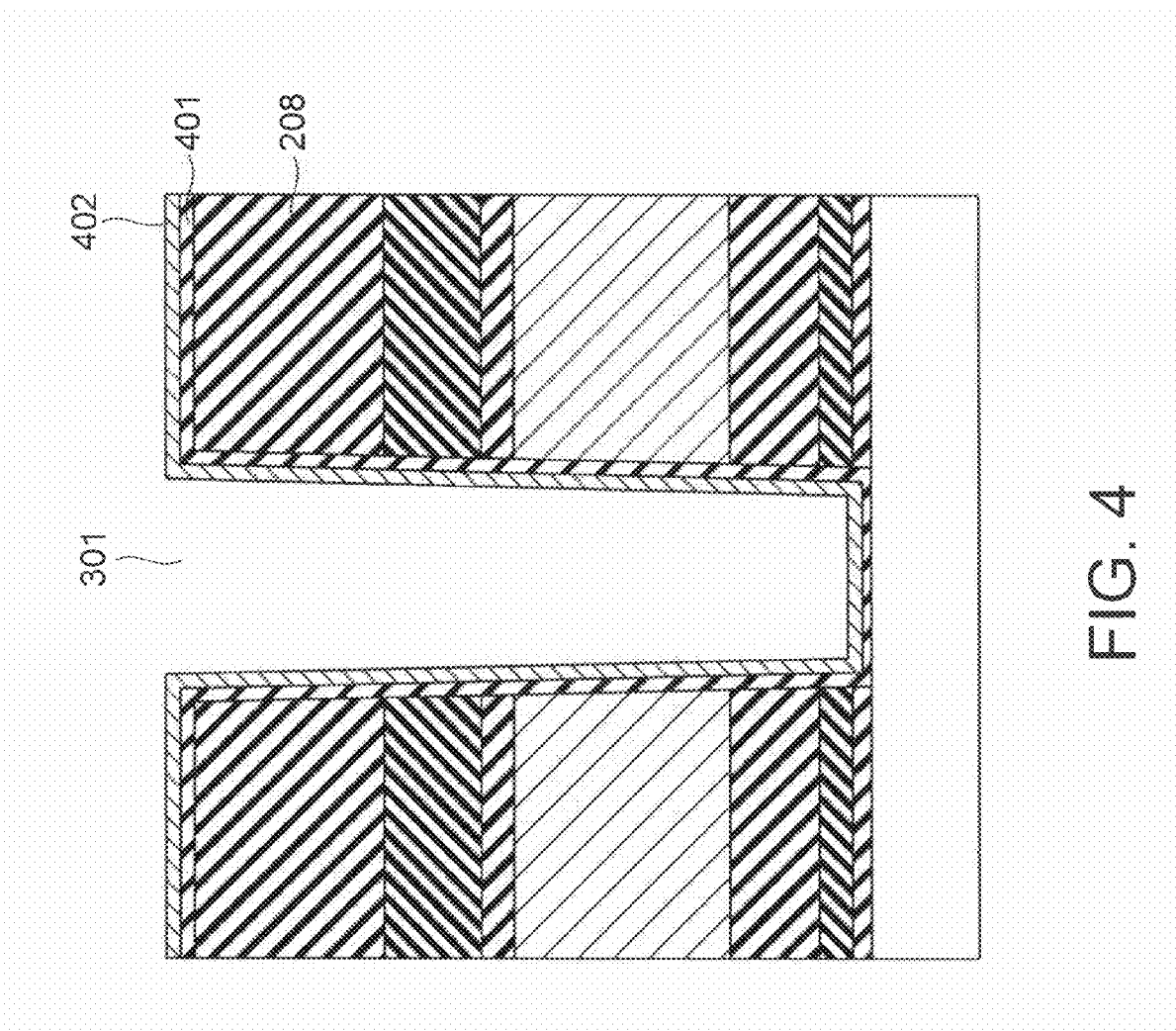
FIG. 4 is a sectional view showing a step subsequent to FIG. 3.

As shown in FIG. 4, a silicon oxide film 401 having a thickness of 10 nm and an amorphous silicon film 402 having a thickness of 15 nm are formed using CVD so as to coat the inner wall of the hole 301 and the upper surface of the silicon oxide film 208.

Figure 5:
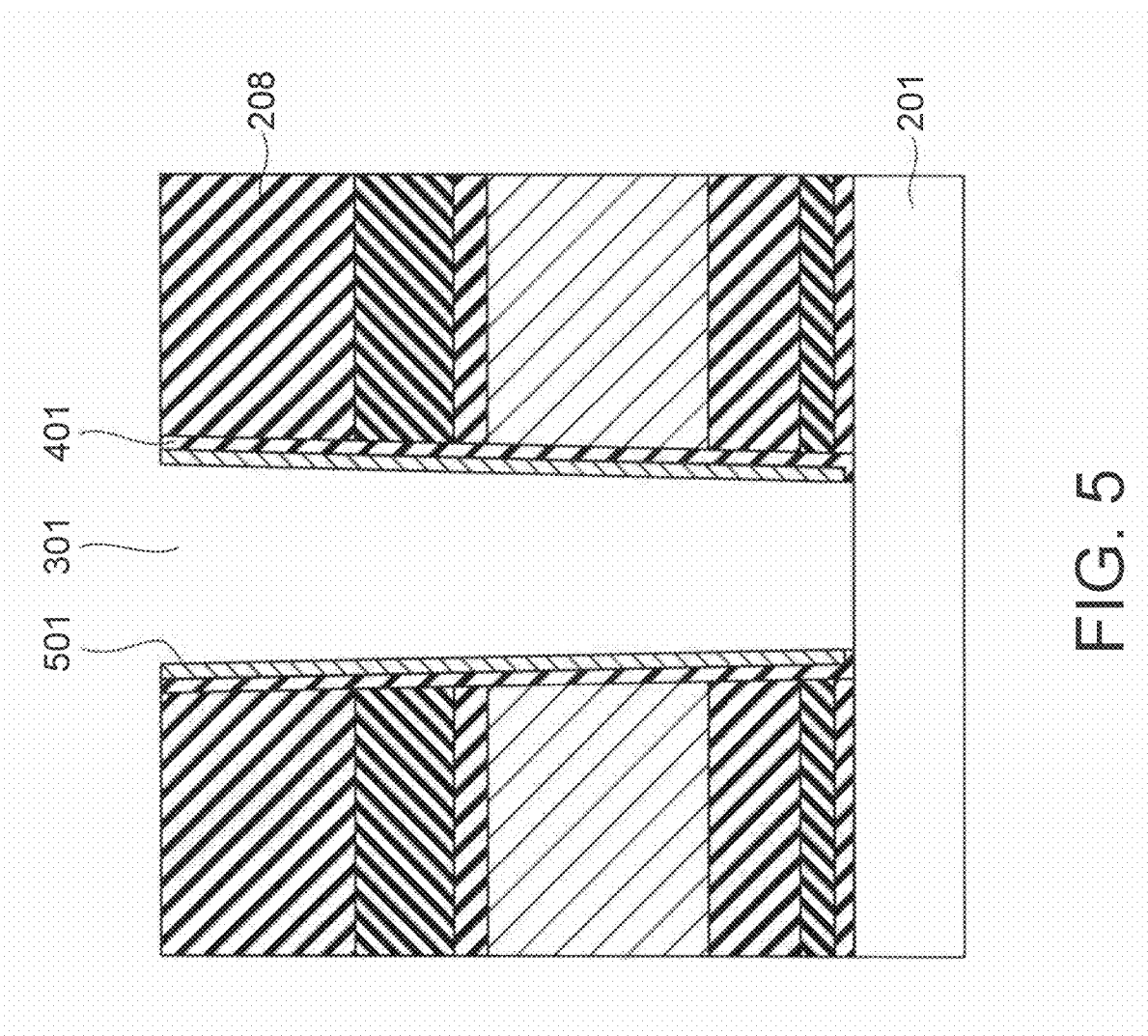
FIG. 5 is a sectional view showing a step subsequent to FIG. 4.

As shown in FIG. 5, the amorphous silicon film 402 at the bottom of the hole 301 and on the silicon oxide film 208 are removed using RIE to form a spacer 501 on the sidewall of the hole 301, and using the spacer 501 as a protective material for the silicon oxide film 401 on the sidewall of the hole 301, the silicon oxide film 401 present on places other than the sidewall of the hole 301 is removed using RIE to expose the upper surface of the substrate 201.

Figure 6:
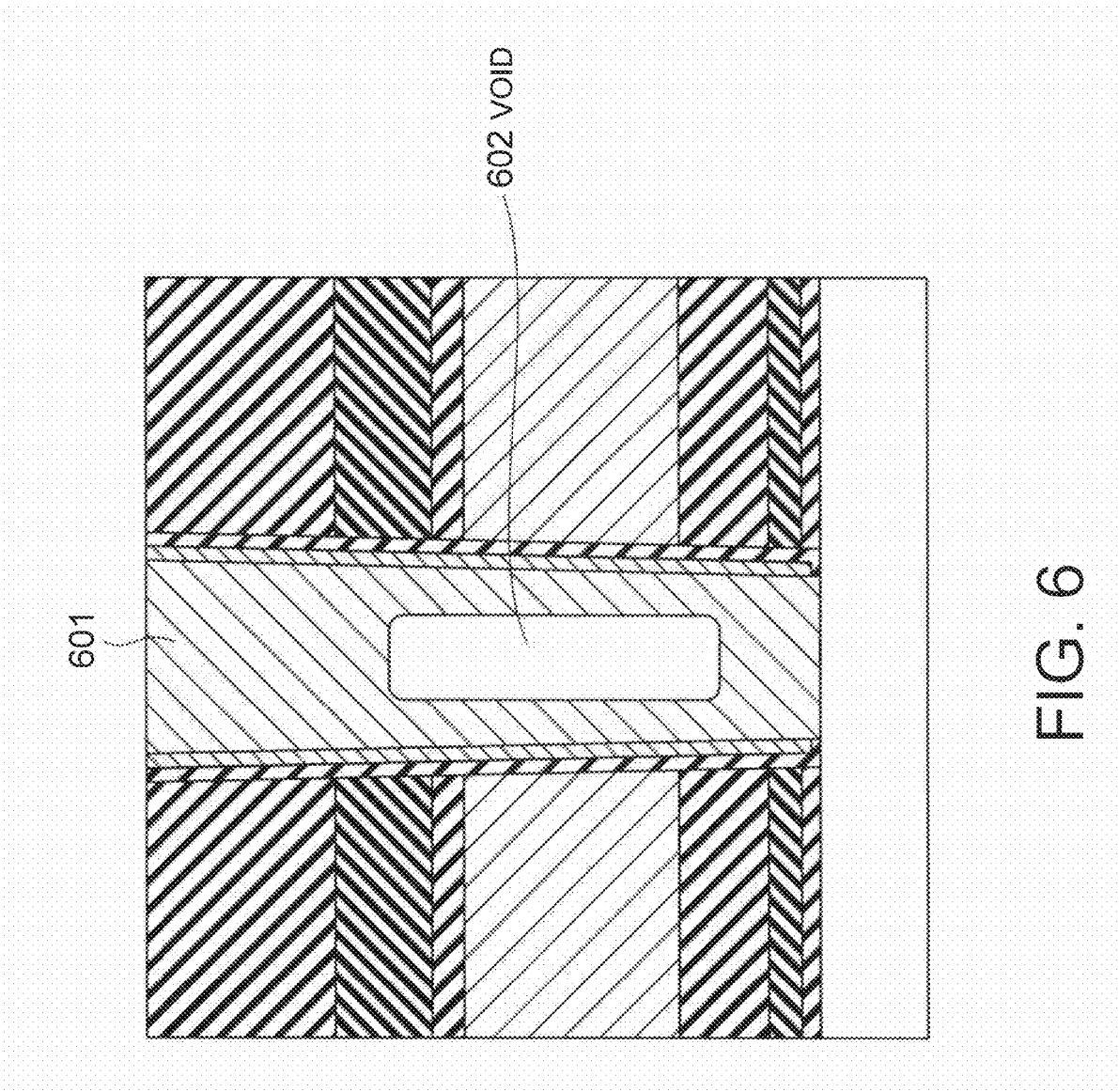
FIG. 6 is a sectional view showing a step subsequent to FIG. 5.

As shown in FIG. 6, an amorphous silicon film 601 that becomes a body is deposited in the hole 301 using CVD so as to form a void (hollow space) 602, and the amorphous silicon film 601 above the silicon oxide film 208 is removed and planarized. During CVD, the pressure or the temperature of the gas is raised to facilitate the formation of the void.

Figure 7:
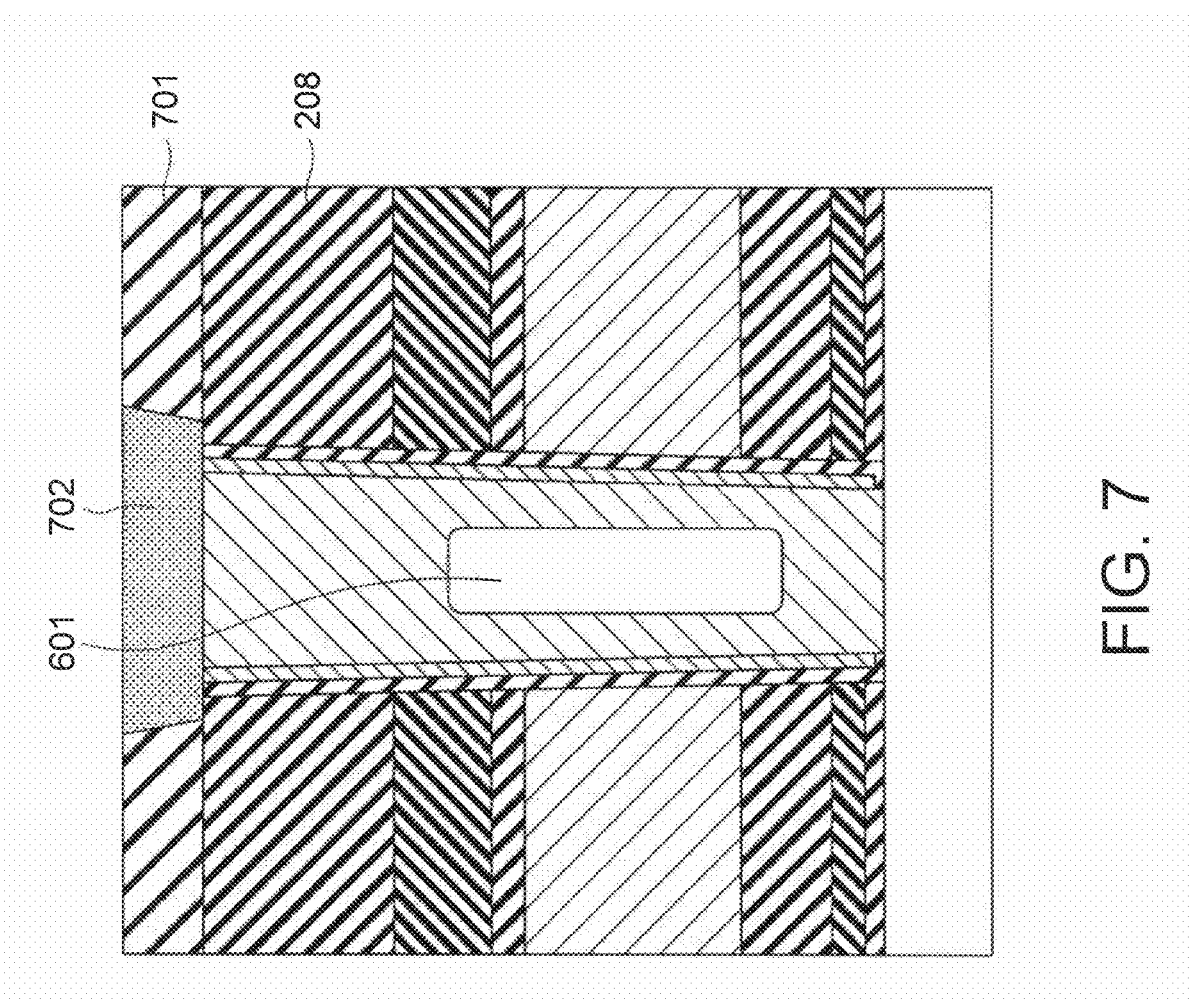
FIG. 7 is a sectional view showing a step subsequent to FIG. 6.

As shown in FIG. 7, a silicon oxide film 701 is deposited on the amorphous silicon film 601 and the silicon oxide film 208 using CVD, and a wiring (drain) 702 is formed on the amorphous silicon film 601.

Thereby, a semiconductor device having a void in the body can be obtained. Since the body under the gate electrode is thinned, and the expansion of the deplete layer is restricted, DIBL can be suppressed, and cutoff characteristics can be improved.

Second Embodiment

Figure 8:
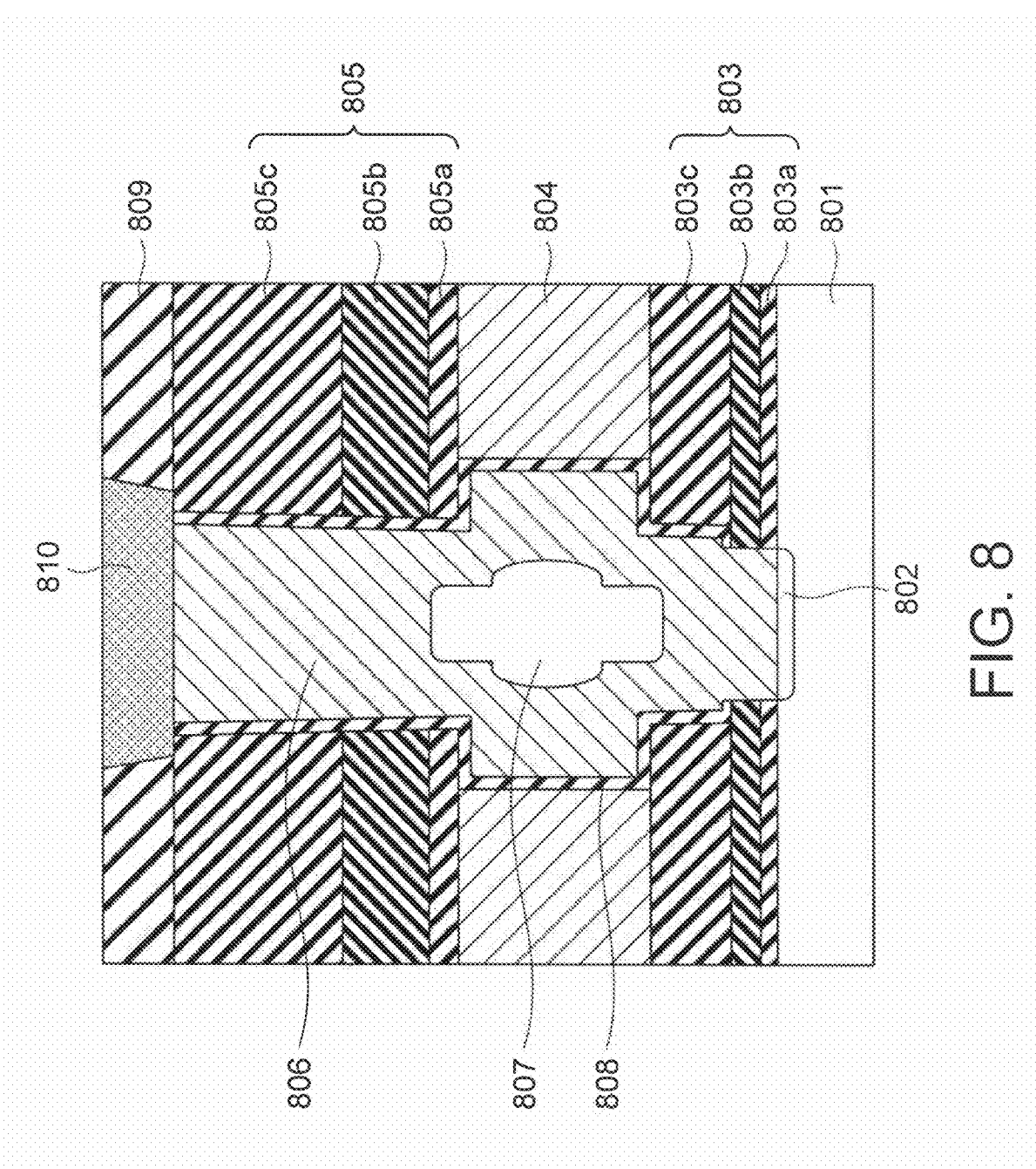
FIG. 8 is a diagram showing the schematic configuration of a semiconductor device according to the second embodiment of the present invention.

FIG. 8 shows the schematic configuration of a semiconductor device according to the second embodiment of the present invention. The semiconductor device is composed of a semiconductor substrate 801, a source region 802 formed on the surface portion of the semiconductor substrate 801, an insulating layer 803 formed on the semiconductor substrate 801, a gate electrode 804 formed on the insulating layer 803, an insulating layer 805 formed on the gate electrode 804, and a void 807. The semiconductor device is also equipped with a body 806 formed so as to penetrate the insulating layer 803, the gate electrode 804 and the insulating layer 805 in a vertical direction to connect with the source region 802; a gate insulating film 808 coating the side of the body 806 and formed between the body 806 and the gate electrode 804; an insulating film 809 formed on the insulating layer 805; and a drain region 810 formed on the body 806.

The insulating layer 803 has a laminated structure formed of a silicon oxide film 803a, a silicon nitride film 803b, and a silicon oxide film 803c. The insulating layer 805 has a laminated structure formed of a silicon oxide film 805a, a silicon nitride film 805b, and a silicon oxide film 805c. The gate insulating film 808 is a silicon oxide film, the body 806 is formed of amorphous silicon, and the insulating film 809 is a silicon oxide film. The gate electrode 804 is formed of amorphous silicon.

When viewed from the body 806, the gate electrode 804 is recessed in comparison with the insulating layers 803 and 805. Thereby, the void 807 in the body 806 can be larger formed, and DIBL can be suppressed and cutoff characteristics can be improved further efficiently.

Next, a method for fabricating a semiconductor device according to the present embodiment will be described. Since the process is identical to the process up to the formation of the hole 301 in the method for fabricating a semiconductor device according to the above-described first embodiment (FIG. 3), the description thereof will be omitted. However, in the present embodiment, the hole 301 is formed so as to expose the upper surface of the silicon nitride film 203.

Figure 9:
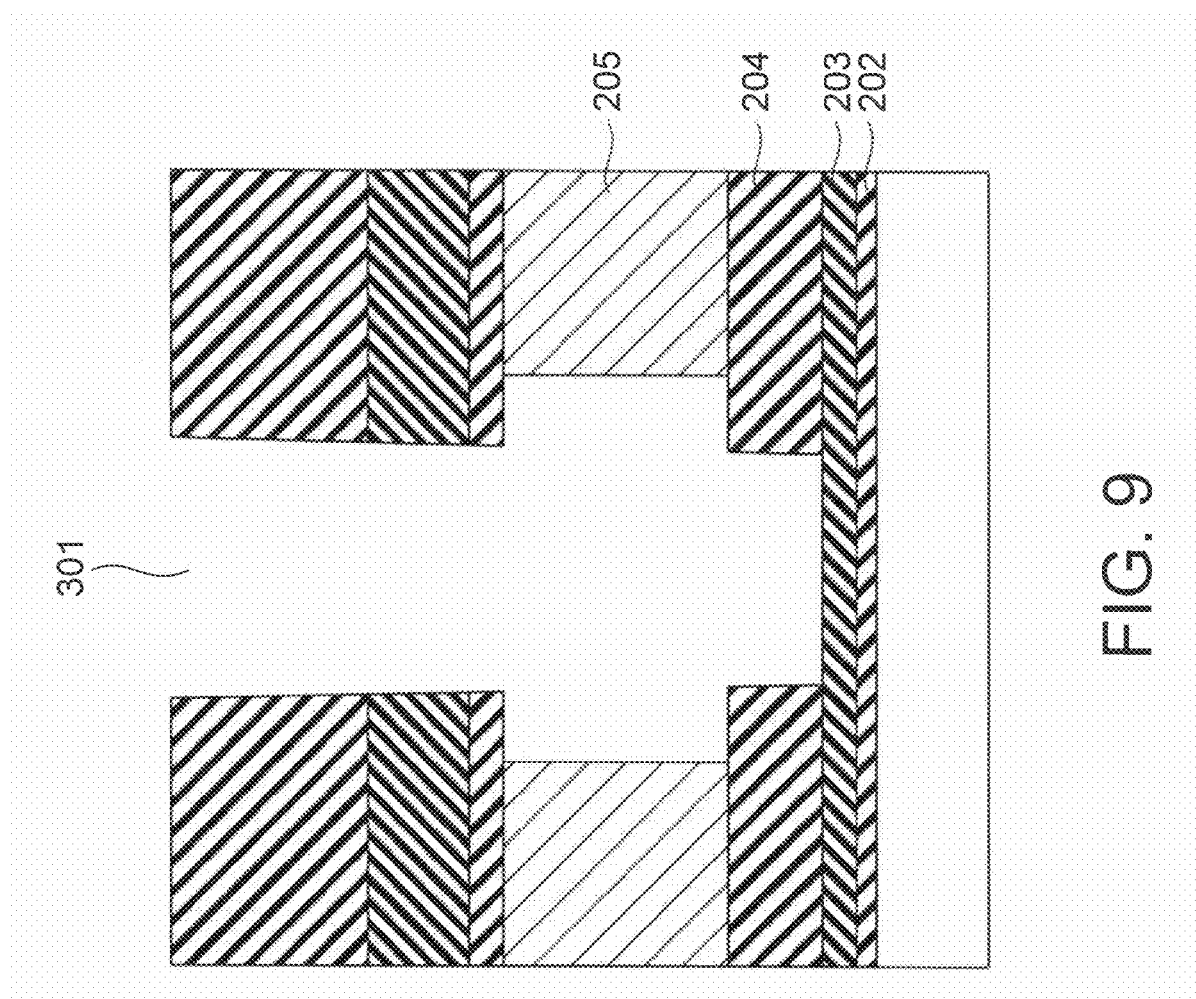
FIG. 9 is a sectional view illustrating one step of a method for manufacturing a semiconductor device according to the second embodiment.

As shown in FIG. 9, dry isotropic etching of a higher selectivity to the amorphous silicon film than the silicon oxide film and the silicon nitride film is performed to make the amorphous silicon film 205 recessed viewed from the hole 301.

Figure 10:
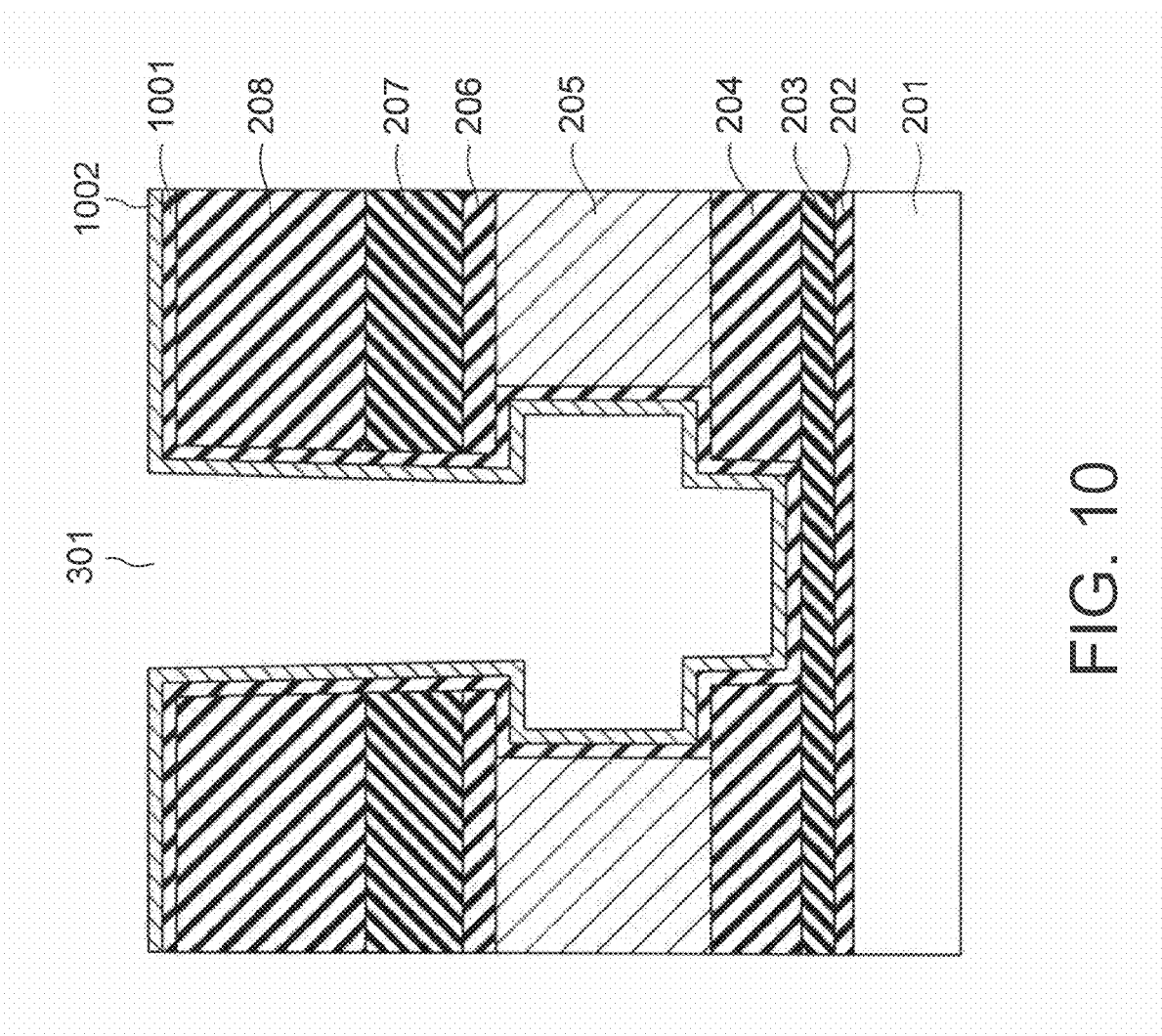
FIG. 10 is a sectional view showing a step subsequent to FIG. 9.

As shown in FIG. 10, a silicon oxide film 1001 having a thickness of 10 nm and an amorphous silicon film 1002 having a thickness of 15 nm are deposited using CVD so as to coat the inner wall of the hole 301 and the upper surface of the silicon oxide film 208. At this time, the silicon oxide film 1001 and the amorphous silicon film 1002 have irregularity corresponding to the shapes of the silicon oxide film 204, the amorphous silicon film 205, the silicon oxide film 206, the silicon nitride film 207, and the silicon oxide film 208.

Figure 11:
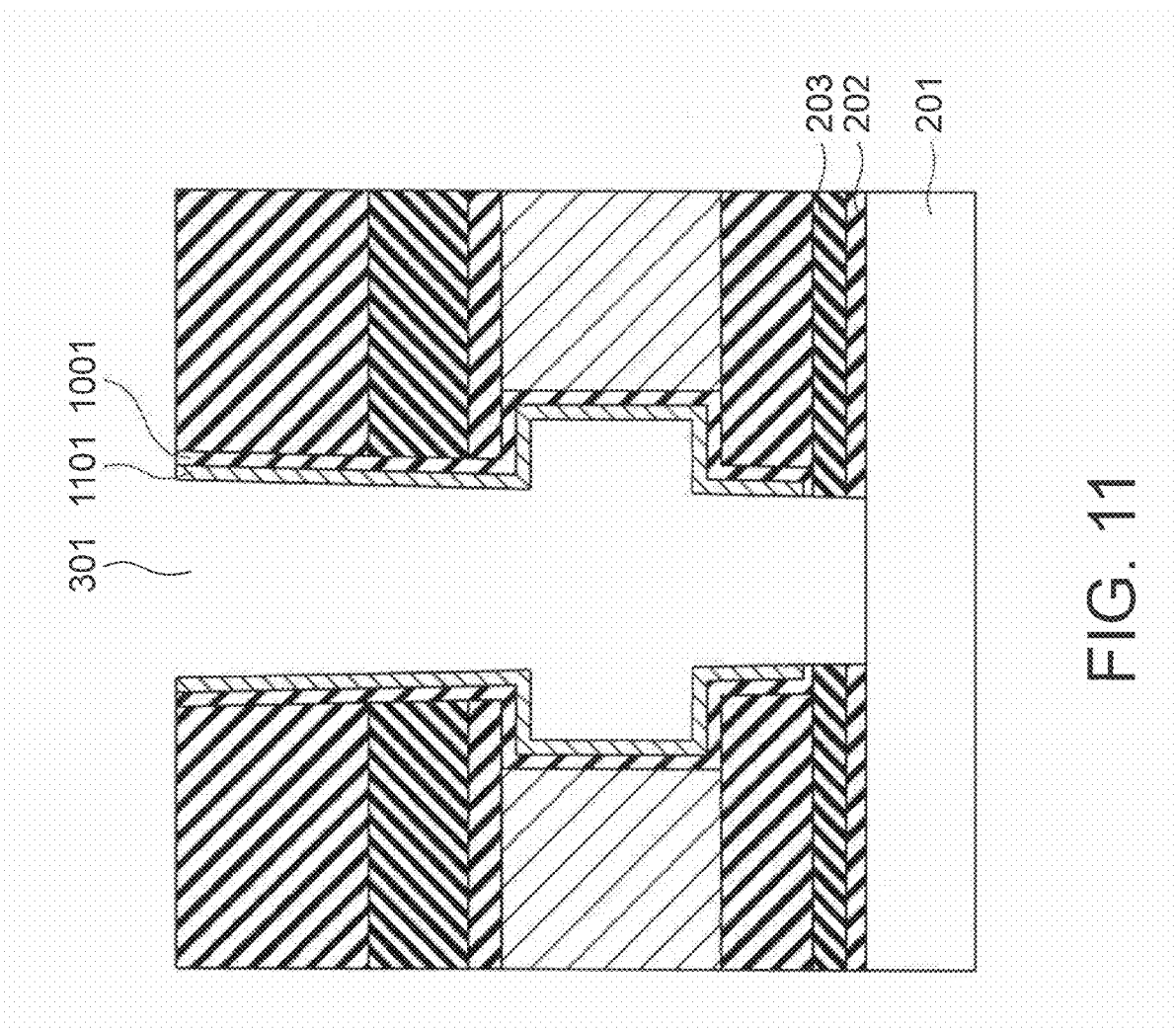
FIG. 11 is a sectional view showing a step subsequent to FIG. 10.

As shown in FIG. 11, the amorphous silicon film 1002 at the places other than the sidewall of the hole 301 is removed using RIE to form a spacer 1101 on the sidewall of the hole 301, and using the spacer 1101 as a protective material for the silicon oxide film 1001 on the sidewall of the hole 301, the silicon oxide film 1001, the silicon nitride film 203, and the silicon oxide film 202 present on places other than the sidewall of the hole 301 are removed using RIE to expose the upper surface of the substrate 201.

Figure 12:
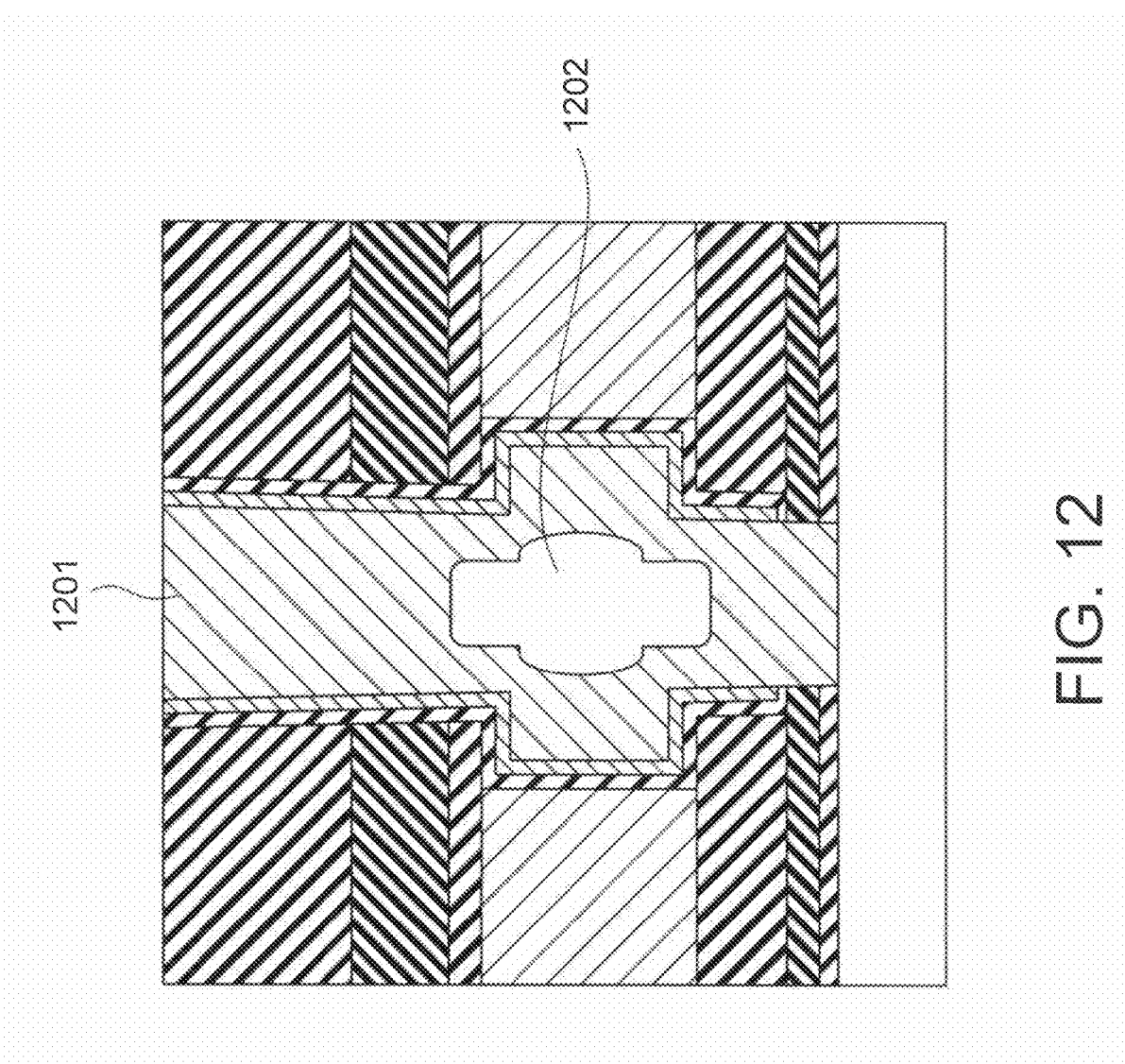
FIG. 12 is a sectional view showing a step subsequent to FIG. 11.

As shown in FIG. 12, an amorphous silicon film 1201 is deposited in the hole 301 using CVD so as to form a void (hollow space) 1202, and the amorphous silicon film 1201 above the silicon oxide film 208 is removed and planarized. During CVD, the pressure or the temperature of the gas is raised to facilitate the formation of the void.

Figure 13:
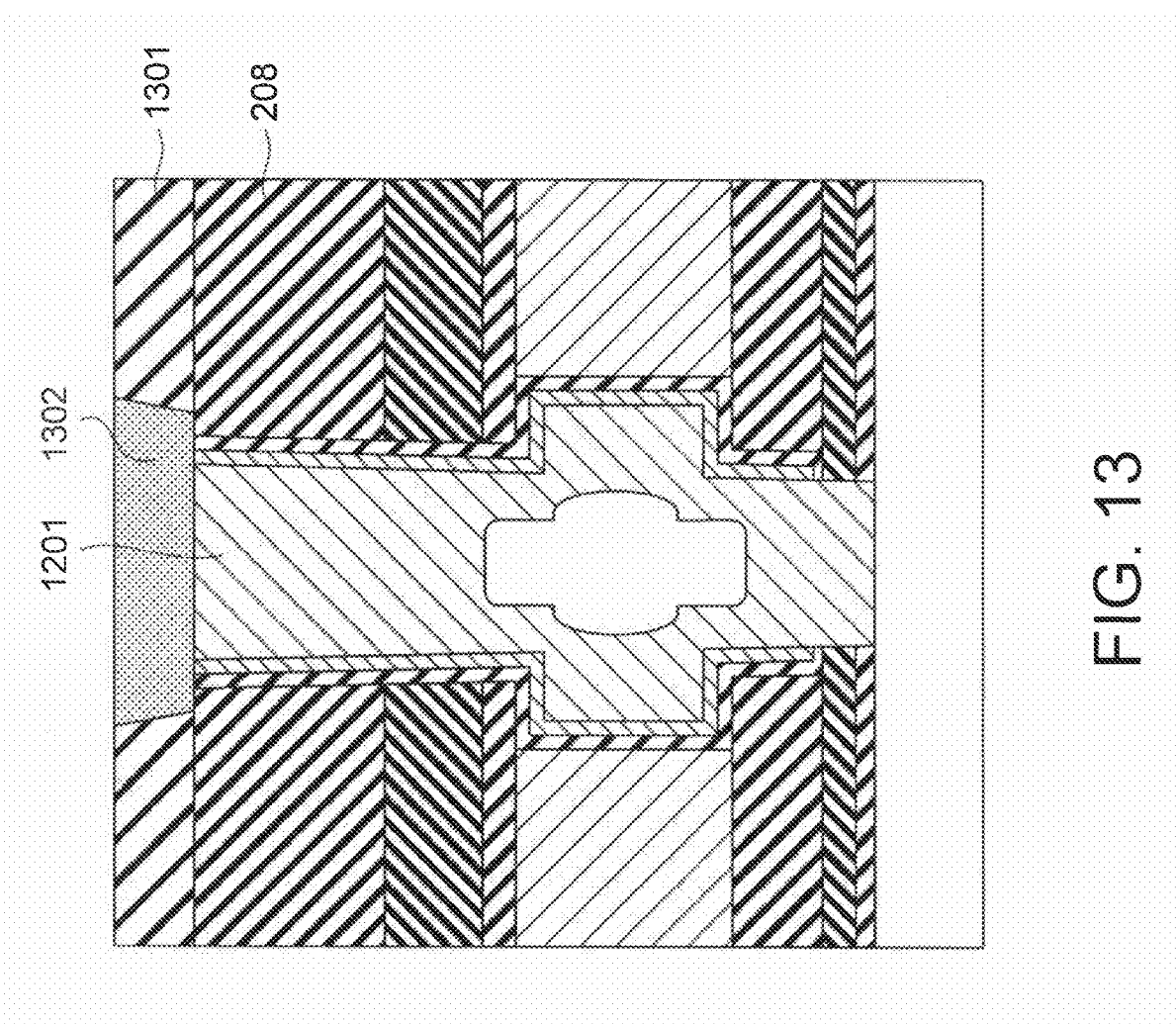
FIG. 13 is a sectional view showing a step subsequent to FIG. 12.

As shown in FIG. 13, a silicon oxide film 1301 is deposited on the amorphous silicon film 1201 and the silicon oxide film 208 using CVD, and a wiring (drain region) 1302 is formed on the amorphous silicon film 1201.

Thereby, a semiconductor device having a void in the body can be obtained. Since the body under the gate electrode (in lateral direction in the drawing) is thinned, and the expansion of the deplete layer is restricted, DIBL can be suppressed, and cutoff characteristics can be improved. Also since the gate is recessed viewed from the body, the void can be easily formed, and the cutoff characteristics can be improved more efficiently.

Third Embodiment

Figure 14:
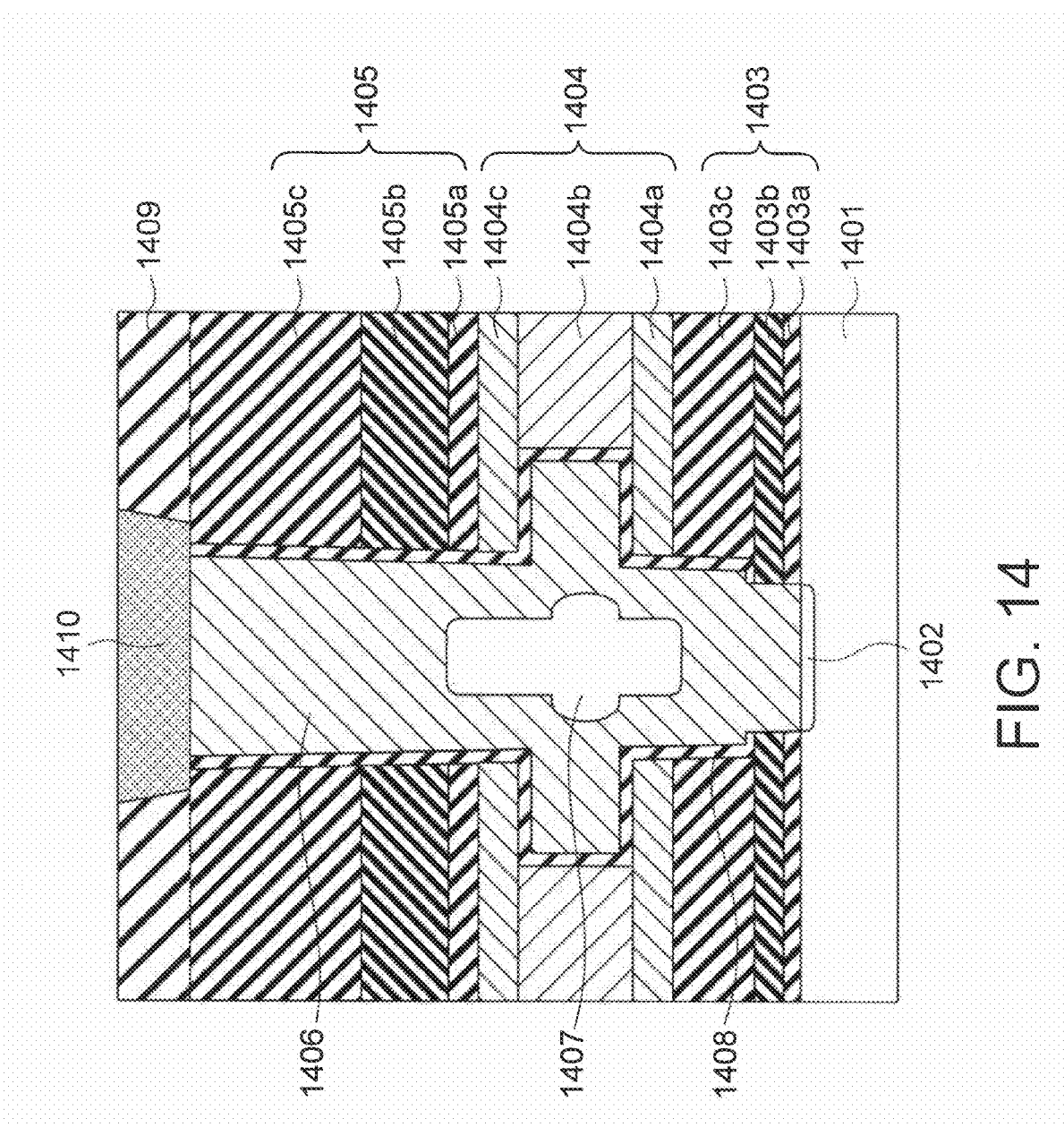
FIG. 14 is a diagram showing the schematic configuration of a semiconductor device according to the third embodiment of the present invention.

FIG. 14 shows the schematic configuration of a semiconductor device according to the third embodiment of the present invention. The semiconductor device is composed of a semiconductor substrate 1401, a source region 1402 formed on the surface portion of the semiconductor substrate 1401, an insulating layer 1403 formed on the semiconductor substrate 1401, a gate electrode 1404 formed on the insulating layer 1403, an insulating layer 1405 formed on the gate electrode 1404, and a void 1407. The semiconductor device is also equipped with a body 1406 formed so as to penetrate the insulating layer 1403, the gate electrode 1404 and the insulating layer 1405 in a vertical direction to connect with the source region 1402; a gate insulating film 1408 surrounding the side of the body 1406 and formed between the body 1406 and the gate electrode 1404; an insulating film 1409; and a drain region 1410.

The insulating layer 1403 has a laminated structure formed of a silicon oxide film 1403a, a silicon nitride film 1403b, and a silicon oxide film 1403c. The insulating layer 1405 has a laminated structure formed of a silicon oxide film 1405a, a silicon nitride film 1405b, and a silicon oxide film 1405c. The gate electrode 1404 has a laminated structure formed of an amorphous silicon film 1404b, and boron-doped amorphous silicon films 1404a and 1404c. The gate insulating film 1408 is a silicon oxide film, the body 1406 is an amorphous silicon film, and the insulating film 1409 is a silicon oxide film.

The amorphous silicon film 1404b in the gate electrode 1404 is recessed in comparison with the boron-doped amorphous silicon films 1404a and 1404c when viewed from the body 1406.

In the semiconductor device, since the void 1407 is present in the body 1406, the body 1406 below the gate electrode 1404 (lateral direction in the drawing) can be more thinned than when the body is filled with amorphous silicon. Thereby, when the drain voltage is elevated, the expansion of the deplete layer is restricted, DIBL can be suppressed, and cutoff characteristics can be improved. Also since the center portion of gate electrode 1404 is recessed, the channel can be elongated. Furthermore, since the center portion of gate electrode 1404 is recessed when viewed from the body, a large void can be formed, and cutoff characteristics can be improved more efficiently.

Next, a method for fabricating a semiconductor device according to the present embodiment will be described.

Figure 15:
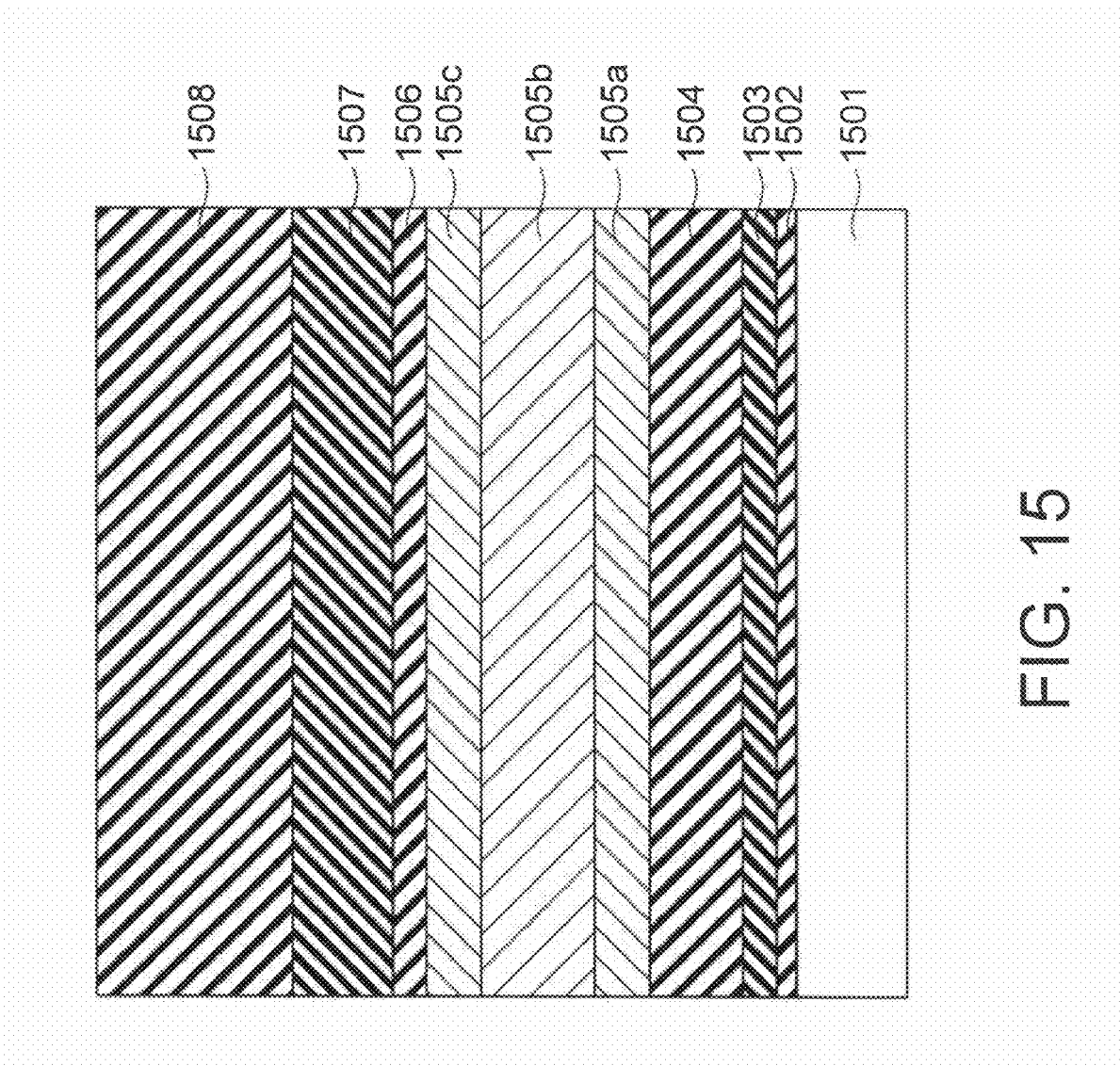
FIG. 15 is a sectional view illustrating one step of a method for manufacturing a semiconductor device according to the third embodiment.

As shown in FIG. 15, on a substrate 1501, a silicon oxide film 1502 having a thickness of 10 nm, a silicon nitride film 1503 having a thickness of 15 nm, a silicon oxide film 1504 having a thickness of 60 nm, a boron-doped amorphous silicon film 1505a having a thickness of 20 nm, an amorphous silicon film 1505b having a thickness of 90 nm, a boron-doped amorphous silicon film 1505c having a thickness of 20 nm, a silicon oxide film 1506 having a thickness of 300 nm, a silicon nitride film 1507 having a thickness of 70 nm, and a silicon oxide film 1508 having a thickness of 300 nm are deposited using CVD. On the surface portion of the substrate 1501, a source region (not shown) is formed by the implantation of an impurity, such as phosphorus.

Figure 16:
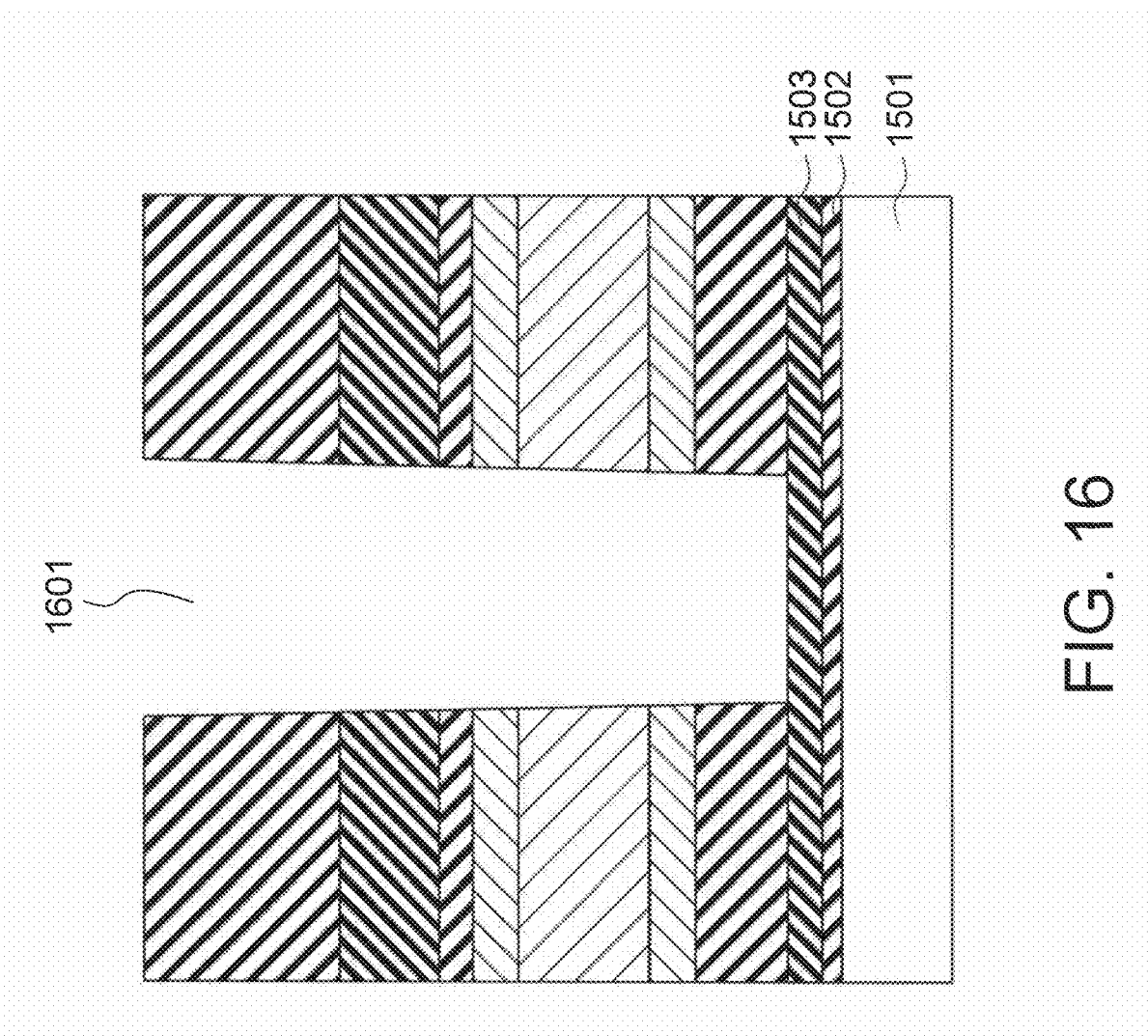
FIG. 16 is a sectional view showing a step subsequent to FIG. 15.

As shown in FIG. 16, a hole 1601 that exposes the upper surface of the silicon nitride film 1503 is formed using lithography and a reactive ion etching (RIE). The diameter of the hole 1601 is, for example, 90 nm.

Figure 17:
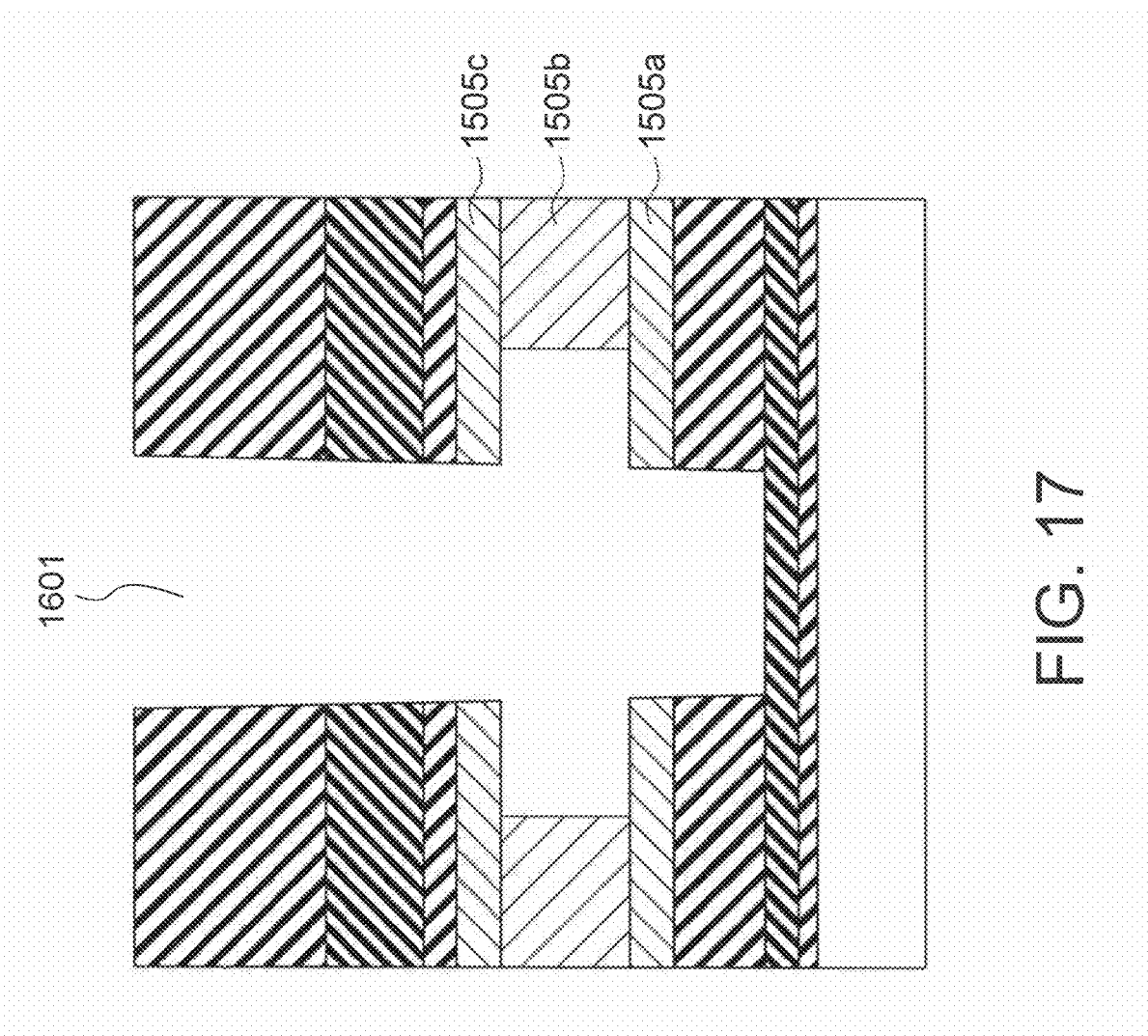
FIG. 17 is a sectional view showing a step subsequent to FIG. 16.

As shown in FIG. 17, dry isotropic etching of a higher selectivity to the amorphous silicon film 1505b than the boron-doped amorphous silicon films 1505a and 1505c is performed to make the amorphous silicon film 1505b recessed in comparison with the boron-doped amorphous silicon films 1505a and 1505c when viewed from the hole 1601.

Figure 18:
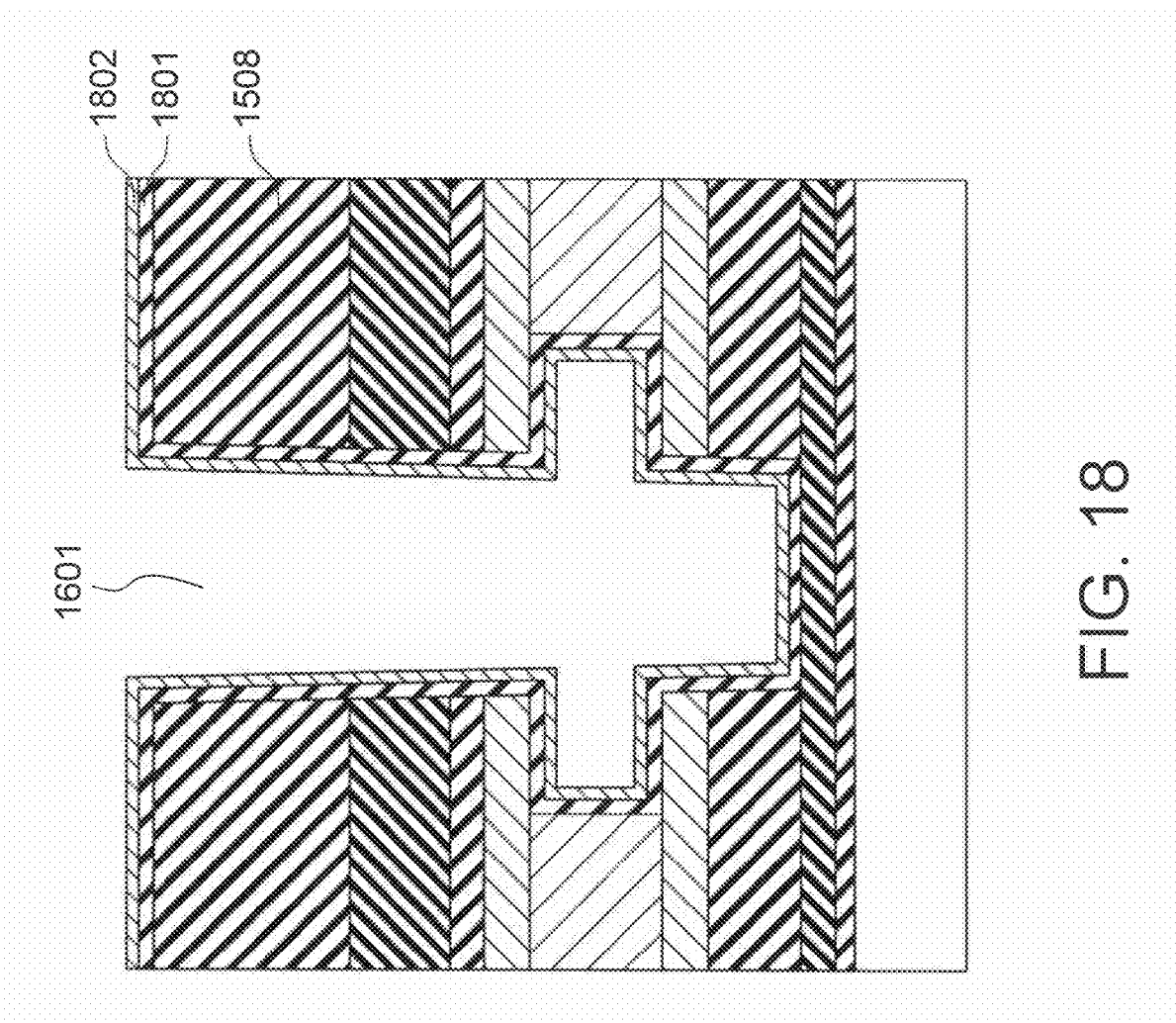
FIG. 18 is a sectional view showing a step subsequent to FIG. 17.

As shown in FIG. 18, a silicon oxide film 1801 having a thickness of 10 nm and an amorphous silicon film 1802 having a thickness of 15 nm are formed using CVD on the inner wall of the hole 1601 and the silicon oxide film 1508.

Figure 19:
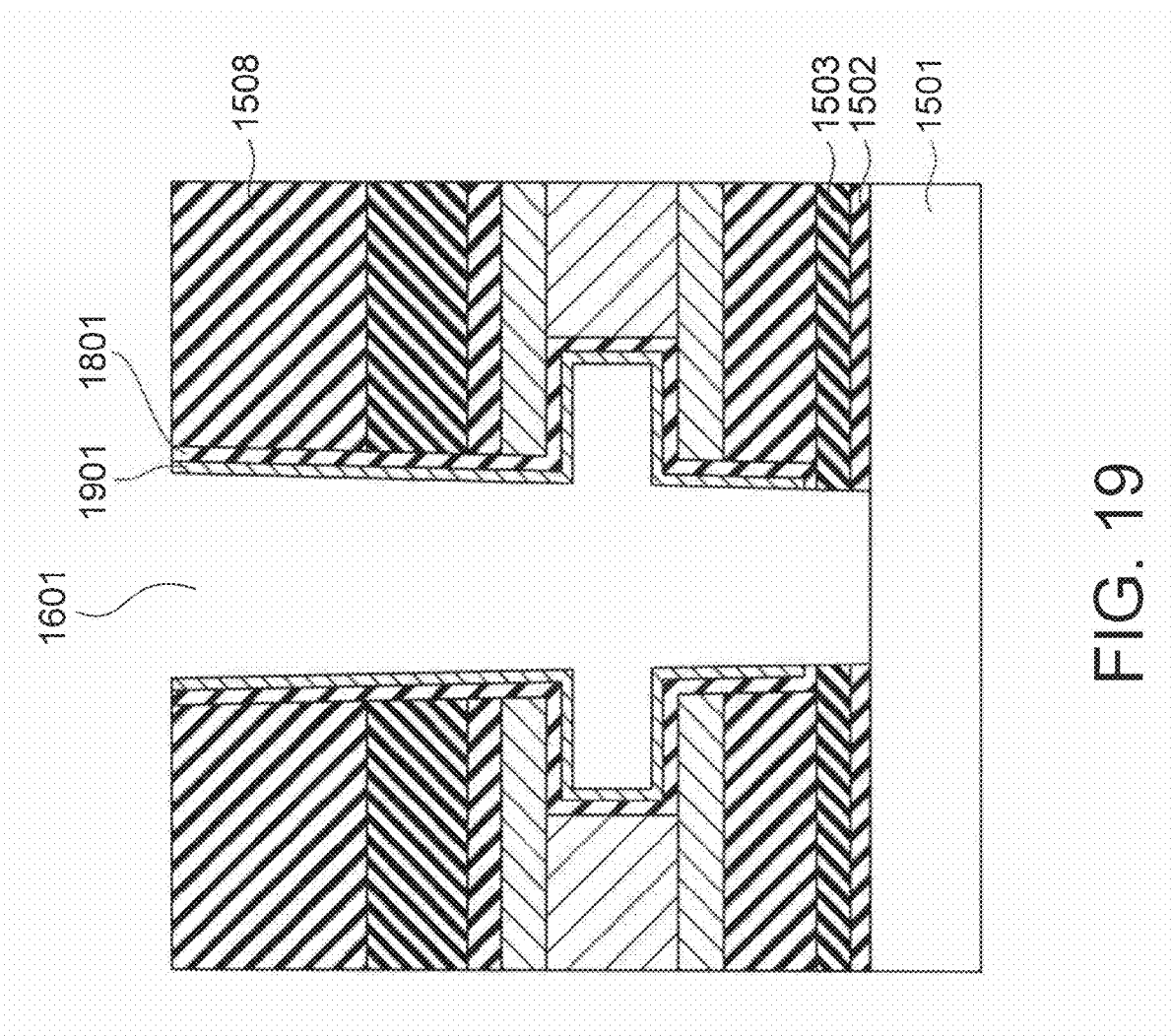
FIG. 19 is a sectional view showing a step subsequent to FIG. 18.

As shown in FIG. 19, the amorphous silicon film 1802 at the bottom of the hole 1601 and on the silicon oxide film 1508 is removed using RIE to form a spacer 1901 on the sidewall of the hole 1601, and using the spacer 1901 as a protective material for the silicon oxide film 1801 on the sidewall of the hole 1601, the silicon oxide film 1801, the silicon nitride film 1503, and the silicon oxide film 1502 present on places other than the sidewall of the hole 1601 are removed using RIE to expose the upper surface of the substrate 1501.

Figure 20:
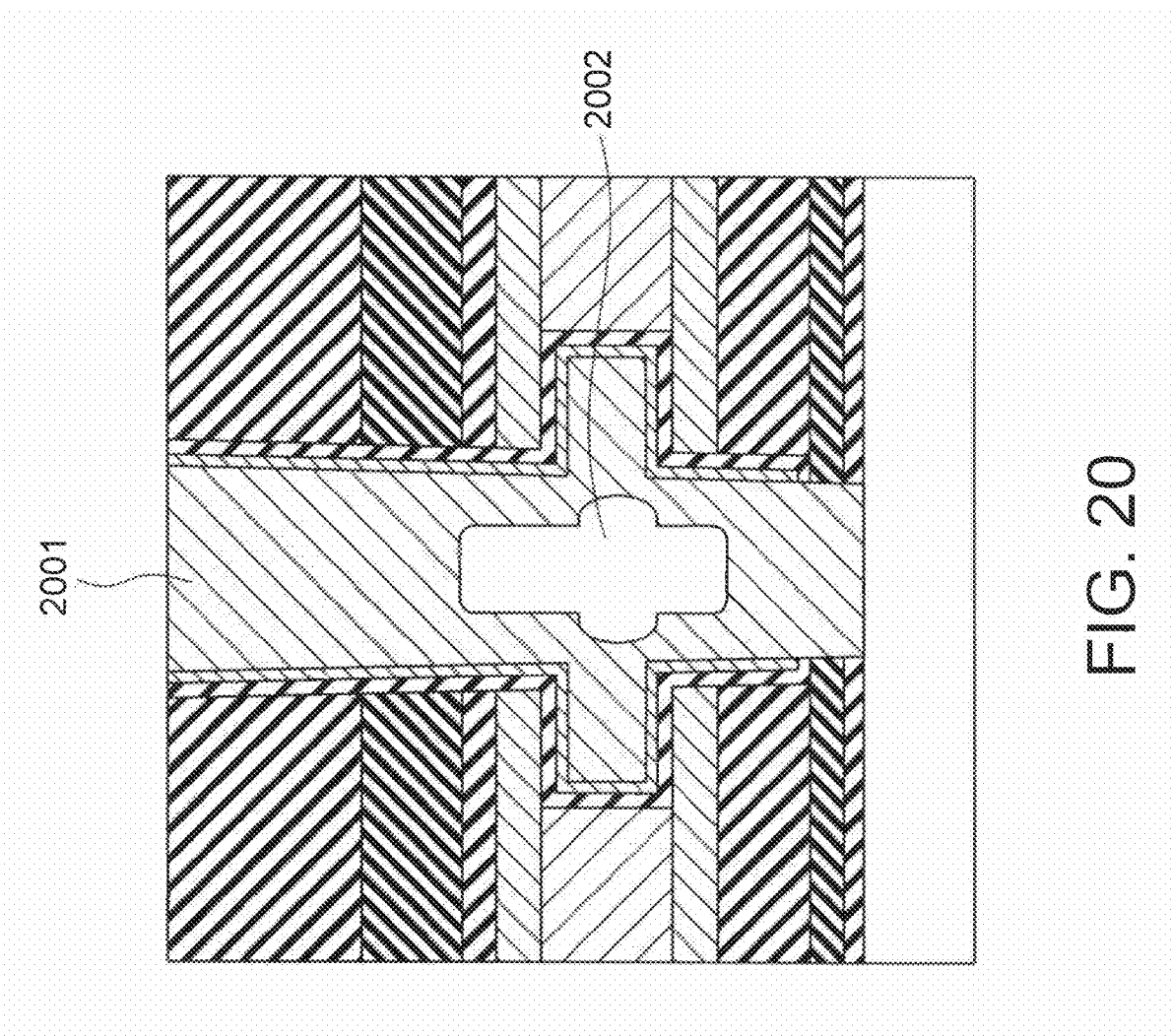
FIG. 20 is a sectional view showing a step subsequent to FIG. 19.

As shown in FIG. 20, an amorphous silicon film 2001 is deposited in the hole 1601 using CVD so as to form a void (hollow space) 2002, and planarized. During CVD, the pressure or the temperature of the gas is raised to facilitate the formation of the void.

Figure 21:
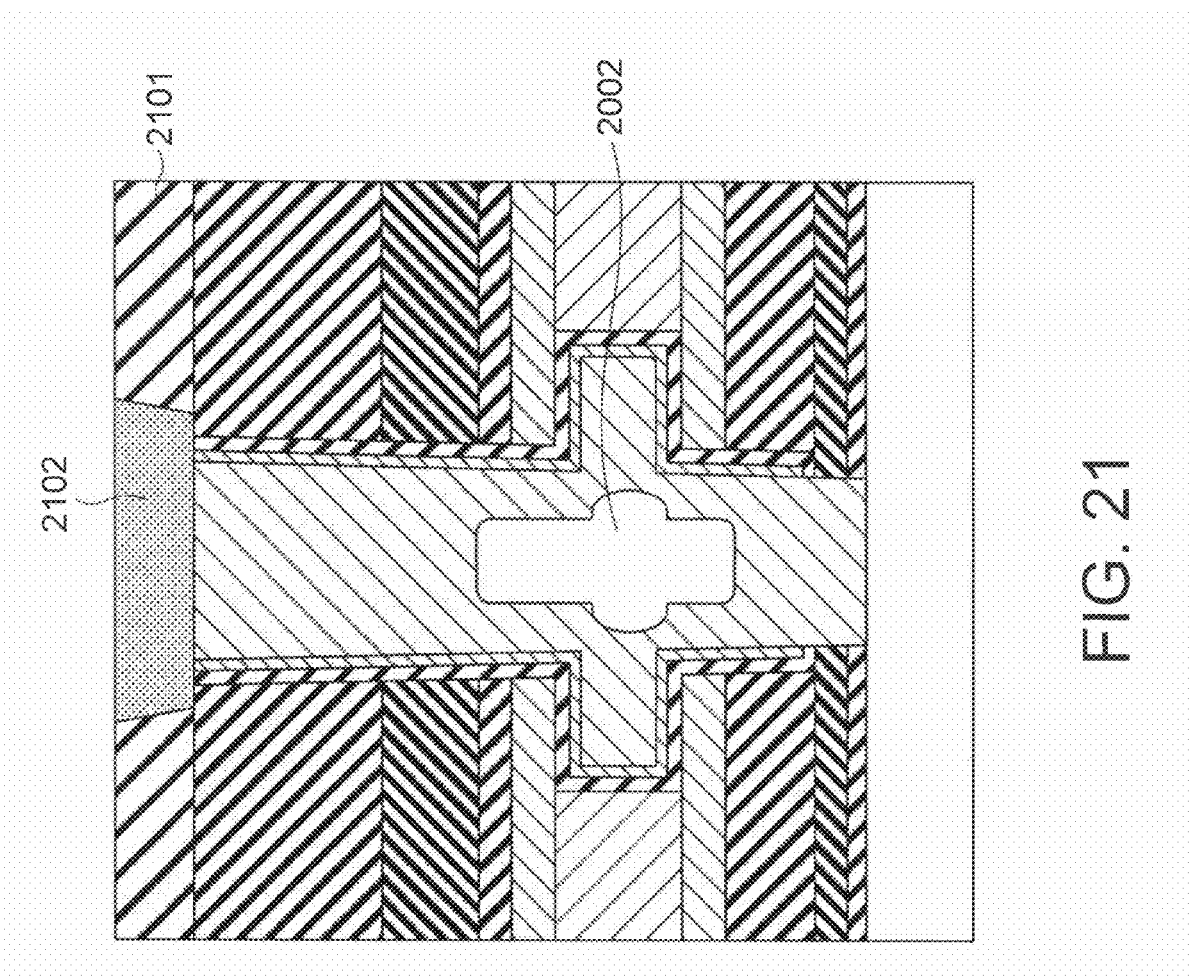
FIG. 21 is a sectional view showing a step subsequent to FIG. 20.

As shown in FIG. 21, a silicon oxide film 2101 is deposited on the amorphous silicon film 2001 and the silicon oxide film 1508, and a wiring (drain) 2102 is formed on the amorphous silicon film 2001.

Thereby, a semiconductor device having a void in the body can be obtained. Since the body under the gate electrode (in lateral direction in the drawing) is thinned, and the expansion of the deplete layer is restricted, DIBL can be suppressed, and cutoff characteristics can be improved. Also since the center portion of the gate electrode is recessed viewed from the body, the void can be easily formed in the body, and the cutoff characteristics can be improved more efficiently. Furthermore, the channel can be elongated.

Figure 22:
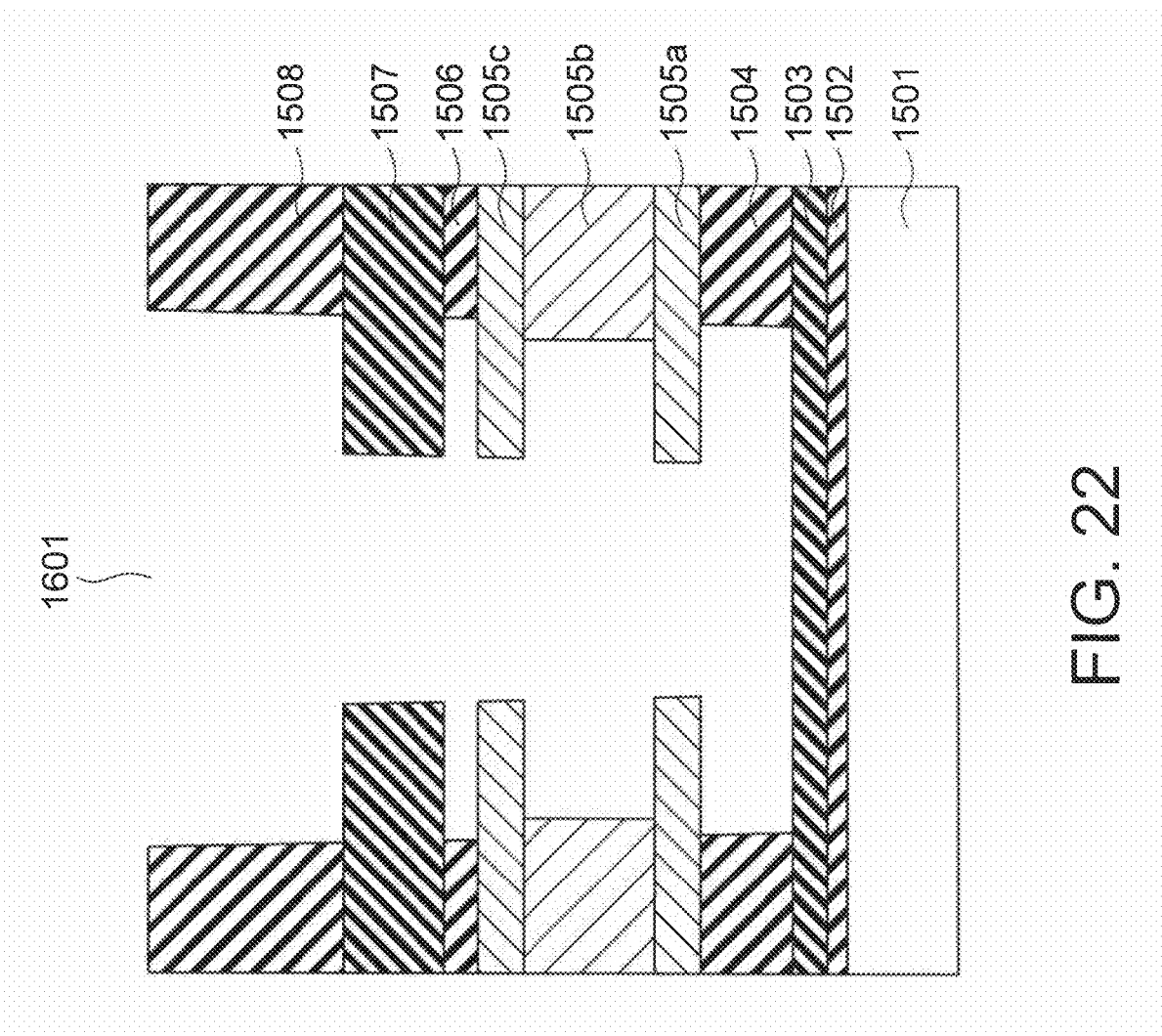
FIG. 22 is a sectional view illustrating one step of a method for manufacturing a semiconductor device according to a modified embodiment.

After performing isometric dry etching that has a high selectivity for the amorphous silicon film 1505b shown in FIG. 17, isometric dry etching that has a high selectivity for the silicon oxide films 1504 and 1506 in comparison to the silicon nitride films 1503 and 1507 may be performed as shown in FIG. 22, and then a silicon oxide film to become a gate insulating film and a body may be formed. Thereby, channels are formed on the sides of the gate (on and under the gate in the drawing); therefore, the channel can be more elongated, and cutoff characteristics can be further improved. When the silicon oxide films at the bottom of the hole 1601 are removed, the silicon nitride film 1507 functions as a protective material, and the removal of the silicon oxide film (which later becomes a gate insulating film) on the upper surfaces of the amorphous silicon films 1505a and 1505c can be prevented.

Fourth Embodiment

Figure 23:
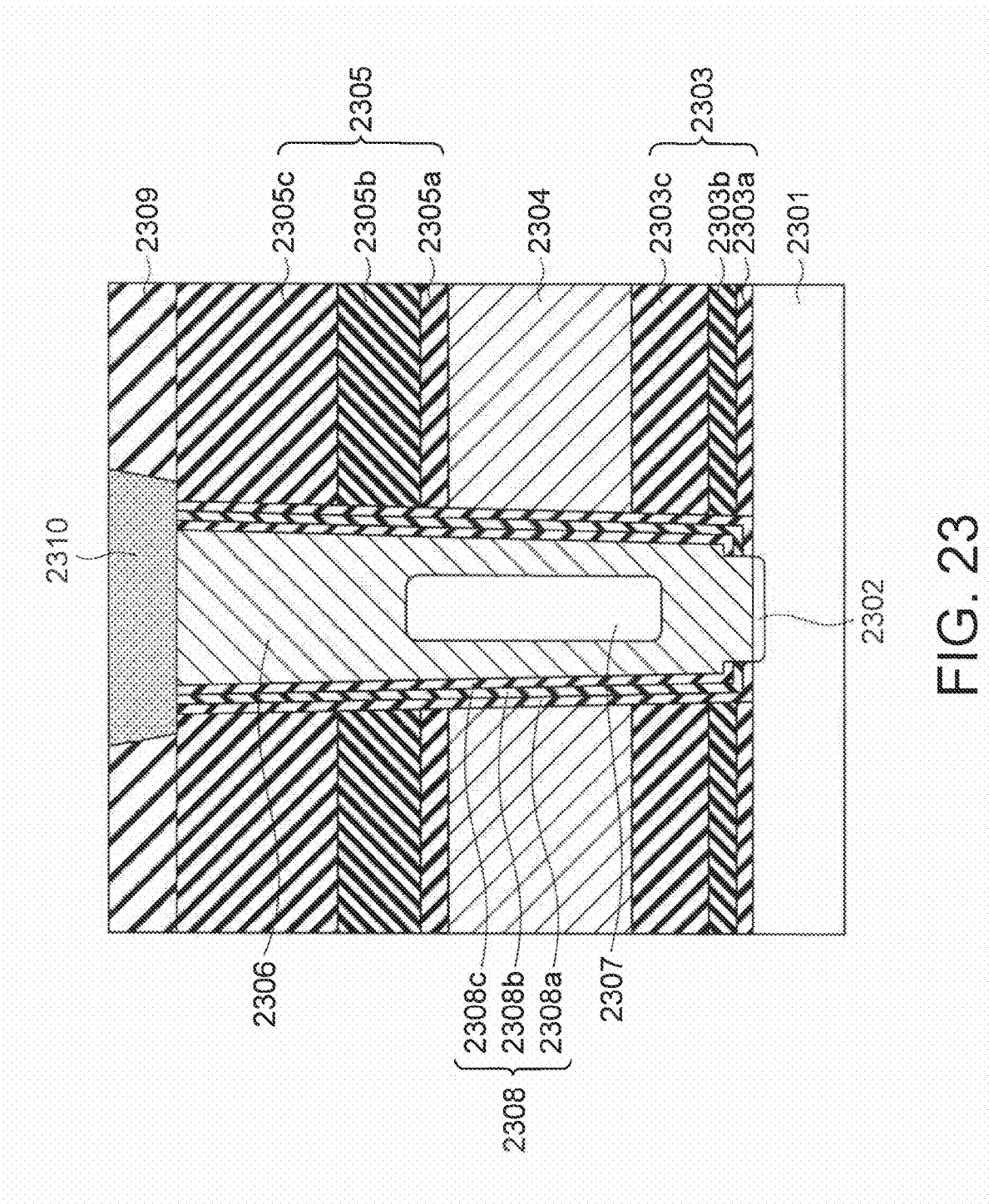
FIG. 23 is a diagram showing the schematic configuration of a semiconductor device according to the fourth embodiment of the present invention.

FIG. 23 shows the schematic configuration of a semiconductor device according to the fourth embodiment of the present invention. The semiconductor device is composed of a semiconductor substrate 2301, a source region 2302 formed on the surface portion of the semiconductor substrate 2301, an insulating layer 2303 formed on the semiconductor substrate 2301, a gate electrode 2304 formed on the insulating layer 2303, an insulating layer 2305 formed on the gate electrode 2304, and a void 2307. The semiconductor device is also equipped with a body 2306 formed so as to penetrate the insulating layer 2303, the gate electrode 2304 and the insulating layer 2305 in a vertical direction to connect with the source region 2302; a gate insulating film 2308 surrounding the side of the body 2307 and formed between the body 2306 and the gate electrode 2304; an insulating film 2309; and a drain region 2310.

The insulating layer 2303 has a laminated structure formed of a silicon oxide film 2303a, a silicon nitride film 2303b, and a silicon oxide film 2303c. The insulating layer 2305 has a laminated structure formed of a silicon oxide film 2305a, a silicon nitride film 2305b, and a silicon oxide film 2305c. The body 2306 is an amorphous silicon, and the insulating film 2309 is a silicon oxide film.

The gate insulating film 2308 is an ONO film having a laminated structure of a silicon oxide film 2308a, a silicon nitride film 2308b as a charge accumulating layer, and a silicon oxide film 2308c. The semiconductor device functions as a MONOS-type memory element.

In the semiconductor device, since the void 2307 is present in the body 2306, the body 2306 below the gate electrode 2304 (lateral direction in the drawing) is thinned. Thereby, when the drain voltage is elevated, the expansion of the deplete layer is restricted and DIBL can be suppressed, cutoff characteristics can be improved, and a memory element having favorable operating characteristics can be fabricated.

Next, a method for fabricating a semiconductor device according to the present embodiment will be described. Since the process is identical to the process up to the formation of the hole 301 in the method for fabricating a semiconductor device according to the above-described first embodiment (FIG. 3), the description thereof will be omitted.

Figure 24:
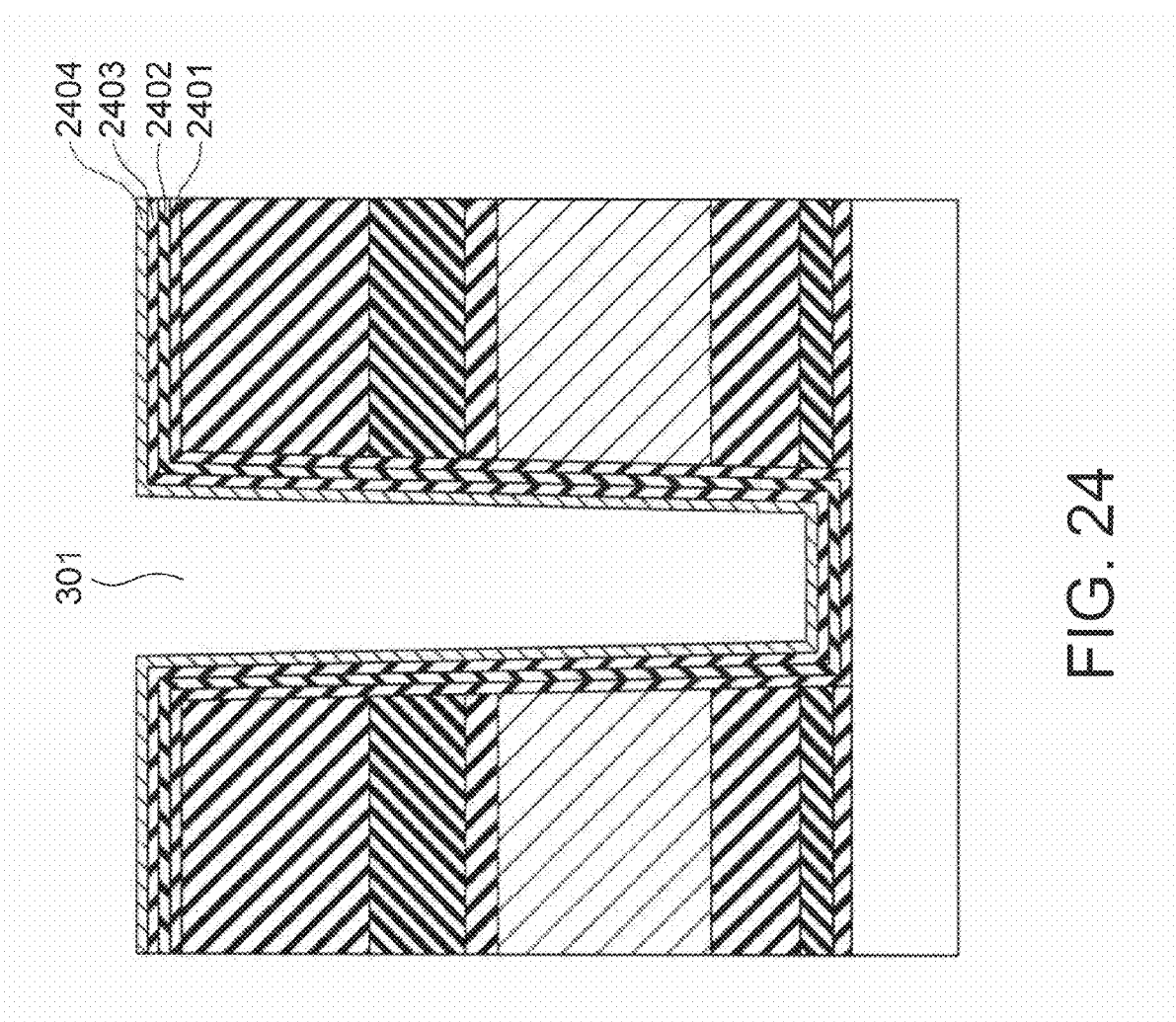
FIG. 24 is a sectional view illustrating one step of a method for manufacturing a semiconductor device according to the fourth embodiment.

As shown in FIG. 24, a silicon oxide film 2401 having a thickness of 5 nm, a silicon nitride film 2402 having a thickness of 7 nm, s silicon oxide film 2403 having a thickness of 3 nm, and an amorphous silicon film 2404 having a thickness of 10 nm are sequentially deposited using CVD. Here, in place of the amorphous silicon film 2404, a TEOS (tetra-ethoxysilane) may also be deposited.

Figure 25:
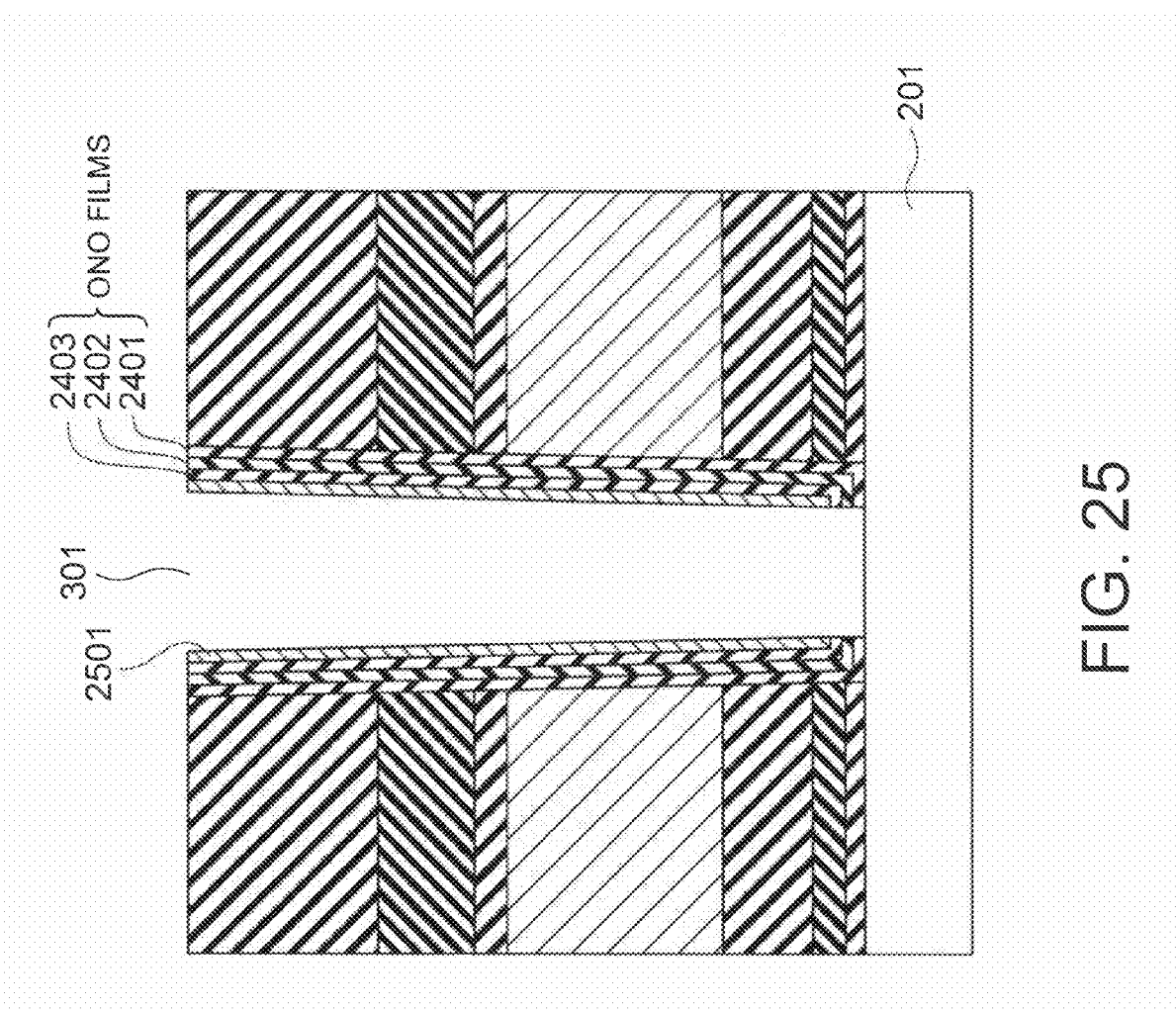
FIG. 25 is a sectional view showing a step subsequent to FIG. 24.

As shown in FIG. 25, the amorphous silicon film 2404 at the places other than the sidewall of the hole 301 is removed using lithography and RIE to form a spacer 2501 on the sidewall of the hole 301, and using the spacer 2501 as a protective material, the ONO film (the silicon oxide film 2401, the silicon nitride film 2402, and the silicon oxide film 2403) present on places other than the sidewall of the hole 301 are removed to expose the upper surface of the substrate 201.

Figure 26:
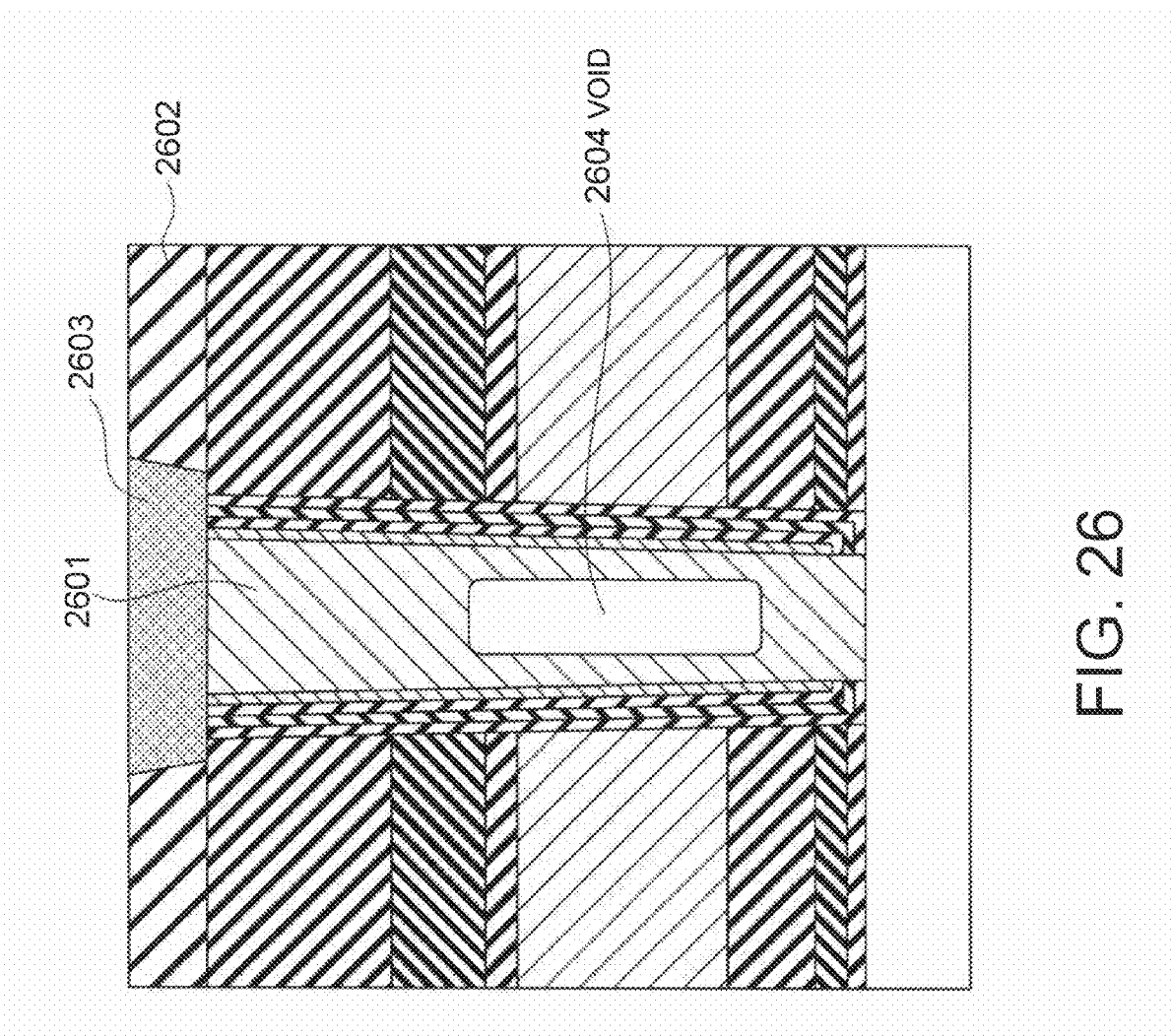
FIG. 26 is a sectional view showing a step subsequent to FIG. 25.

As shown in FIG. 26, an amorphous silicon film 2601 is deposited using CVD so as to contain a void 2604, and planarized. Then, a silicon oxide film 2602 is deposited, and a wiring (drain) 2603 is formed on the amorphous silicon film 2601. During CVD, the pressure or the temperature of the gas is raised to facilitate the formation of the void.

Thereby, a MONOS-type memory element including a body that contains a void can be obtained. Since the body below the gate is thinned and the expansion of the deplete layer is restricted, DIBL can be suppressed, cutoff characteristics can be improved, and a memory element having favorable operating characteristics can be fabricated.

Fifth Embodiment

Figure 27:
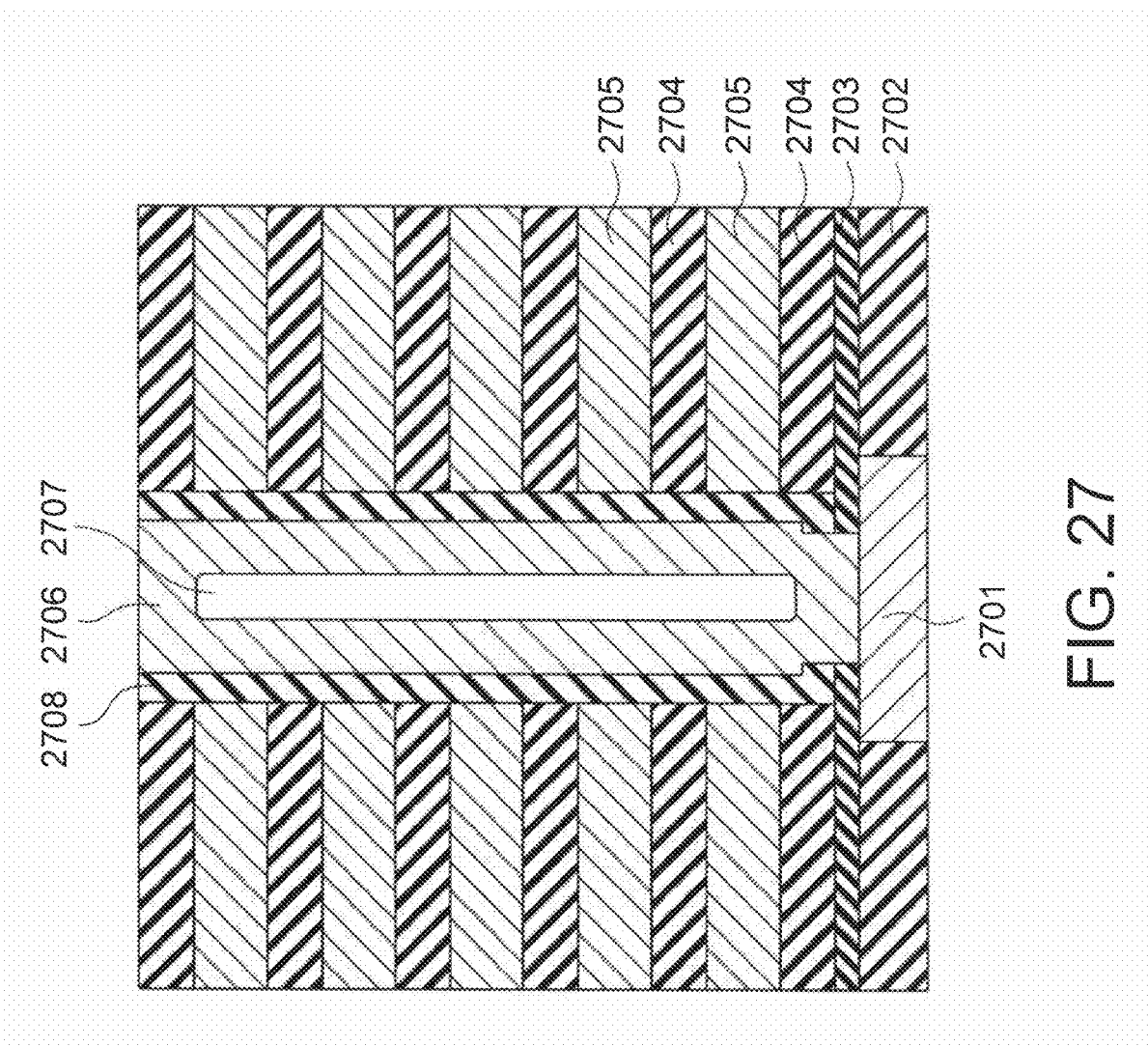
FIG. 27 is a diagram showing the schematic configuration of a semiconductor device according to the fifth embodiment of the present invention.

FIG. 27 shows the schematic configuration of a semiconductor device according to the fifth embodiment of the present invention. The semiconductor device is composed of a source region 2701, a silicon oxide film 2702 surrounding the source region 2701, a silicon nitride film 2703 formed on the source region 2701 and the silicon oxide film 2702, a plurality of silicon oxide films 2704 and gate electrodes 2705 alternately laminated on the silicon nitride film 2703, a body 2706 connected to the upper surface of the source region 2701 and penetrating through the laminated structure formed of the silicon oxide films 2704 and the gate electrodes 2705, and an ONO film 2708 coating the sidewall of the body 2706 and having an electric charge accumulating ability. The body 2706 contains a void 2707. On the body 2706, a drain region (not shown) is formed. The semiconductor device functions as a laminated memory cell array.

Since the void 2707 is contained in the body 2706, and the body 2706 below the gate electrode 2705 (lateral direction in the drawing) is thinned, the expansion of the deplete layer with the elevation of drain voltage is prevented, and DIBL is suppressed. Therefore, the cutoff characteristics of the semiconductor device according to the present embodiment are improved, and a memory cell array having favorable operating characteristics can be obtained.

A method for fabricating the semiconductor device according to the present embodiment will be described.

Figure 28:
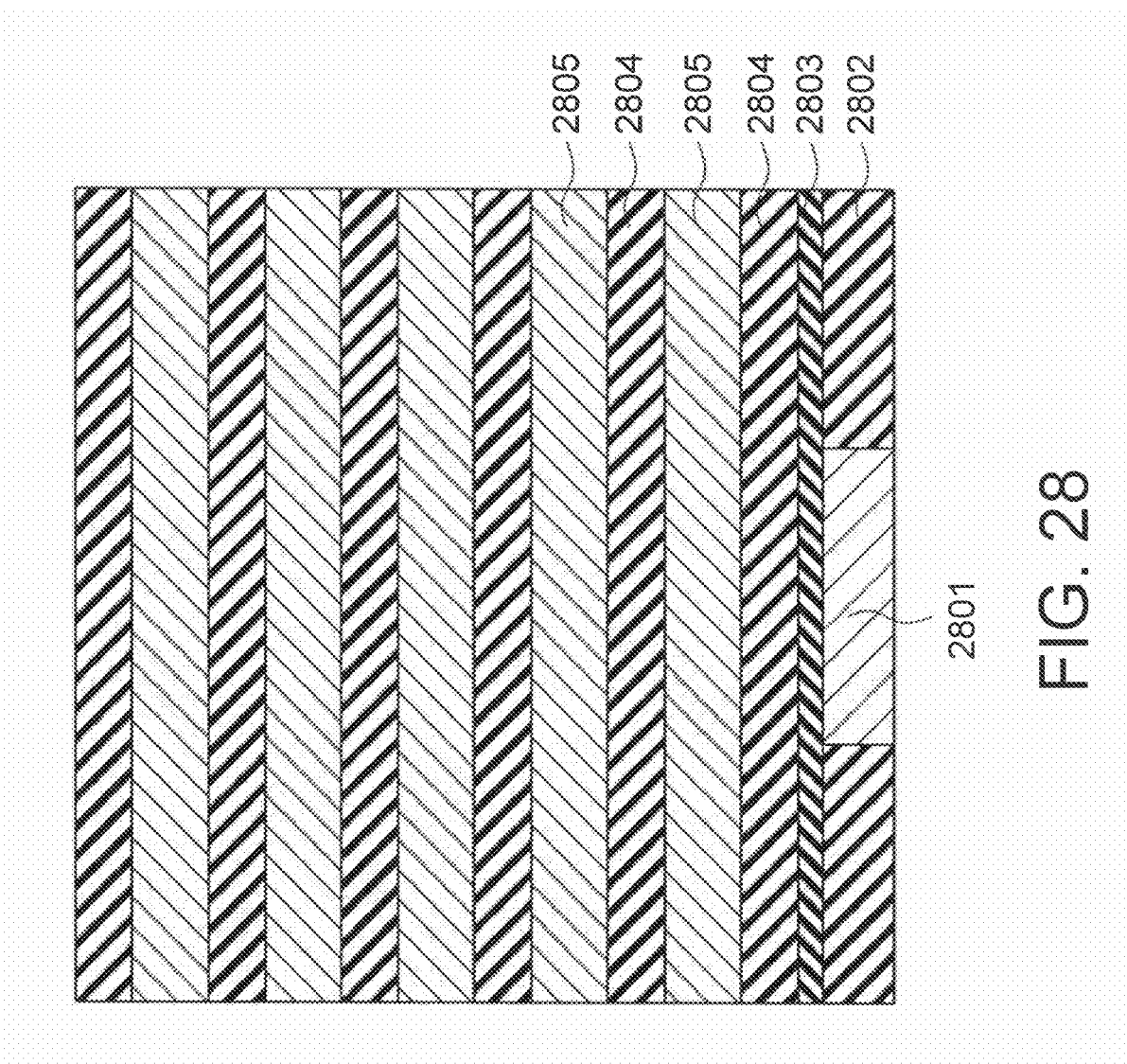
FIG. 28 is a sectional view illustrating one step of a method for manufacturing a semiconductor device according to the fifth embodiment.

As shown in FIG. 28, a silicon nitride film 2803 having a thickness of 20 nm is deposited on an impurity-diffused layer 2801 and a silicon oxide film 2802 surrounding the impurity-diffused layer 2801, and a plurality of silicon oxide films 2804 and amorphous silicon films 2805 are alternately laminated on the silicon nitride film 2803. The impurity-diffused layer 2801 is, for example, a phosphorus-doped amorphous silicon film.

Figure 29:
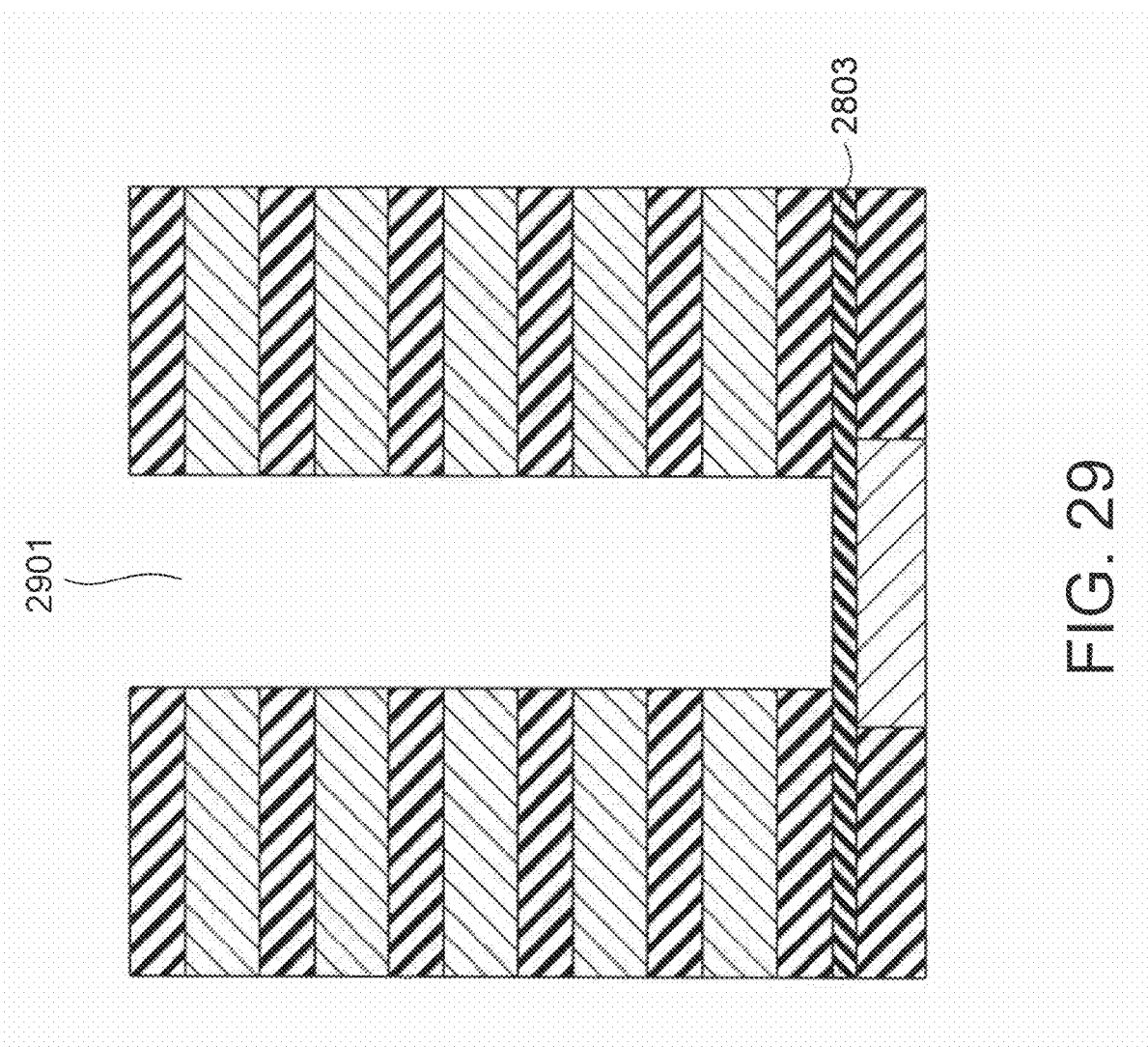
FIG. 29 is a sectional view showing a step subsequent to FIG. 28.

As shown in FIG. 29, a hole 2901 that exposes the upper surface of the silicon nitride film 2803 is formed using lithography and RIE.

Figure 30:
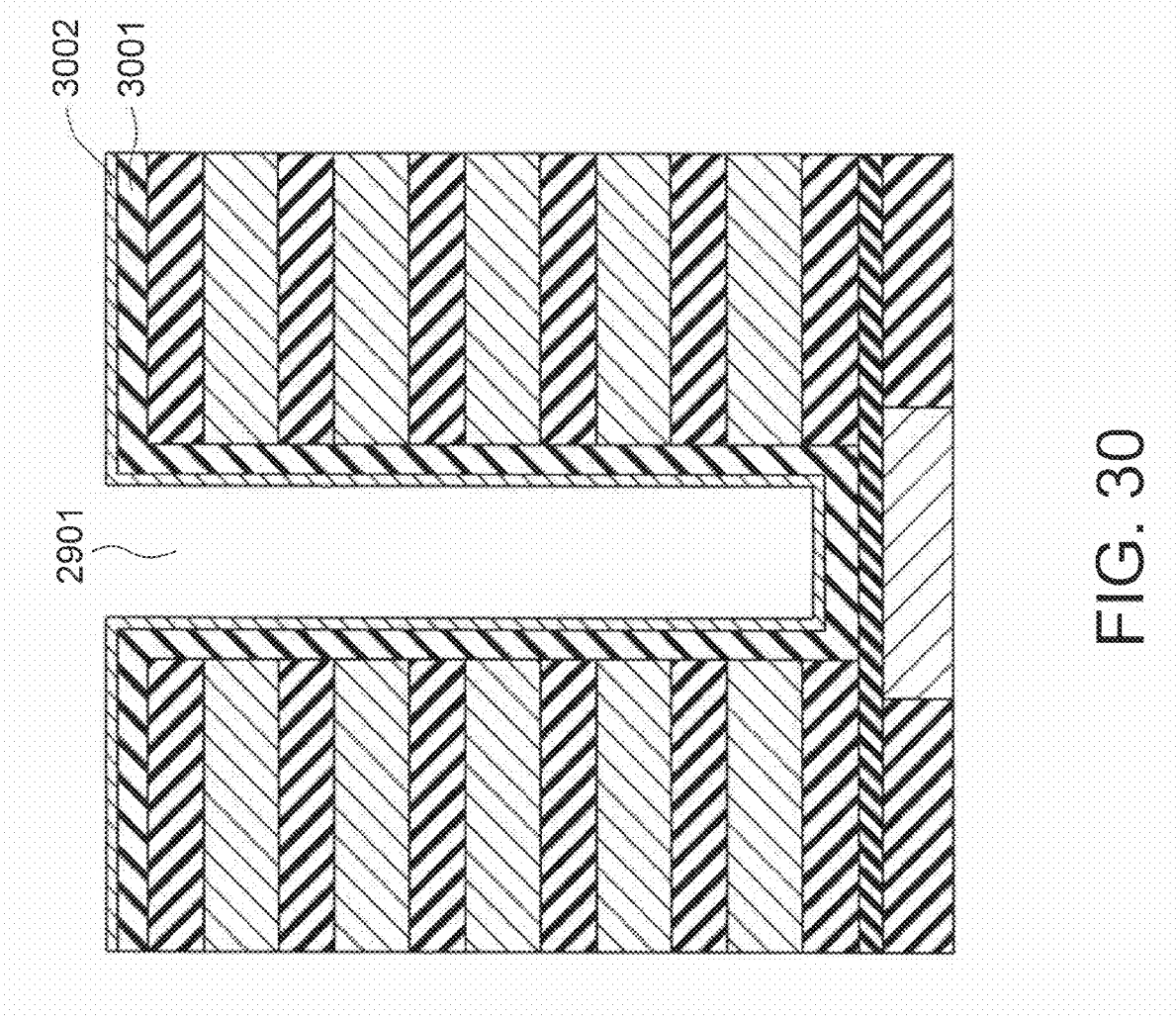
FIG. 30 is a sectional view showing a step subsequent to FIG. 29.

As shown in FIG. 30, an ONO film 3001 and an amorphous silicon film 3002 having a thickness of 10 nm are deposited using CVD so as to coat the inner wall of the hole 2901. The ONO film 3001 includes, for example, a TEOS film having a thickness of 5 nm, a silicon nitride film having a thickness of 7 nm, and a TEOS film having a thickness of 15 nm. Here, the TEOS film may be substituted by a silicon oxide film.

Figure 31:
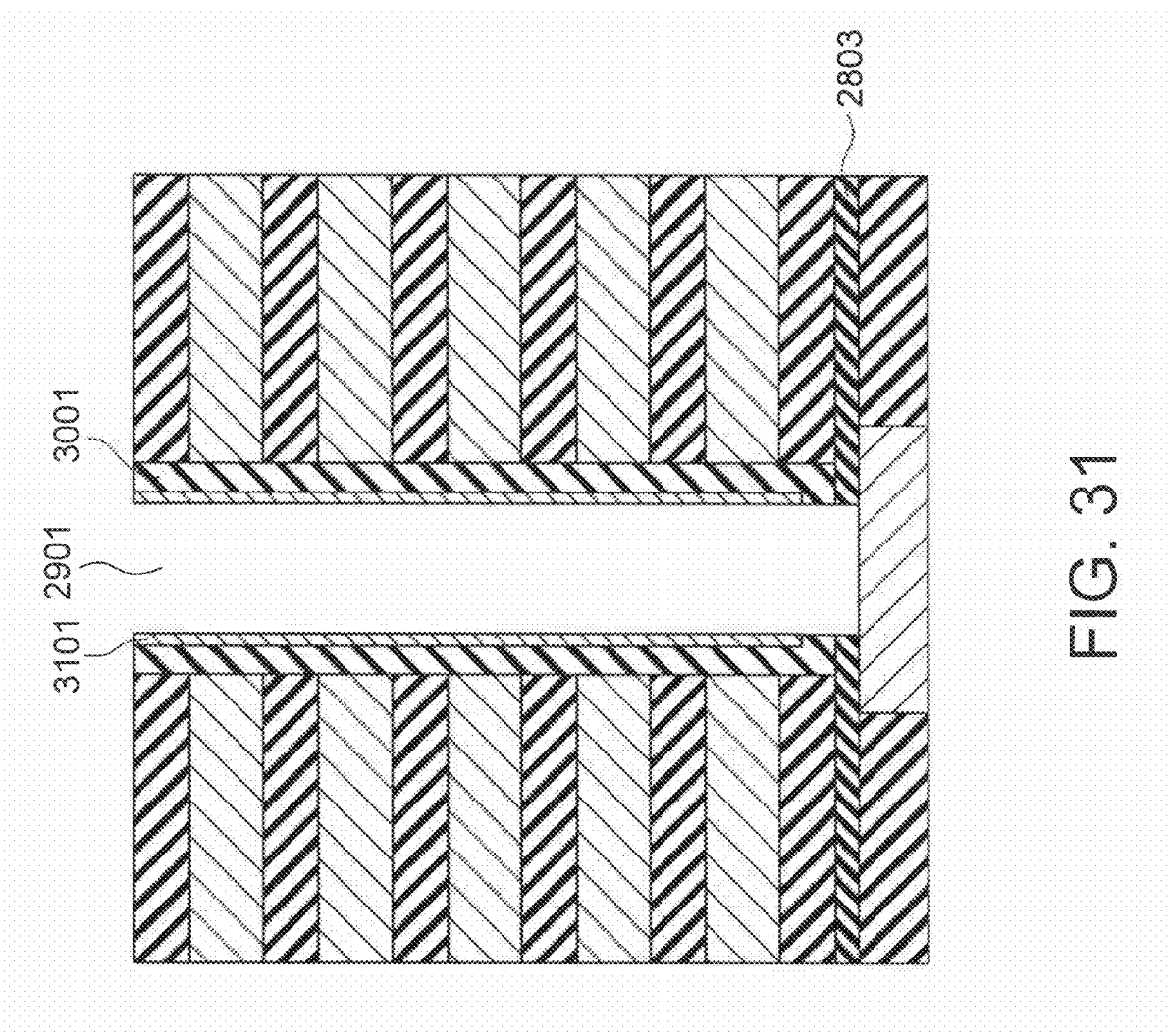
FIG. 31 is a sectional view showing a step subsequent to FIG. 30.

As shown in FIG. 31, the amorphous silicon film 3002 at the places other than the sidewall of the hole 2901 is removed to form a spacer 3101, and using the spacer 3101 as a protective material, the ONO film 3001 present on places other than the sidewall of the hole 2901 and the silicon nitride film 2803 at the bottom of the hole 2901 are removed to expose the upper surface of the impurity-diffused layer 2801.

Figure 32:
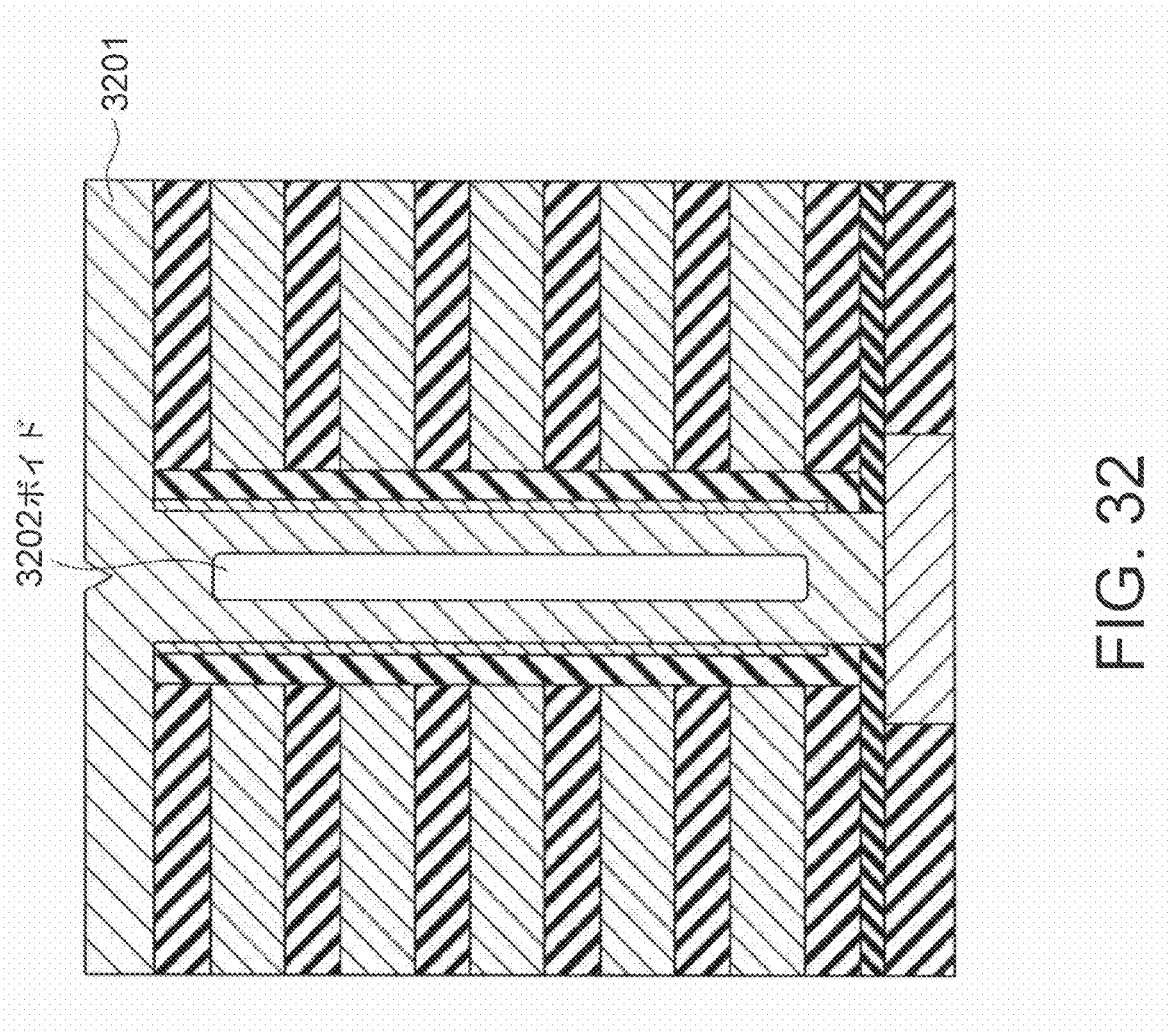
FIG. 32 is a sectional view showing a step subsequent to FIG. 31.

As shown in FIG. 32, an amorphous silicon film 3201 is deposited using CVD so as to bury the hole 2901 and contain a void 3202. During CVD, the pressure or the temperature of the gas is raised to facilitate the formation of the void.

Then, planarization is performed to form a drain region on the amorphous silicon film 3201 that becomes the body.

Thereby, since a void is contained in the body, the body below the gate electrode (lateral direction in the drawing) can be thinned, the expansion of the deplete layer with the elevation of drain voltage can be prevented, DIBL is suppressed, and a memory cell array having favorable operating characteristics can be obtained.

Figure 33:
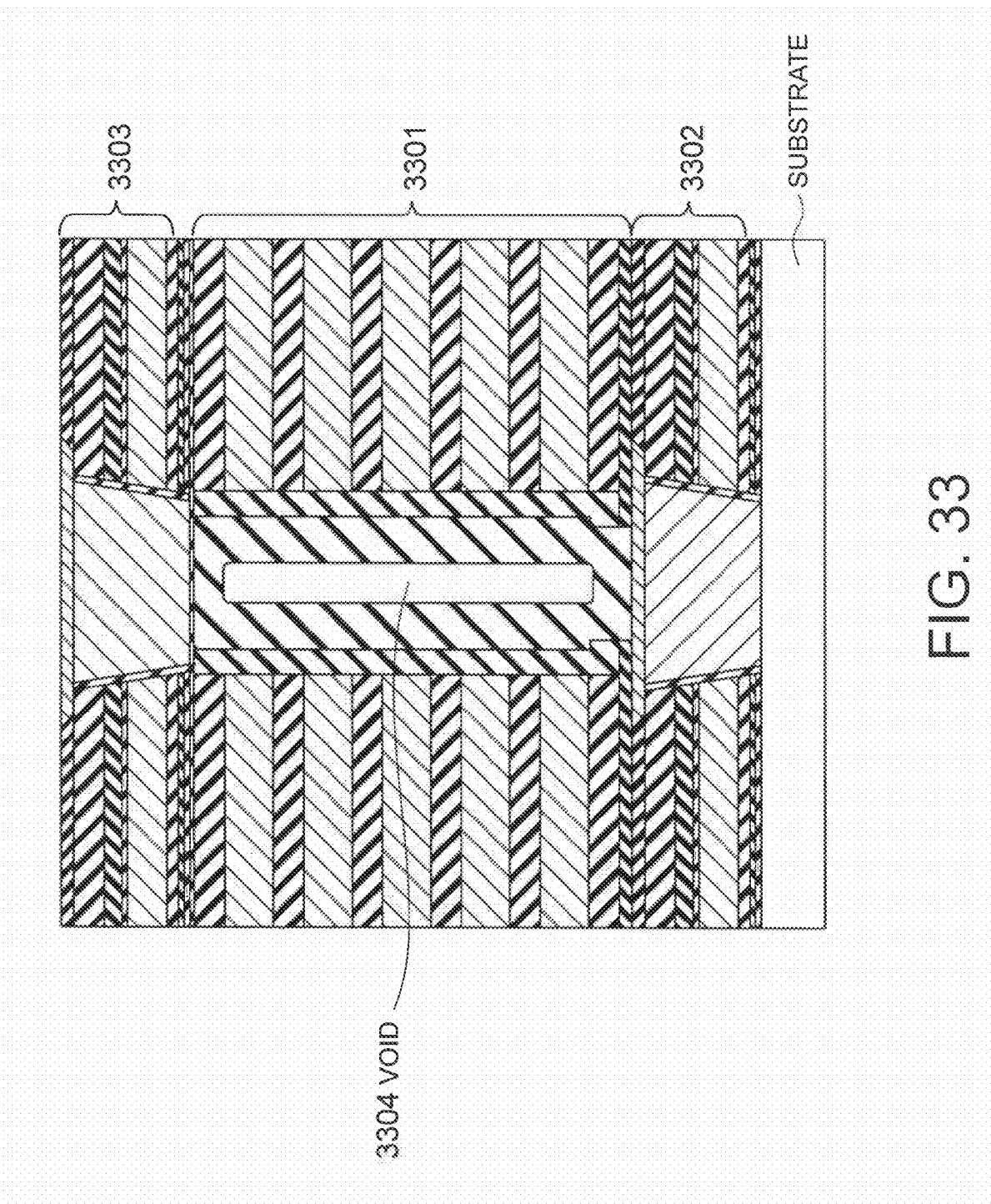
FIG. 33 is a diagram showing a NAND-type flash memory of a laminated structure using a semiconductor device according to the fifth embodiment.

An example of a NAND-type flash memory having a laminated structure that includes the memory cell array according to the present embodiment is shown in FIG. 33. On and under the memory cell array 3301 containing the void 3304 in the body, transistors 3302 and 3303 of a vertical structure that become selecting transistors are provided, respectively. The transistors 3302 and 3303 may also be of the configuration similar to the configuration of the semiconductor devices according to the first to third embodiments. A desired voltage is applied to each gate of the memory cell array by a word-line driver (not shown), and data can be written, deleted, or read.

Sixth Embodiment

Figure 34:
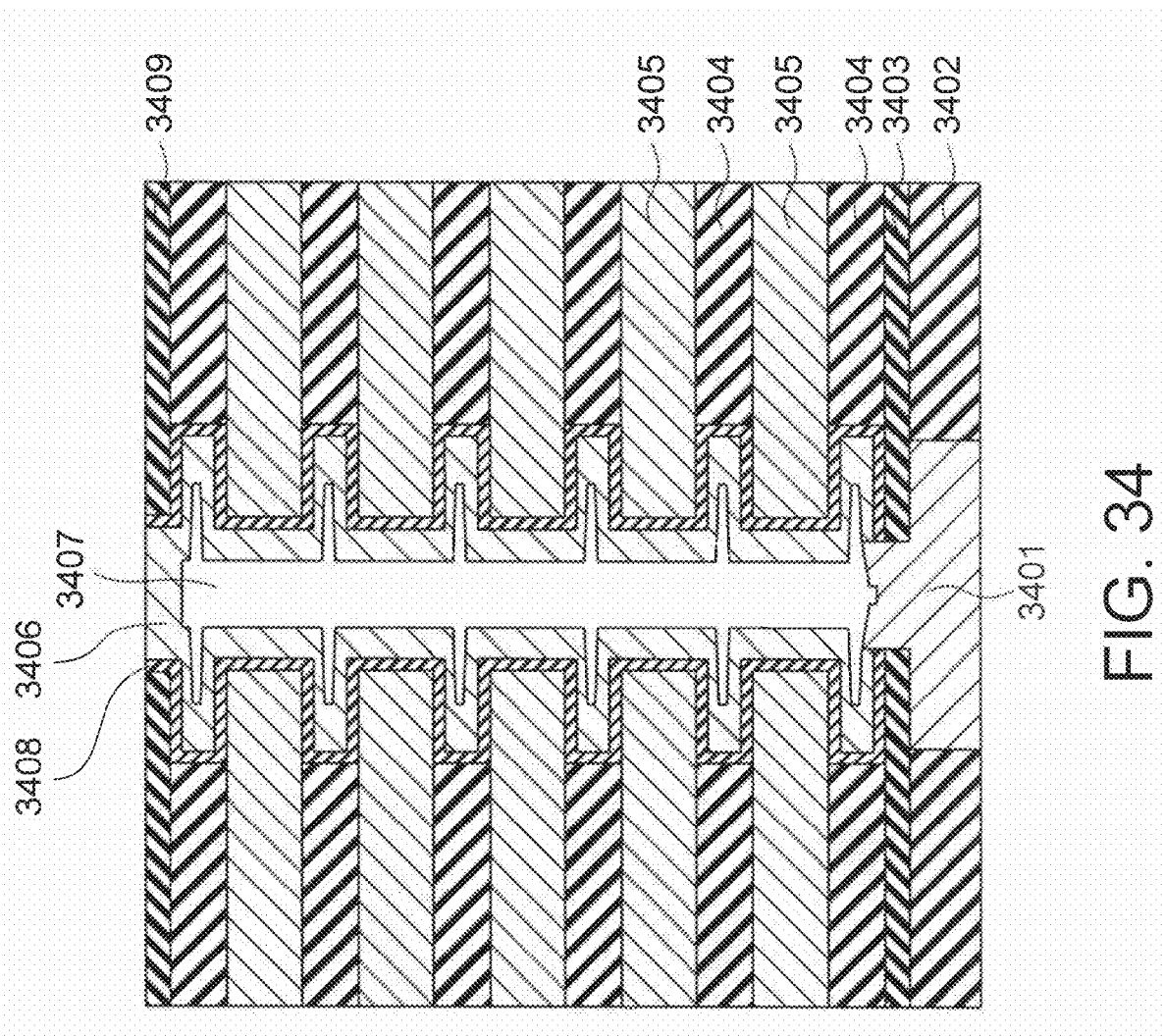
FIG. 34 is a diagram showing the schematic configuration of a semiconductor device according to the sixth embodiment of the present invention.

FIG. 34 shows the schematic configuration of a semiconductor device according to the sixth embodiment of the present invention. The semiconductor device is composed of a source region 3401, a silicon oxide film 3402 surrounding the source region 3401, a silicon nitride film 3403 formed on the source region 3401 and the silicon oxide film 3402, a plurality of silicon oxide films 3404 and gate electrodes 3405 alternately laminated on the silicon nitride film 3403, a silicon nitride film 3409 formed on the laminated structure of the silicon oxide films 3404 and the gate electrodes 3405, a body 3406 connected to the upper surface of the source region 3401 and penetrating through the laminated structure formed of the silicon oxide films 3404 and the gate electrodes 3405 and the silicon nitride film 3409 in a vertical direction, and an ONO film 3408 coating the sidewall of the body 3406 and having an electric charge accumulating ability. The body 3406 contains a void 3407.

The sides of the silicon oxide films 3404 and the gate electrodes 3405 have convexo-concave shapes, and the body 3406 and the ONO film 3408 have the shapes corresponding to the convexo-concave shapes. On the body 3406, a drain region (not shown) is formed. The semiconductor device functions as a laminated memory cell array.

Since the void 3407 is contained in the body 3406, and the body 3406 below the gate electrode 3405 (lateral direction in the drawing) is thinned, the expansion of the deplete layer with the elevation of drain voltage is prevented, and DIBL is suppressed. Therefore, the cutoff characteristics of the semiconductor device according to the present embodiment are improved, and a memory cell array having favorable operating characteristics can be obtained. Also, channel regions are formed on the sides of the gate electrode 3405 (on and under the gate electrode in the drawing); therefore the channel can be elongated, and cutoff characteristics can be further improved.

A method for fabricating the semiconductor device according to the present embodiment will be described.

Figure 35:
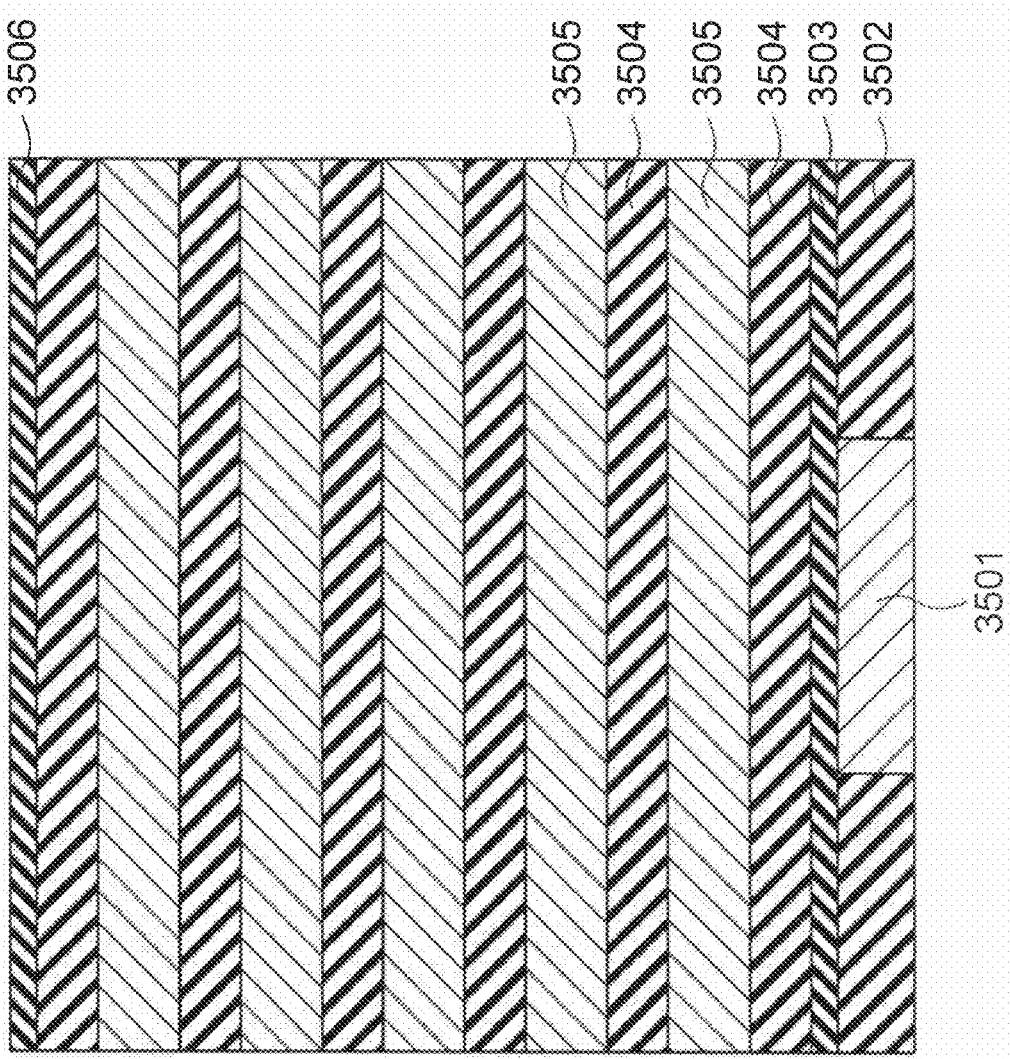
FIG. 35 is a sectional view illustrating one step of a method for manufacturing a semiconductor device according to the sixth embodiment.

As shown in FIG. 35, a silicon nitride film 3503 having a thickness of 20 nm is deposited on a silicon oxide film 3502 surrounding an impurity-diffused layer 3501, and a plurality of silicon oxide films 3504 and amorphous silicon films 3505 are alternately laminated on the silicon nitride film 3503 and a silicon nitride film 3506 is deposited thereon. The impurity-diffused layer 3501 is, for example, a phosphorus-doped amorphous silicon film.

Figure 36:
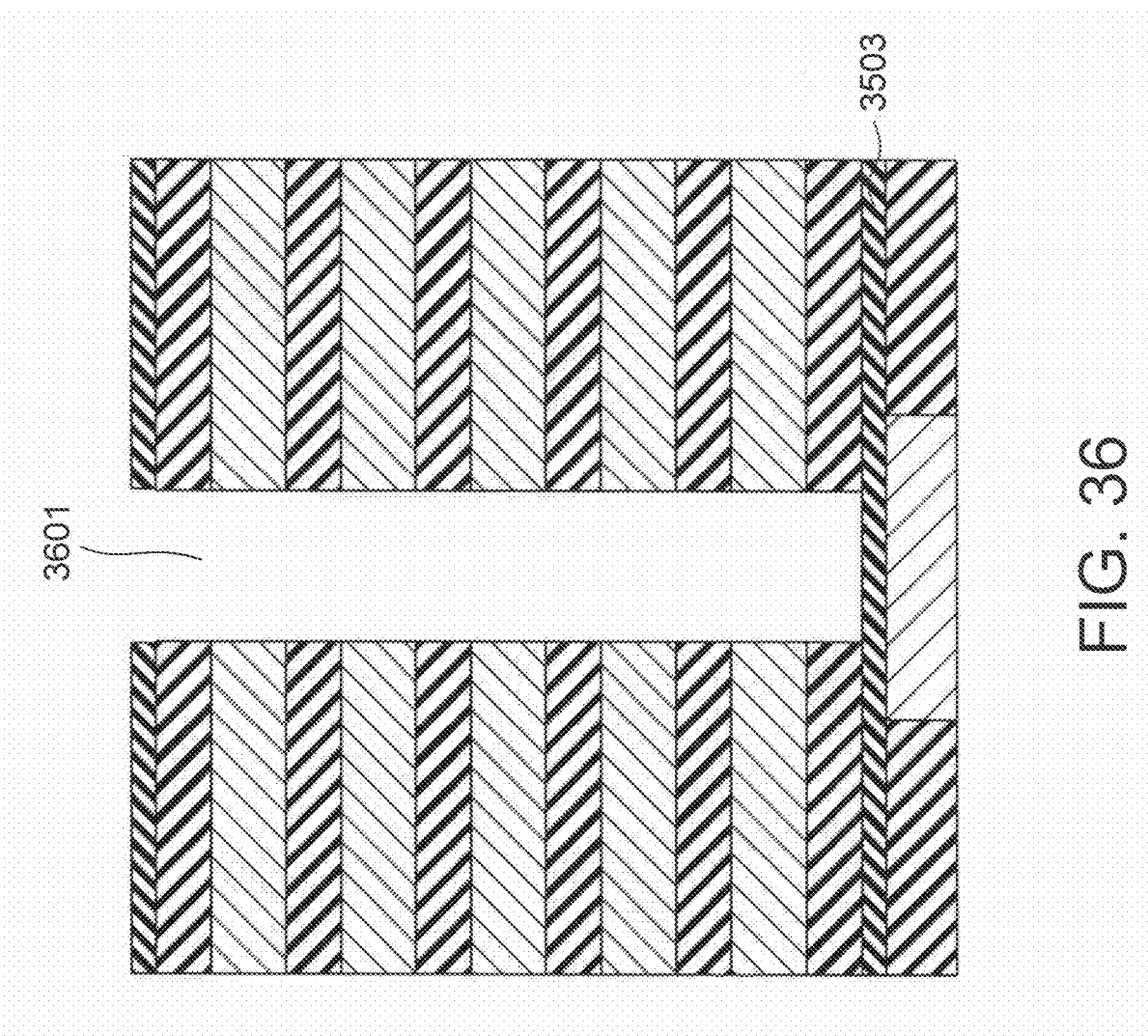
FIG. 36 is a sectional view showing a step subsequent to FIG. 35.

As shown in FIG. 36, a hole 3601 that exposes the upper surface of the silicon nitride film 3503 is formed using lithography and RIE.

Figure 37:
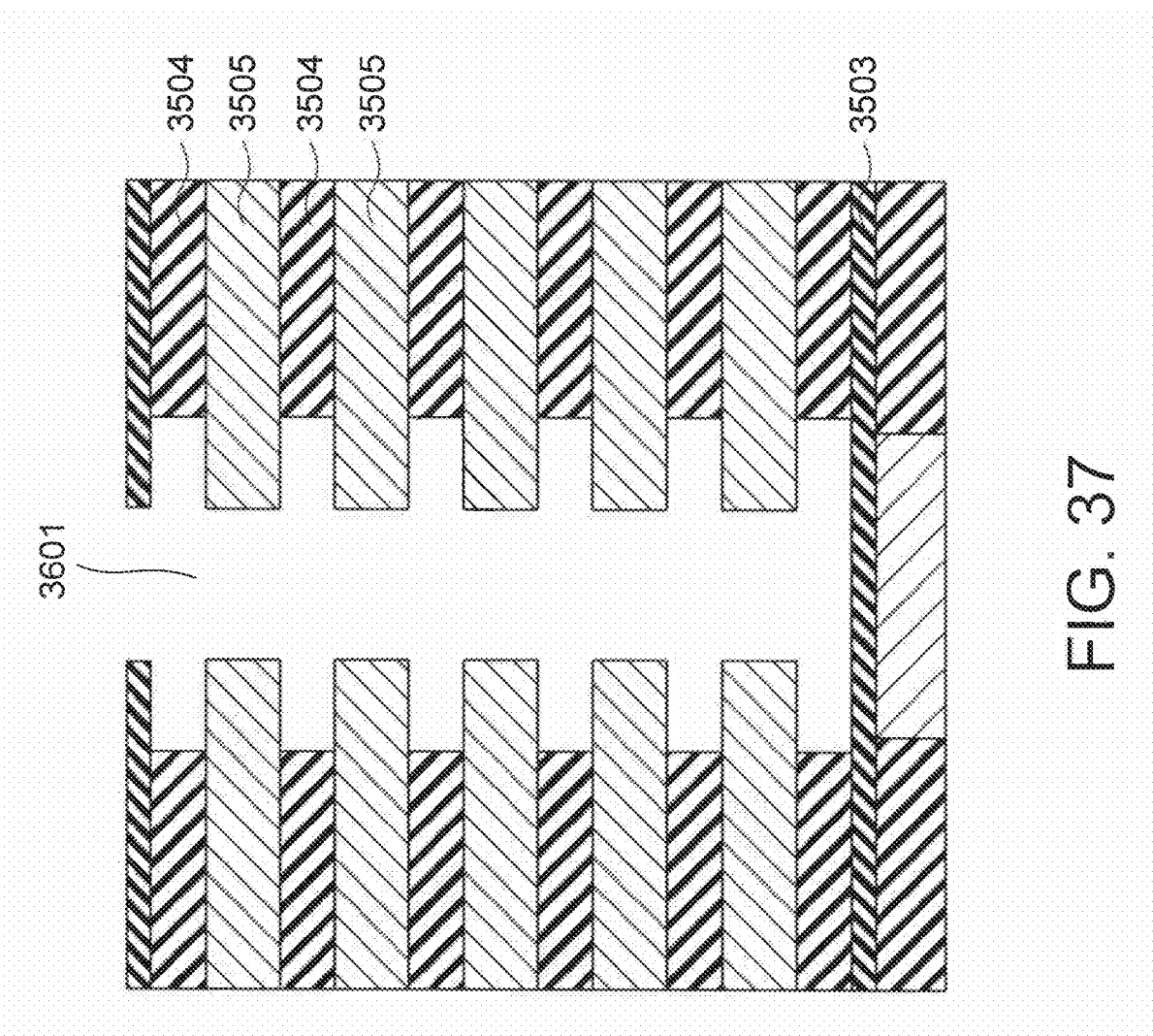
FIG. 37 is a sectional view showing a step subsequent to FIG. 36.

As shown in FIG. 37, dry isotropic etching of a higher selectivity to the silicon oxide film than the amorphous silicon film and the silicon nitride film is performed to make the silicon oxide film 3504 recessed when viewed from the hole 3601.

Figure 38:
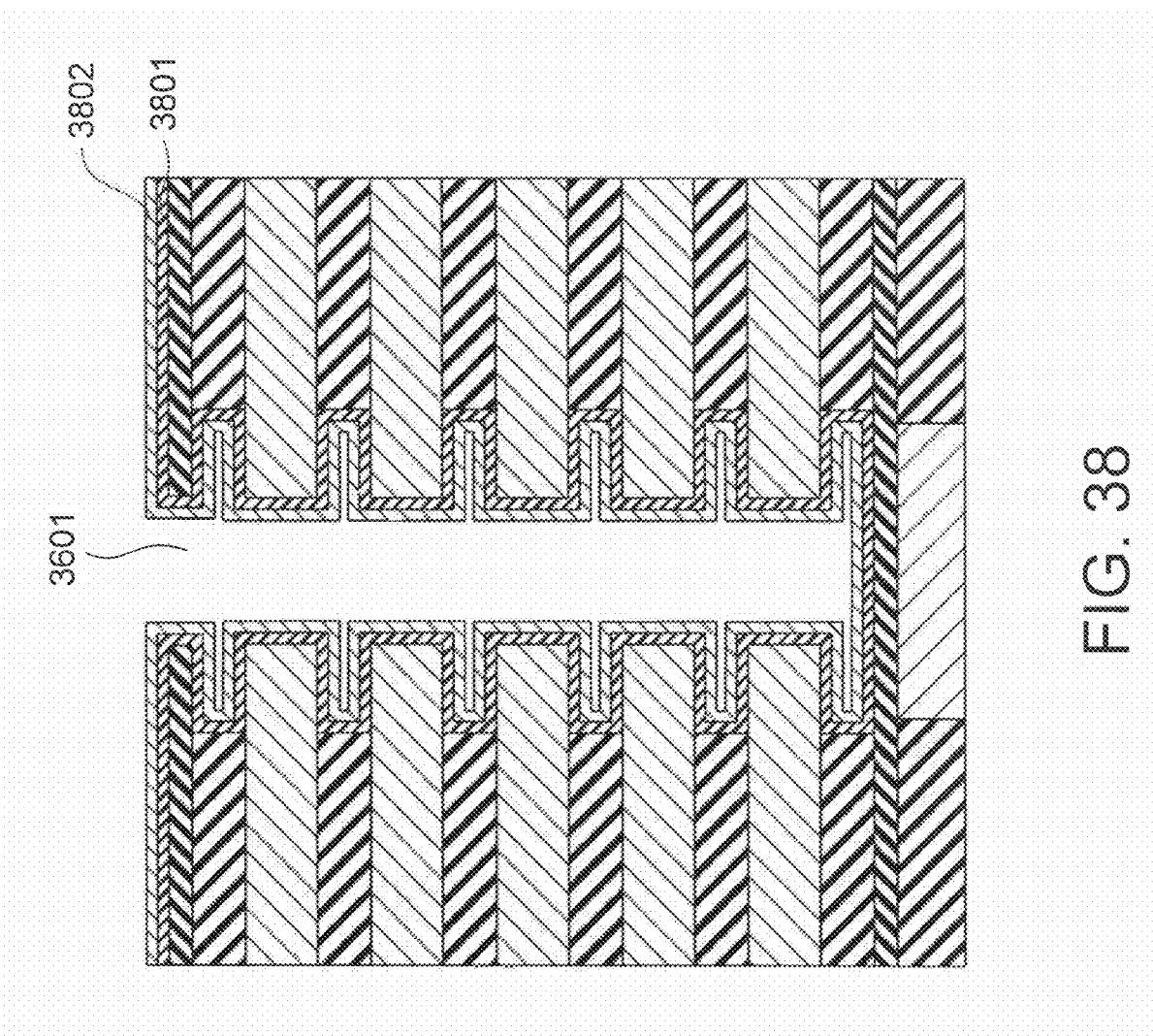
FIG. 38 is a sectional view showing a step subsequent to FIG. 37.

As shown in FIG. 38, an ONO film 3801 and an amorphous silicon film 3802 having a thickness of 10 nm are deposited using CVD on the inner wall of the hole 3601 and the silicon nitride film 3506. The ONO film 3801 includes, for example, a TEOS film having a thickness of 5 nm, a silicon nitride film having a thickness of 7 nm, and a TEOS film having a thickness of 15 nm. Here, the TEOS film may be substituted by a silicon oxide film.

Figure 39:
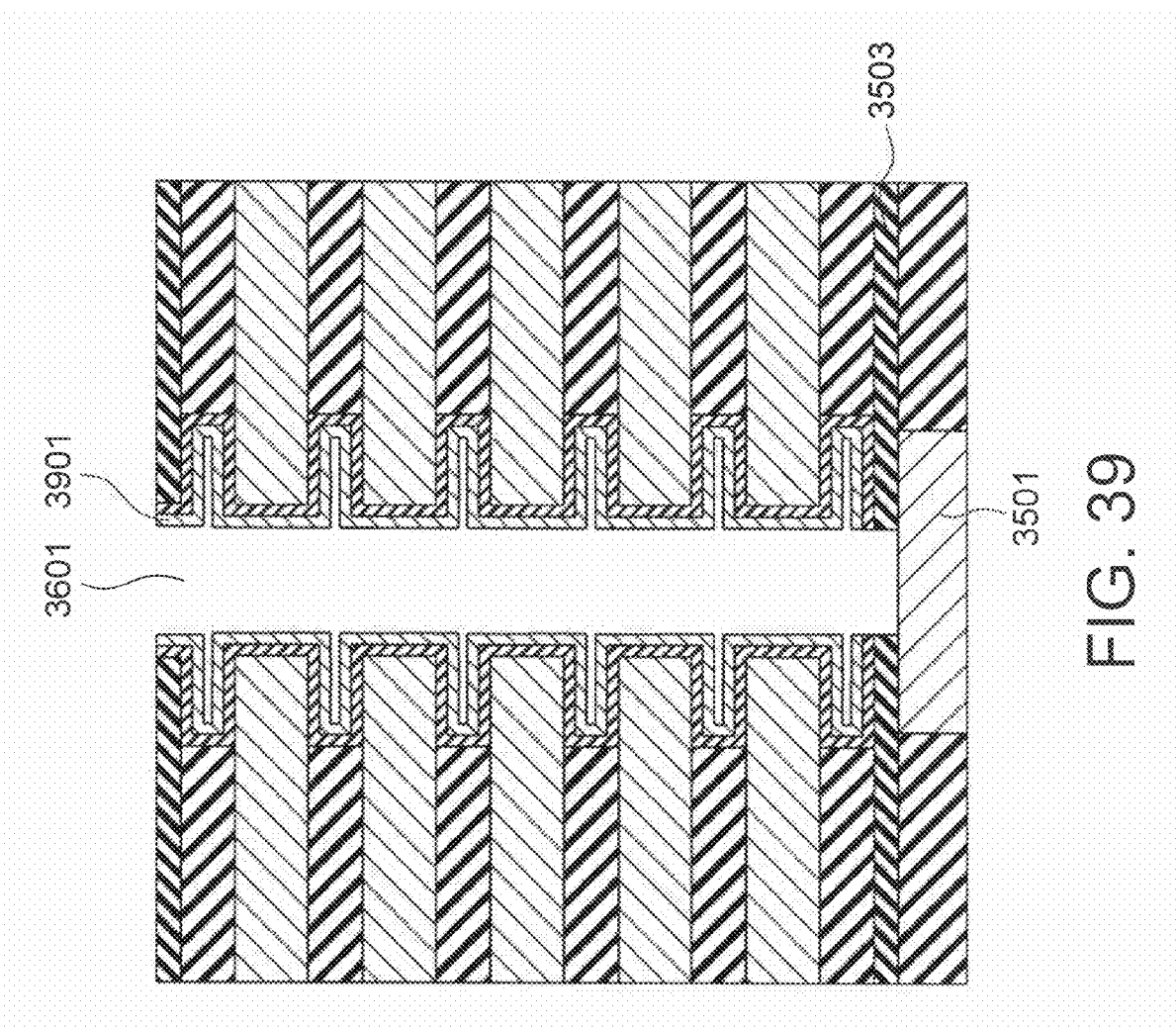
FIG. 39 is a sectional view showing a step subsequent to FIG. 38.

As shown in FIG. 39, the amorphous silicon film 3802 at the places other than the sidewall of the hole 3601 is removed to form a spacer 3901, and using the spacer 3901 as a protective material, the ONO film 3801 present on places other than the sidewall of the hole 3601 and the silicon nitride film 3503 on the bottom of the hole 3601 are removed to expose the upper surface of the impurity-diffused layer 3501.

Figure 40:
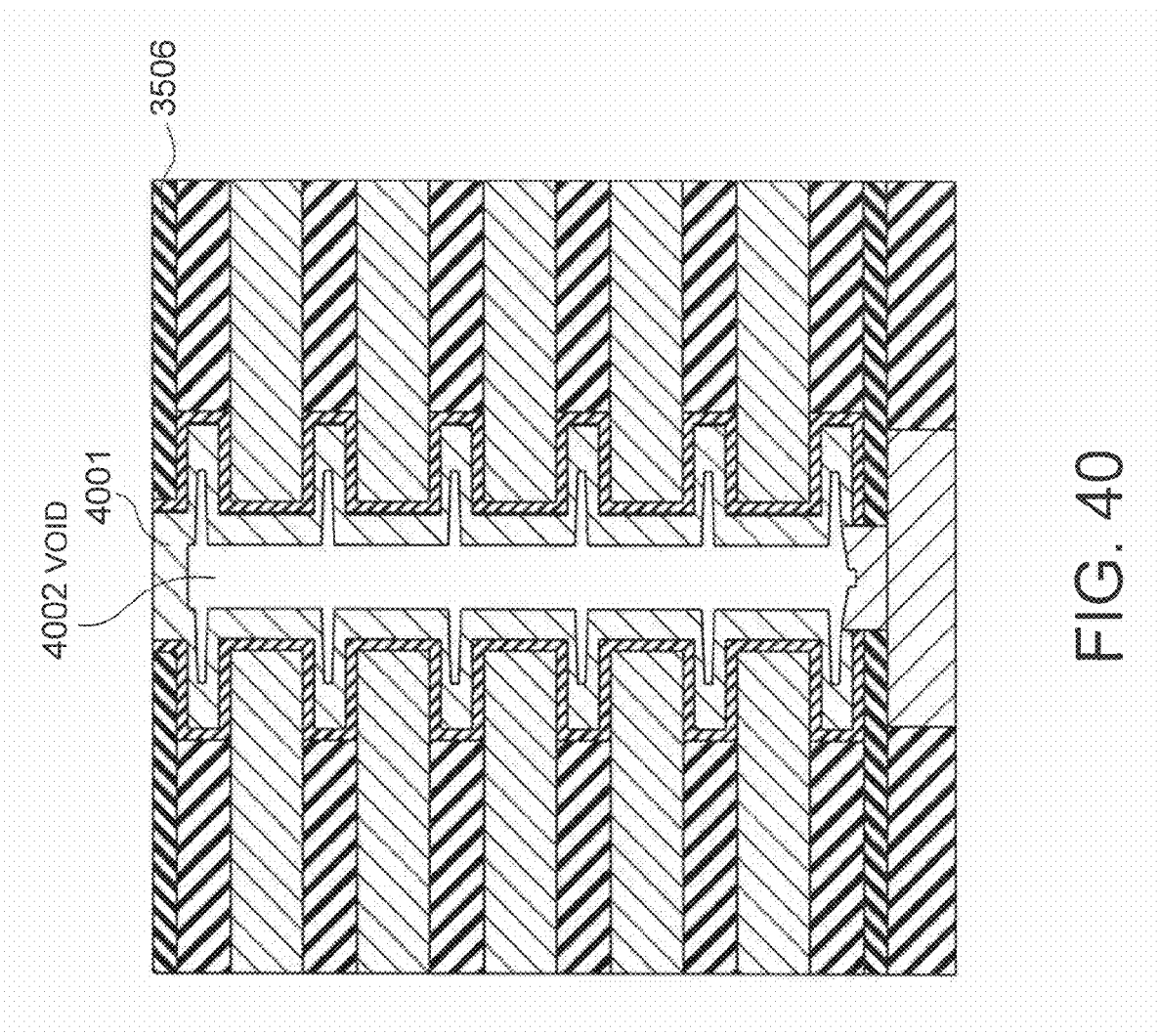
FIG. 40 is a sectional view showing a step subsequent to FIG. 39.

As shown in FIG. 40, an amorphous silicon film 4001 is deposited using CVD so as to bury the hole 3601 and contains a void 4002 and is planarized using the silicon nitride film 3506 as a stopper film. During CVD, the pressure or the temperature of the gas is raised to facilitate the formation of the void.

Then, on the amorphous silicon film 4001, which becomes a body, a drain region is formed.

Thereby, since the void is contained in the body, the body below the gate electrodes (lateral direction in the drawing) is thinned, the expansion of the deplete layer with the elevation of drain voltage is prevented, and DIBL is suppressed. Furthermore, since channels are also formed on the sides of the gate electrodes (above and below in the drawing), the channels are elongated, and a memory cell array having more favorable operating characteristics can be obtained.

Figure 41:
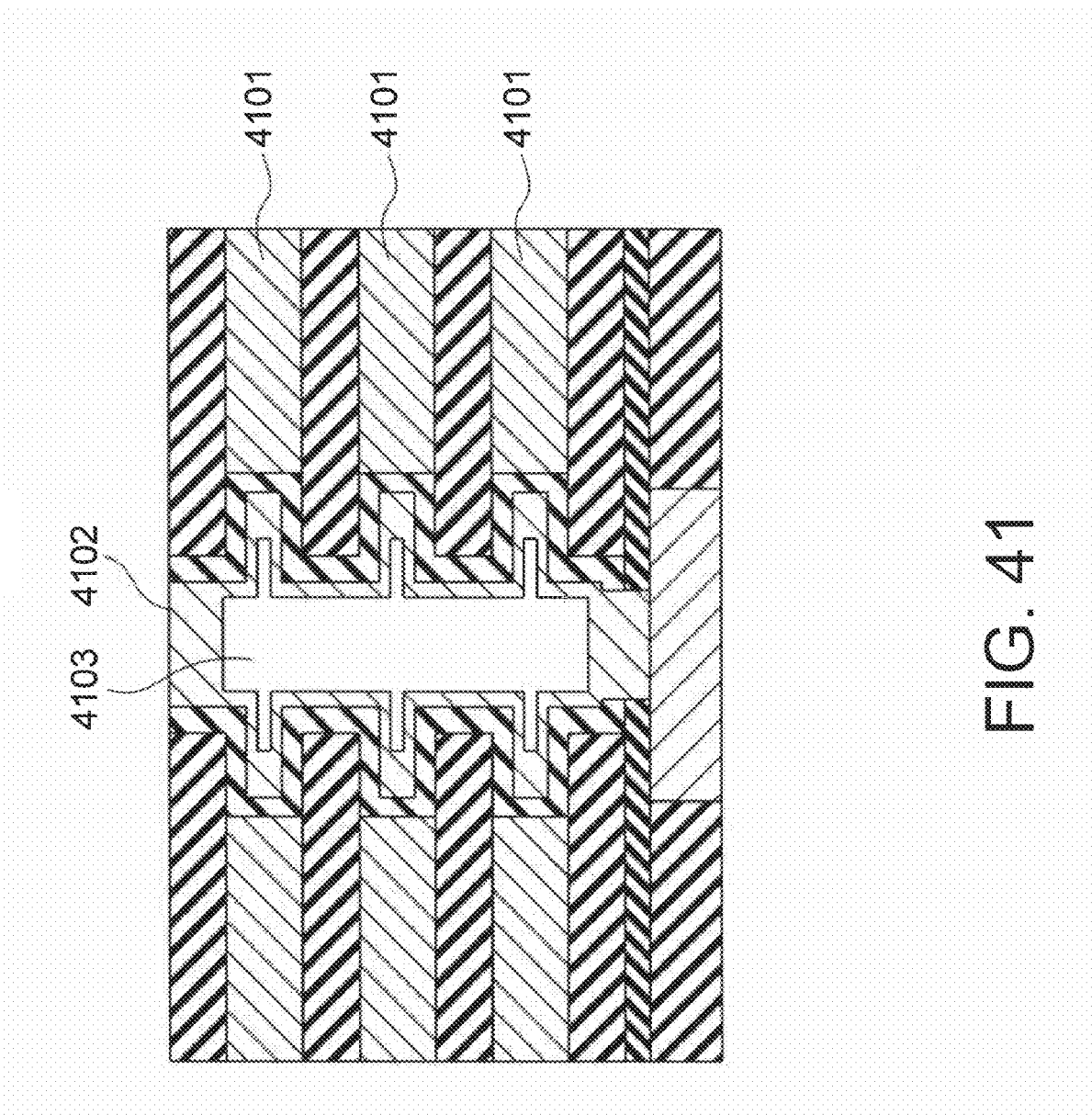
FIG. 41 is a diagram showing a schematic configuration of a semiconductor device according to a modified embodiment.

Here, although the shape wherein the silicon oxide films are recessed from the gate electrodes is formed, the shape wherein gate electrodes 4101 are recessed may be formed as shown in FIG. 41. Such a configuration can be obtained by performing dry isotropic etching having selectivity to amorphous silicon films in place of performing dry isotropic etching having selectivity to silicon oxide films as shown in FIG. 37. Although the channels are shortened, the void 4103 is easily formed below the gate 4101 (lateral direction in the drawing), and the body 4102 is thinned. Thereby, cutoff characteristics are improved.

Seventh Embodiment

Figure 42:
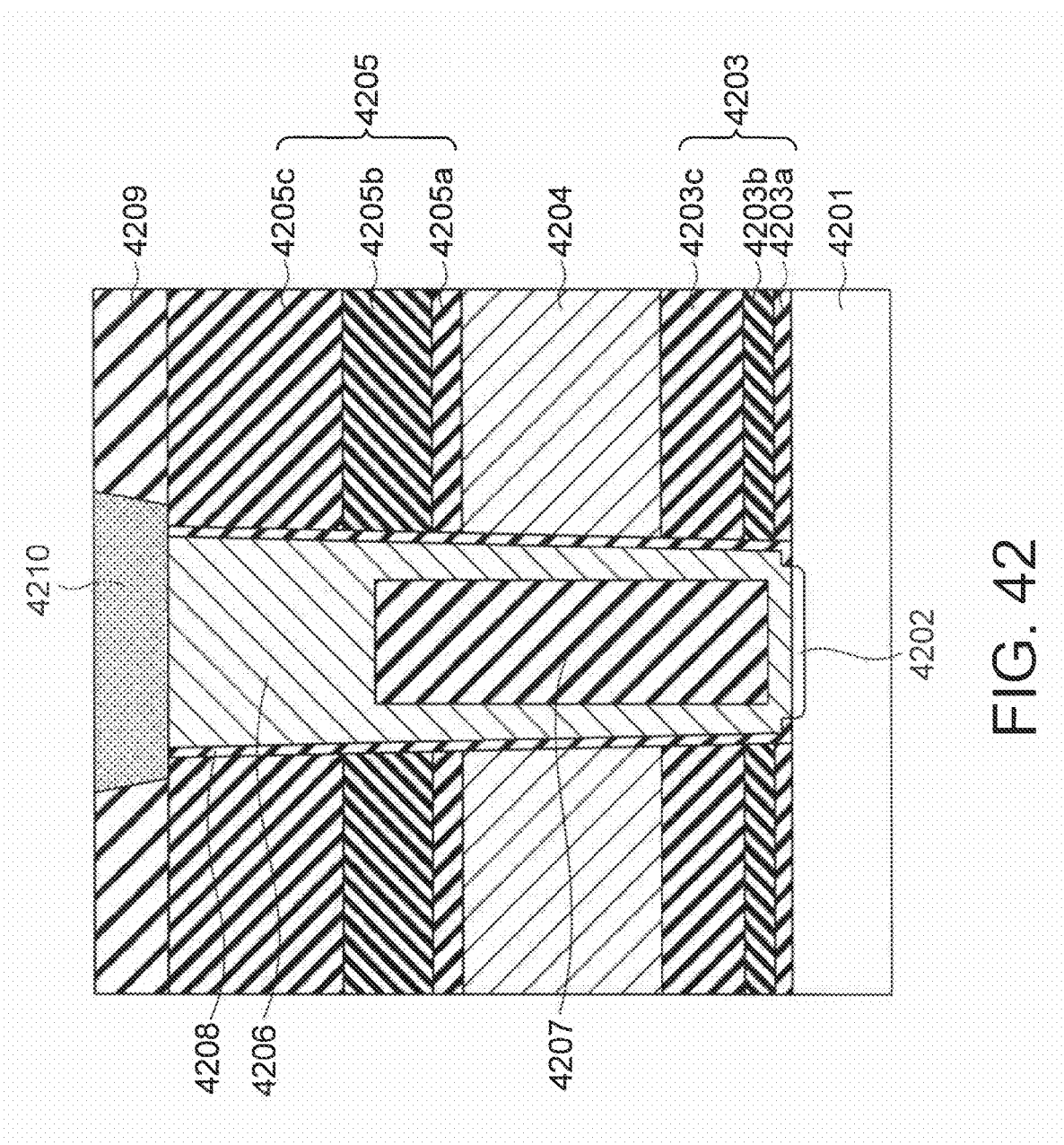
FIG. 42 is a diagram showing the schematic configuration of a semiconductor device according to the seventh embodiment of the present invention.

FIG. 42 shows the schematic configuration of a semiconductor device according to the seventh embodiment of the present invention. The semiconductor device is composed of a semiconductor substrate 4201, a source region 4202 formed on the surface portion of the semiconductor substrate 4201, an insulating layer 4203 formed on the semiconductor substrate 4201, a gate electrode 4204 formed on the insulating layer 4203, an insulating layer 4205 formed on the gate electrode 4204, and a buried oxide film 4207. The semiconductor device is also equipped with a body 4206 formed so as to penetrate the insulating layer 4203, the gate 4204 and the insulating layer 4205 in a vertical direction to connect with the source region 4202; a gate insulating film 4208 surrounding the side of the body 4206 and formed between the body 4206 and the gate electrode 4204; an insulating film 4209; and a drain region 4210.

The insulating layer 4203 has a laminated structure formed of a silicon oxide film 4203a, a silicon nitride film 4203b, and a silicon oxide film 4203c. The insulating layer 4205 has a laminated structure formed of a silicon oxide film 4205a, a silicon nitride film 4205b, and a silicon oxide film 4205c. The buried oxide film 4207 and the gate insulating film 4208 are silicon oxide films, the body 4206 is an amorphous silicon, and the insulating film 4209 is a silicon oxide film. The gate electrode 4204 is an amorphous silicon.

In the semiconductor device, since the buried oxide film 4207 is present in the body 4206, the body 4206 below the gate electrode 4204 (lateral direction in FIG. 42) is thinned. Thereby, since the expansion of the deplete layer is restricted when drain voltage is elevated, DIBL is suppressed, and cutoff characteristics can be improved.

A method for fabricating a semiconductor device according to the present embodiment will be described. Since the process is identical to the process up to the formation of the gate insulating film on the portion of the sidewalls of the hole 301 in the method for fabricating a semiconductor device according to the above-described first embodiment (FIG. 5), the description thereof will be omitted.

Figure 43:
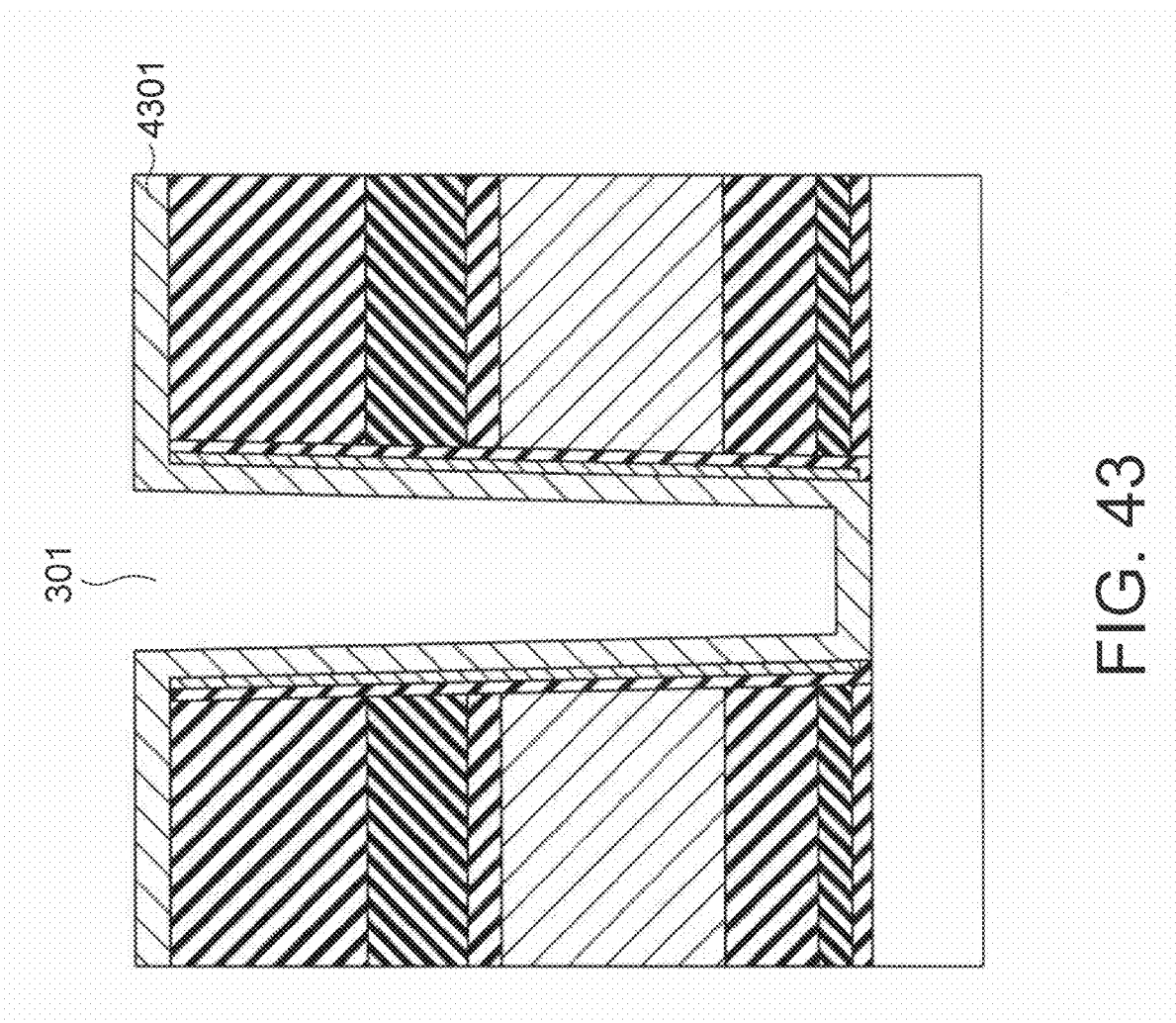
FIG. 43 is a sectional view illustrating one step of a method for manufacturing a semiconductor device according to the seventh embodiment.

As shown in FIG. 43, an amorphous silicon film 4301 having a thickness of 15 nm is deposited using CVD on the inner wall of the hole 301.

Figure 44:
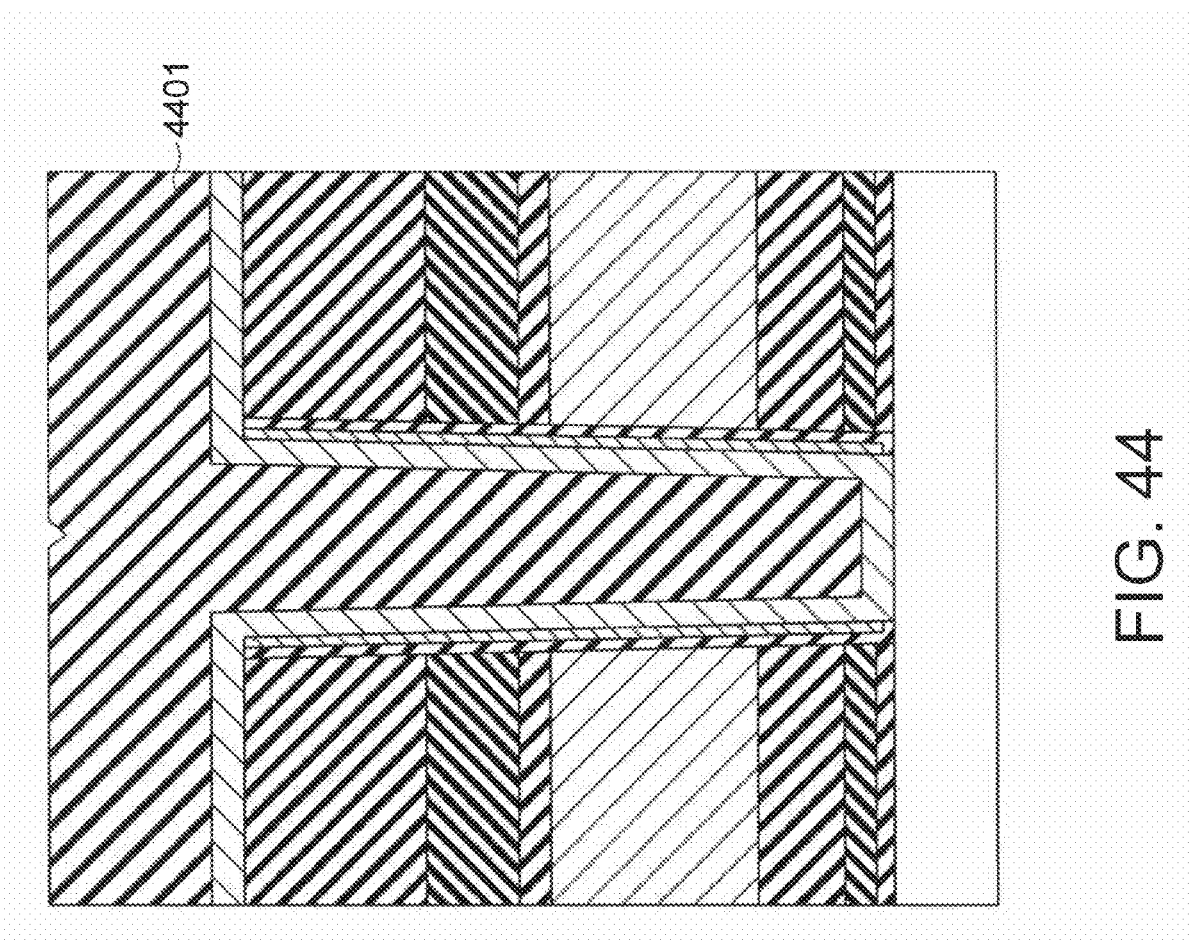
FIG. 44 is a sectional view showing a step subsequent to FIG. 43.

As shown in FIG. 44, a silicon oxide film 4401 having a thickness of 300 nm is deposited using CVD so as to bury the hole 301.

Figure 45:
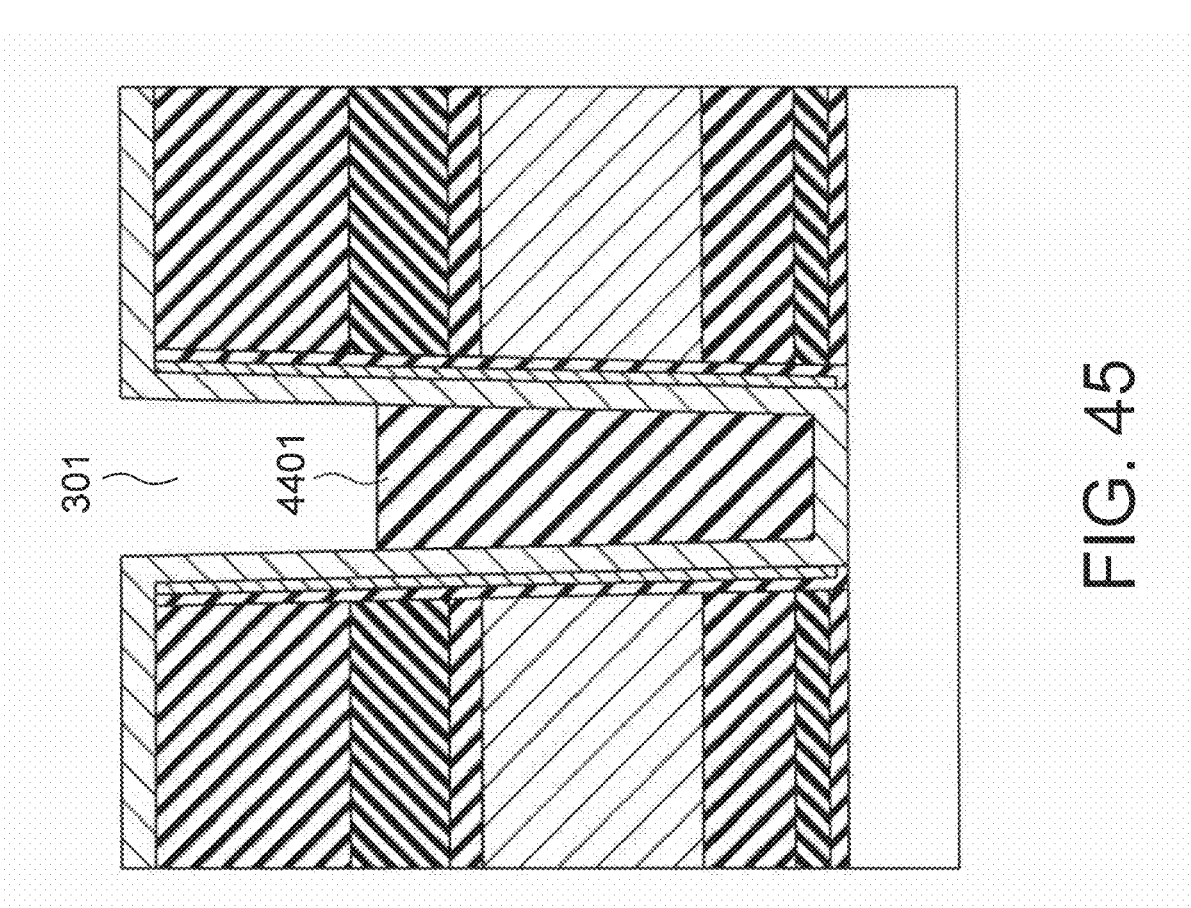
FIG. 45 is a sectional view showing a step subsequent to FIG. 44.

As shown in FIG. 45, a part of the silicon oxide film 4401 is etched off so as to have a predetermined height in the hole 301.

Then, an amorphous silicon film is deposited and planarized to form the body, a silicon oxide film is deposited on the body, and the wiring (drain region) is formed.

Thereby, a semiconductor device wherein a buried oxide film is present in the body can be obtained. Since the body below the gate electrode is thinned by the buried oxide film and the expansion of the deplete layer is restricted, DIBL can be suppressed and cutoff characteristics are improved.

Figure 46:
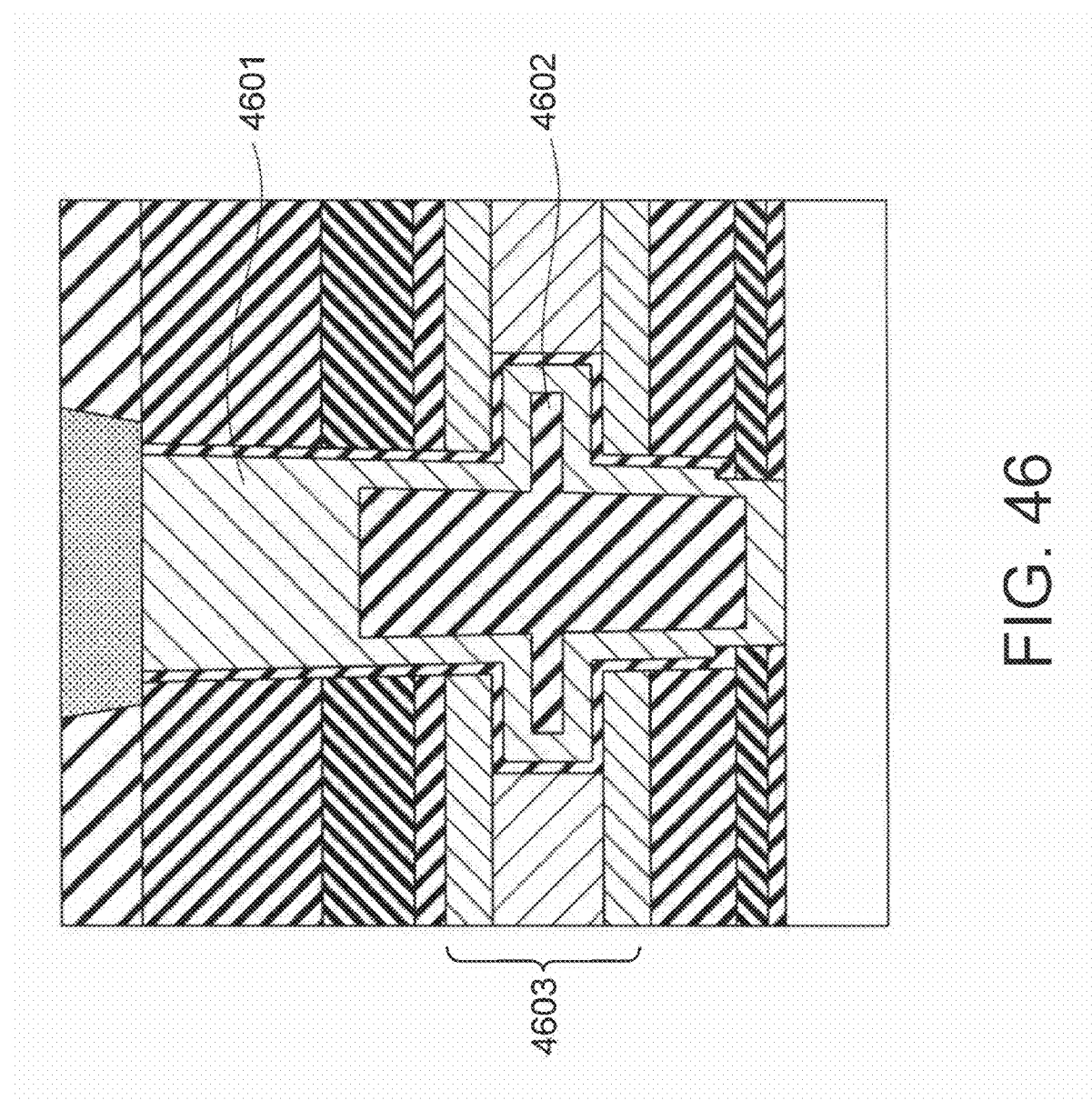
FIG. 46 is a diagram showing a schematic configuration of a semiconductor device according to a modified embodiment.

The process for fabricating a semiconductor device according to the above-described third embodiment for depositing and planarizing the amorphous silicon film 2001 so as to form a void (hollow space) in the hole 1601 (FIG. 20) may be substituted by a process for depositing a thin (for example, a film thickness of 15 nm), forming a silicon oxide film to a predetermined height in the hole, and depositing and planarizing the amorphous silicon film. Thereby, since the buried oxide film 4602 is contained in the body 4601 as shown in FIG. 46, the body below the gate electrode 4603 (lateral direction in the drawing) is thinned, the center portion of the gate 4603 is recessed, a vertical transistor having long channels and favorable cutoff characteristics can be obtained.

Figure 47:
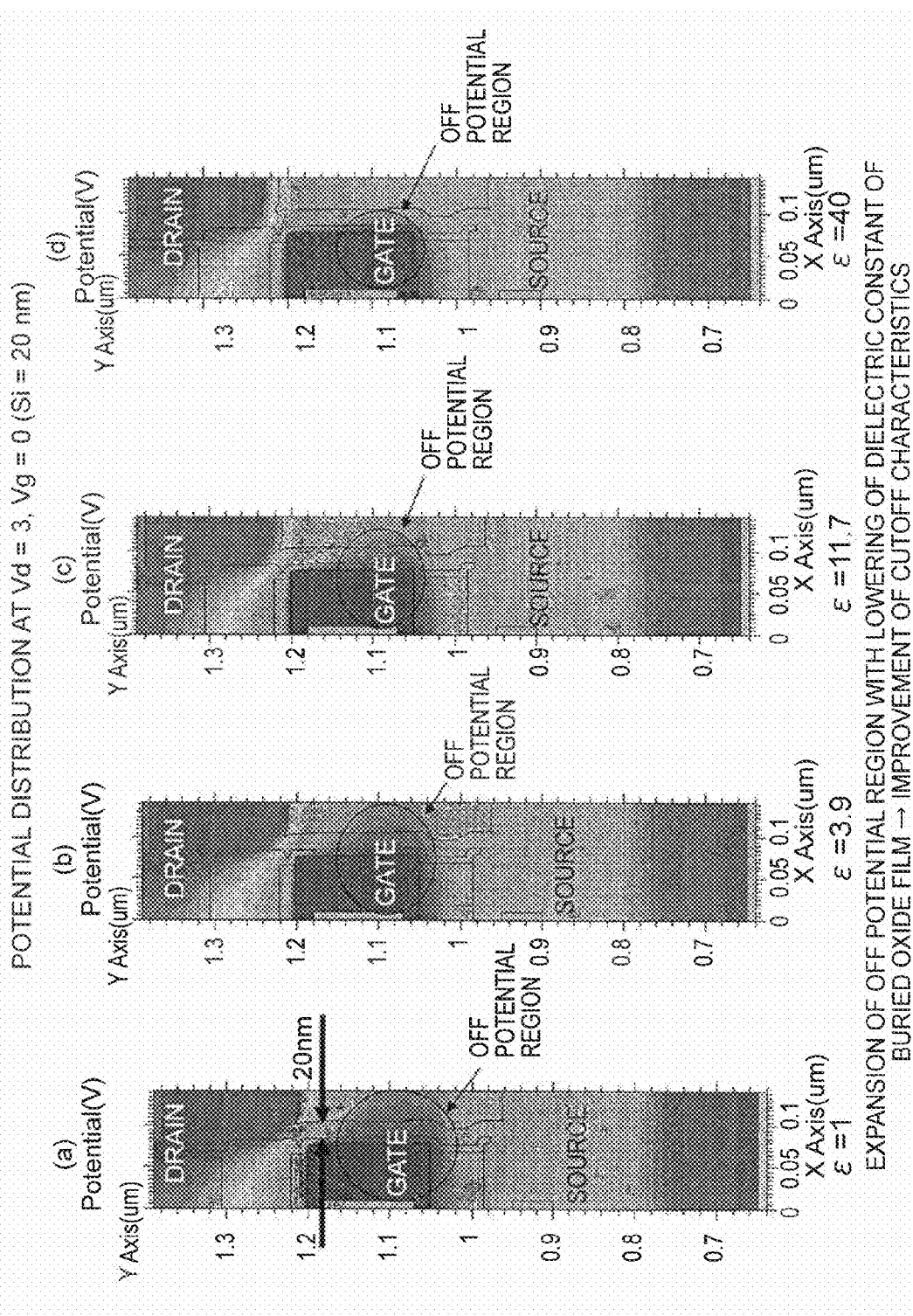
FIG. 47 is a diagram showing the results of the simulation of relationship between the dielectric constant and potential distribution of a buried oxide film.

FIG. 47 shows the results of the simulations for potential distribution when the drain voltage Vd is 3 V, the gate voltage Vg is 0 V, and the dielectric constants of the buried oxide film are varied. The thickness of the body (silicon) below the gate is 20 nm. FIG. 47(a) shows the result when a void (dielectric constant $\in=1$) is contained in the body. FIGS. 47 (b), (c) and (d) show the results when the dielectric constants $\in=1$, $\in=3.9$, $\in=11.7$, and $\in=40$, respectively. It is known that the off potential region expands with lowering the dielectric constants of the buried oxide film, and cutoff characteristics are improved. It is therefore preferable that the dielectric constant of the buried oxide film in the body is lower.

Eighth Embodiment

Figure 48:
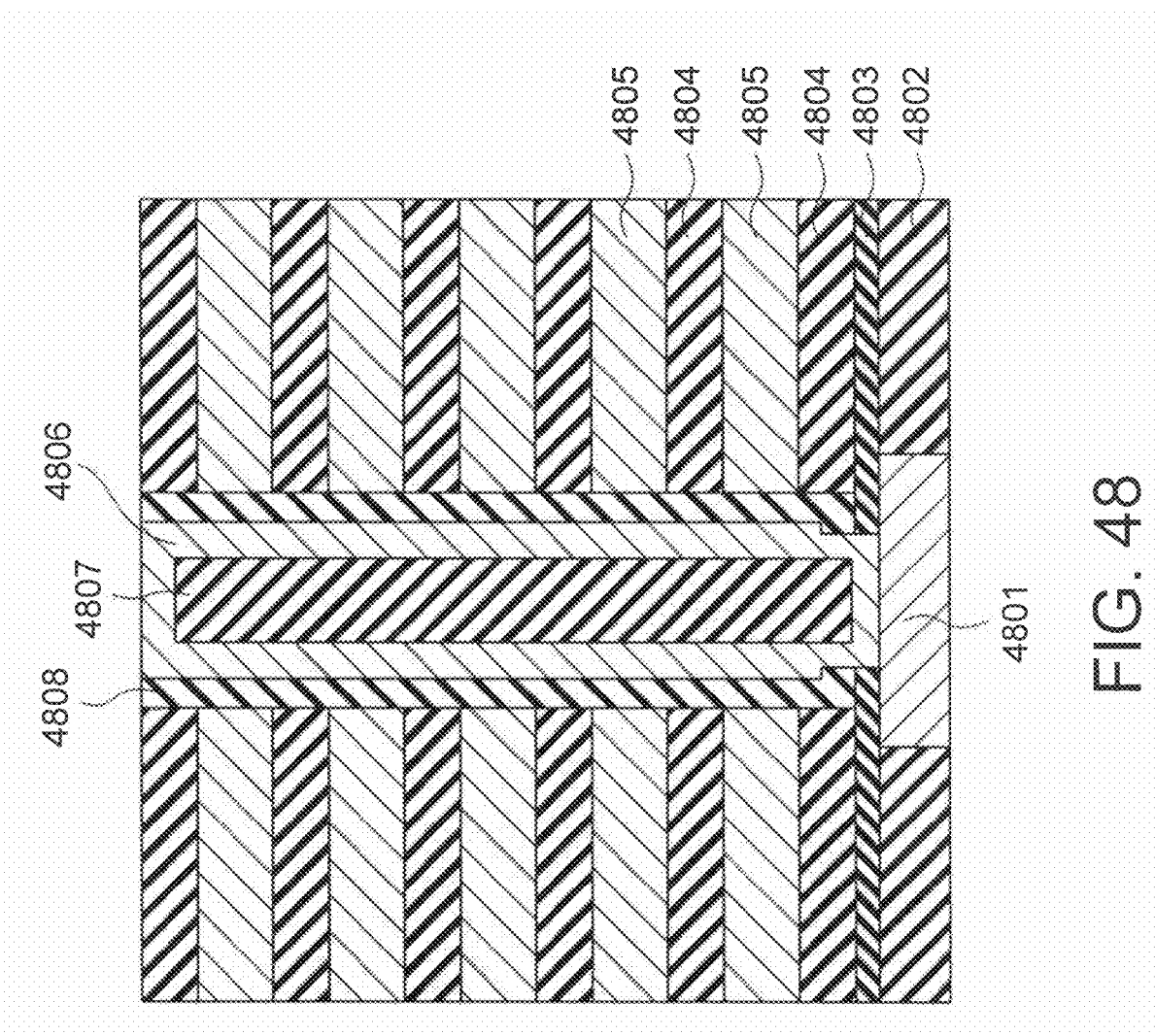
FIG. 48 is a diagram showing the schematic configuration of a semiconductor device according to the eighth embodiment of the present invention.

FIG. 48 shows the schematic configuration of a semiconductor device according to the eighth embodiment of the present invention. The semiconductor device is composed of a source region 4801, a silicon oxide film 4802 surrounding the source region 4801, a silicon nitride film 4803 formed on the source region 4801 and the silicon oxide film 4802, a plurality of silicon oxide films 4804 and gate electrodes 4805 alternately laminated on the silicon nitride film 4803, a body 4806 connected to the upper surface of the source region 4801 and penetrating through the laminated structure formed of the silicon oxide films 4804 and the gate electrodes 4805, and an ONO film 4808 coating the side surface of the body 4806 and having an electric charge accumulating ability. The body 4806 contains a buried oxide film 4807. On the body 4806, a drain region (not shown) is formed. The semiconductor device functions as a laminated memory cell array.

Since the buried oxide film 4807 is contained in the body 4806, and the body 4806 below the gate electrode 4805 (lateral direction in the drawing) is thinned, the expansion of the deplete layer with the elevation of drain voltage is prevented, and DIBL is suppressed. Therefore, the cutoff characteristics of the semiconductor device according to the present embodiment are improved, and a memory cell array having favorable operating characteristics can be obtained.

A method for fabricating the semiconductor device according to the present embodiment will be described. Since the processes are identical to the processes up to the process wherein the amorphous silicon film 3002 at the places other than the sidewall of the hole 2901 is removed to form a spacer 3101, and using the spacer 3101 as a protective material, the ONO film 3001 present on places other than the sidewall of the hole 2901 and the silicone nitride film 2803 at the bottom of the hole 2901 are removed to expose the upper surface of the impurity-diffused layer 2801 in the method for fabricating the semiconductor device according to the above-described fifth embodiment (FIG. 31), the description thereof will be omitted.

Figure 49:
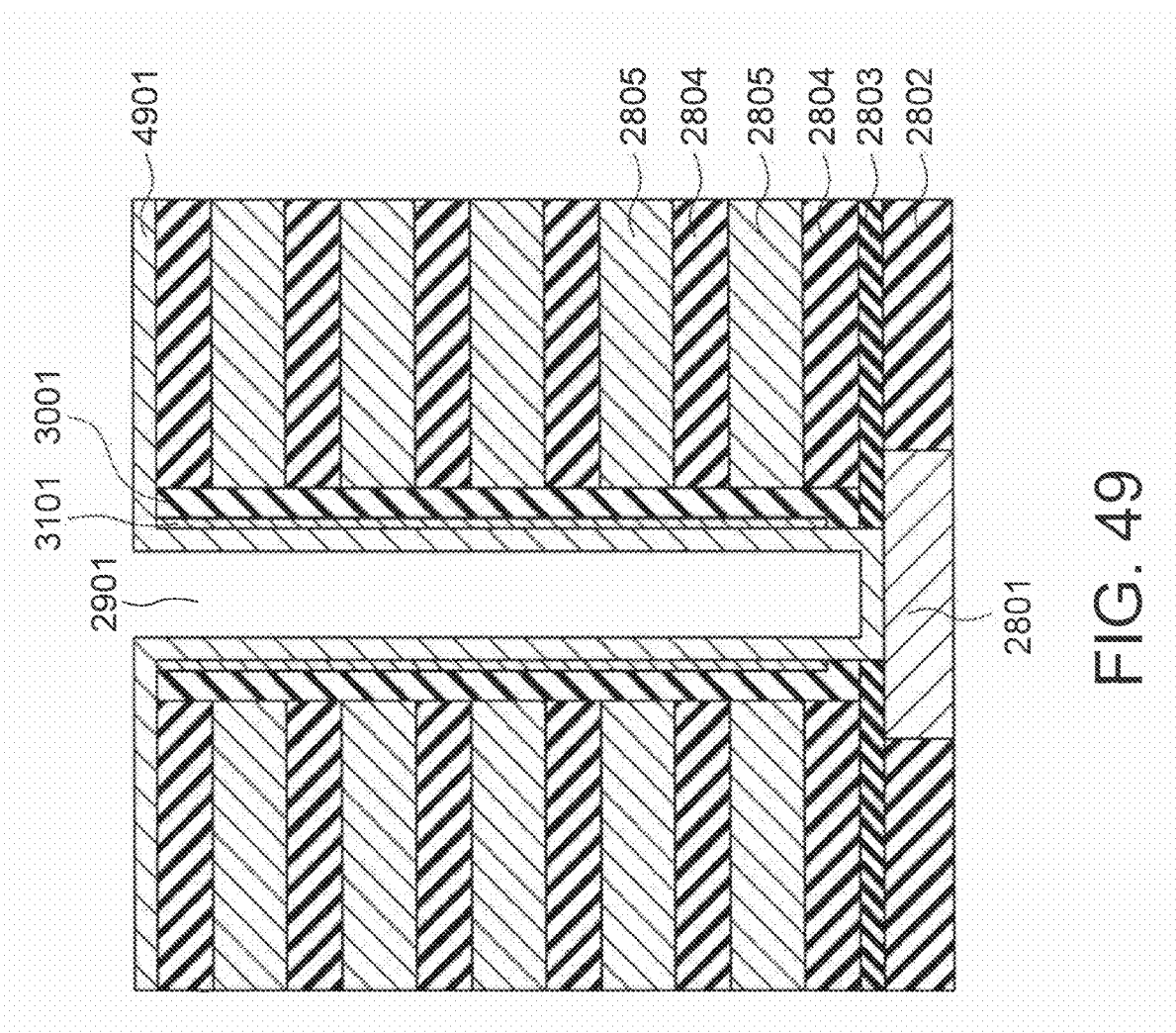
FIG. 49 is a sectional view illustrating one step of a method for manufacturing a semiconductor device according to the eighth embodiment.

As shown in FIG. 49, an amorphous silicon film 4901 having a thickness of 10 nm is deposited using CVD on the inner wall of the hole 2901.

Figure 50:
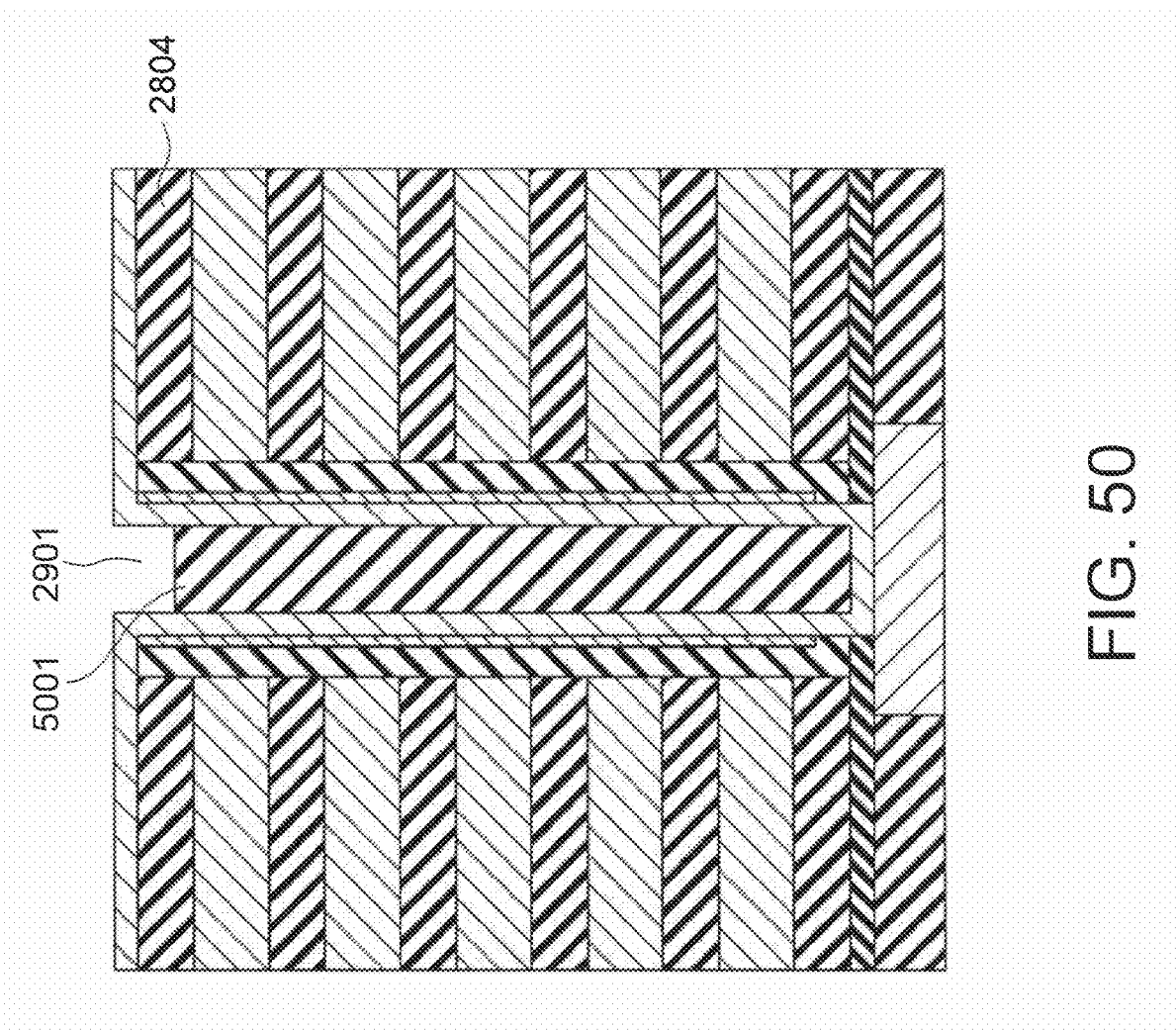
FIG. 50 is a sectional view showing a step subsequent to FIG. 49.

As shown in FIG. 50, a silicon oxide film 5001 is deposited so as to bury the hole 2901, and a part of the silicon oxide film 5001 is etched off so as to have a predetermined height in the hole 2901.

Then, a body is formed by the deposition of an amorphous silicon film and a planarization treatment using the silicon oxide film 2804 as a stopper film, and a drain region is formed on the body.

Thereby, since the buried oxide film is contained in the body, the body below the gate electrodes (lateral direction in the drawing) is thinned, the expansion of the deplete layer due to the elevation of drain voltage is prevented, DIBL is suppressed, and a memory cell array having favorable cutoff characteristics can be obtained.

Figure 51:
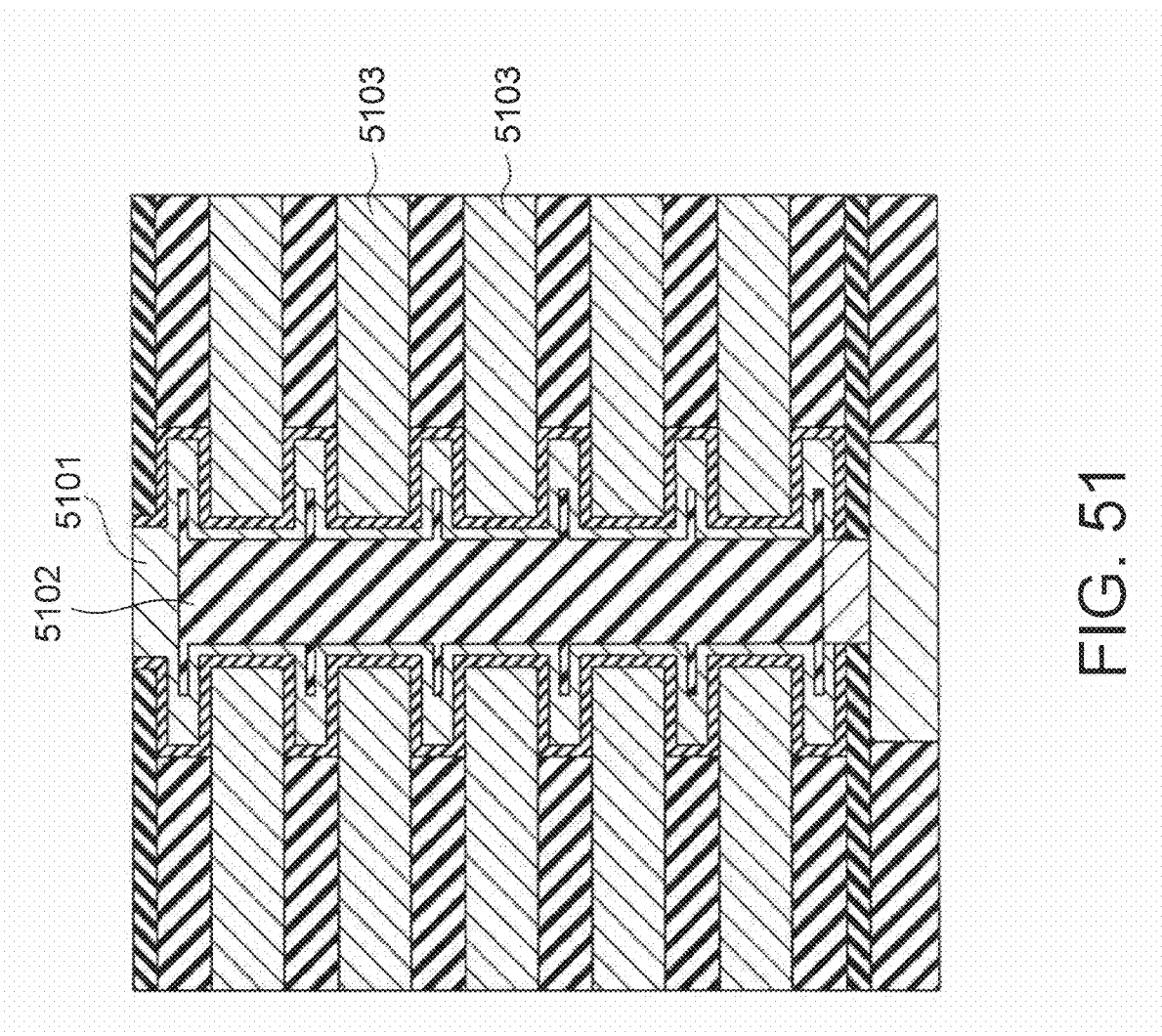
FIG. 51 is a diagram showing a schematic configuration of a semiconductor device according to a modified embodiment.

The process in the method for fabricating the semiconductor device according to the above-described sixth embodiment for burying the hole 3601, an amorphous silicon film 4001 is deposited using CVD so as to contain a void, and planarizing the amorphous silicon film 4001 using the silicon nitride film 3506 as a stopper film (FIG. 40) may be substituted by a process for depositing a thin (for example, a thickness of 10 nm) amorphous silicon film, forming a silicon oxide film to a predetermined height in the hole, and depositing and planarizing the amorphous silicon film. Thereby, since the buried oxide film 5102 is contained in the body 5101 as shown in FIG. 51, a memory cell array wherein the body 5101 below the gate electrode 5103 (lateral direction in the drawing) is thinned, channels are long, and cutoff characteristics are further improved can be obtained.

Figure 52:
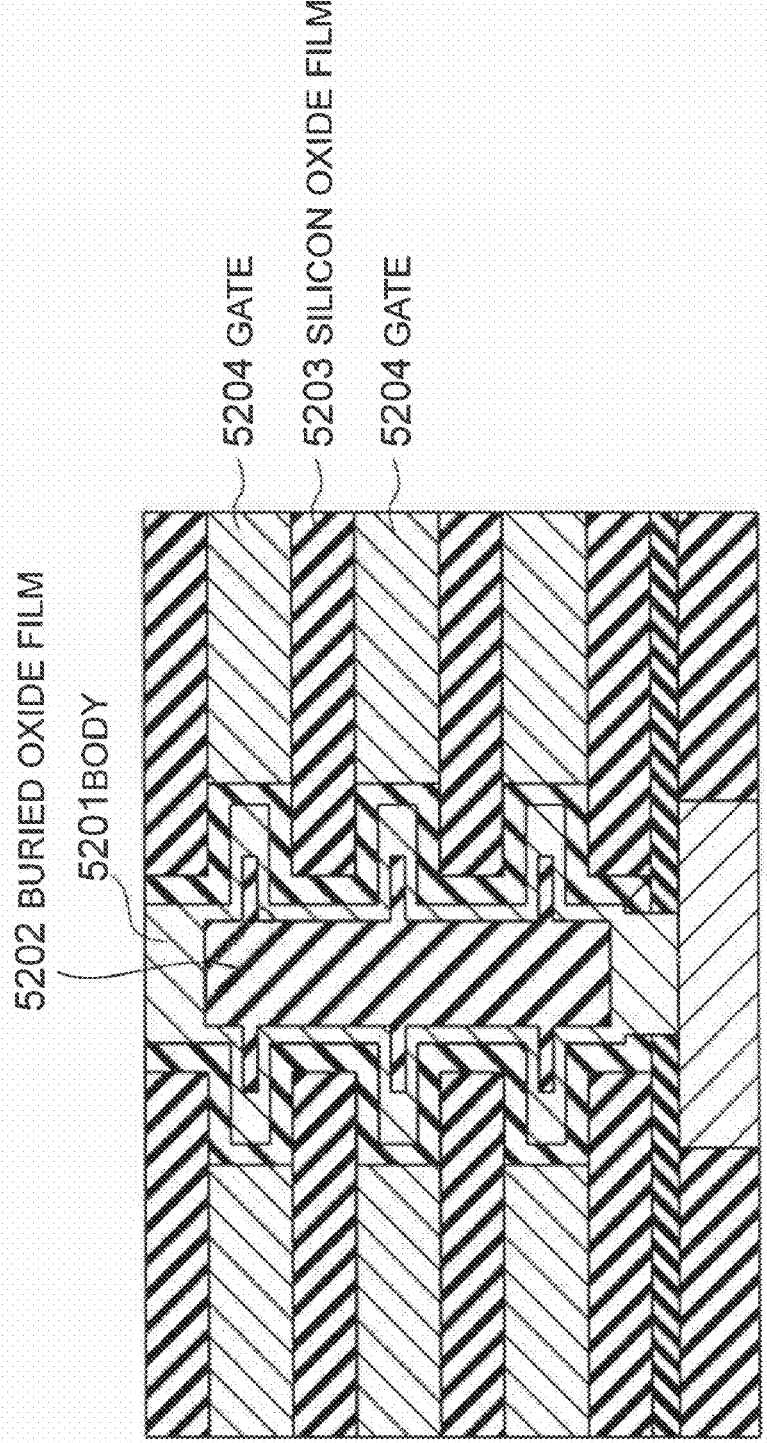
FIG. 52 is a diagram showing a schematic configuration of a semiconductor device according to a modified embodiment.

A memory cell array of the shape wherein a buried oxide film 5202 is contained in the body 5201, and the gate electrodes 5204 are recessed in comparison to the silicon oxide films 5203 as shown in FIG. 52 may also be fabricated.

COMPARATIVE EXAMPLE

Figure 53:
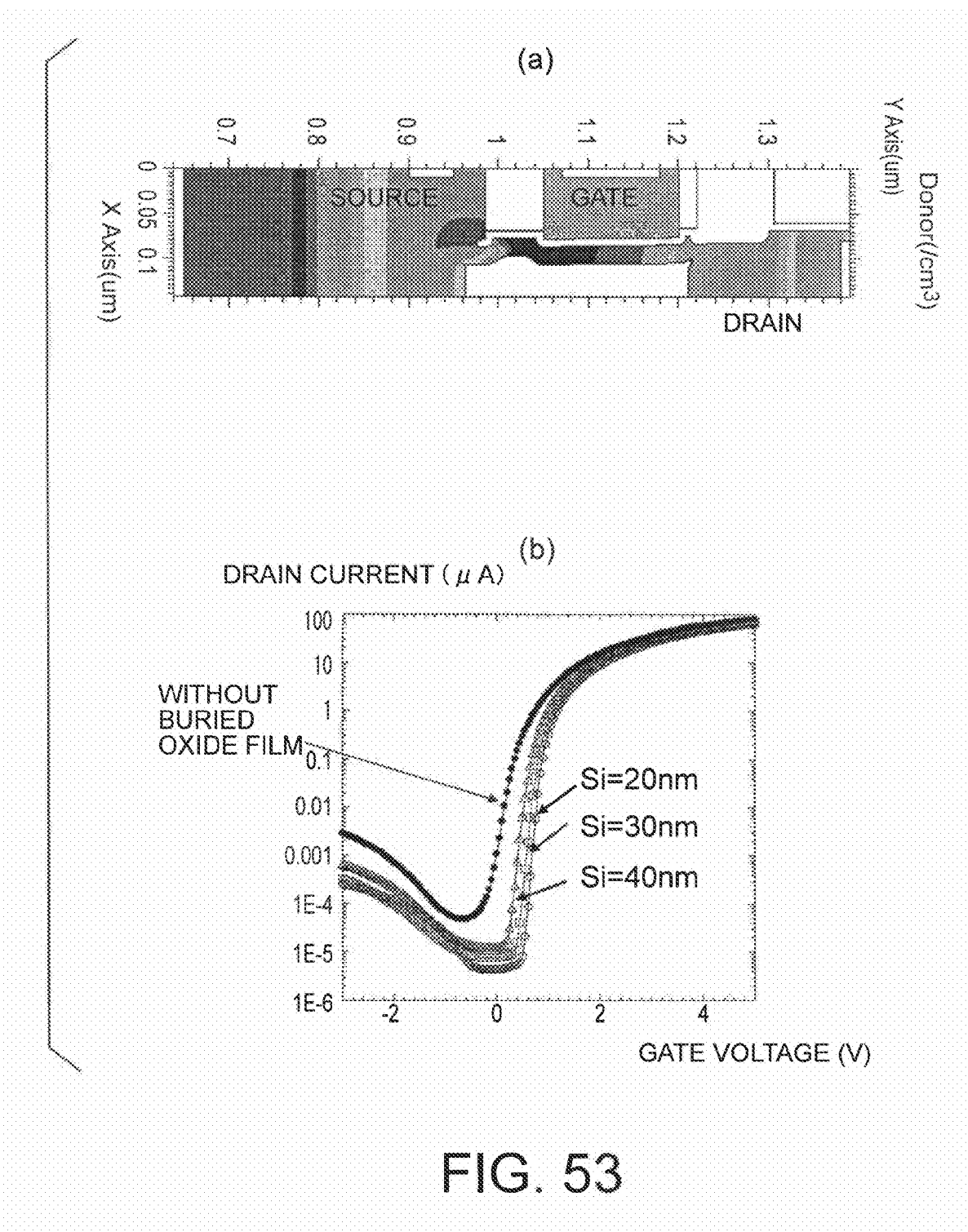
FIG. 53 is a diagram showing the results of the simulation of relationship between the gate voltage and the drain current in a semiconductor device according to a comparative example.

FIG. 53 shows the results of simulations of the relationship between gate voltage and drain current when no buried oxide film is contained in the body, specifically, the body is buried by amorphous silicon; and when a void (dielectric constant $\in=1$) is contained in the body and the thicknesses of the body (amorphous silicon) below the gate electrode are 20 nm, 30 nm and 40 nm. FIG. 53 (a) shows the cross section of the transistor structure; and FIG. 53 (b) shows the results.

From the results of the simulations, it is known that the thinner is the body (amorphous silicon) below the gate electrode, the lower is the drain current.

Figure 54:
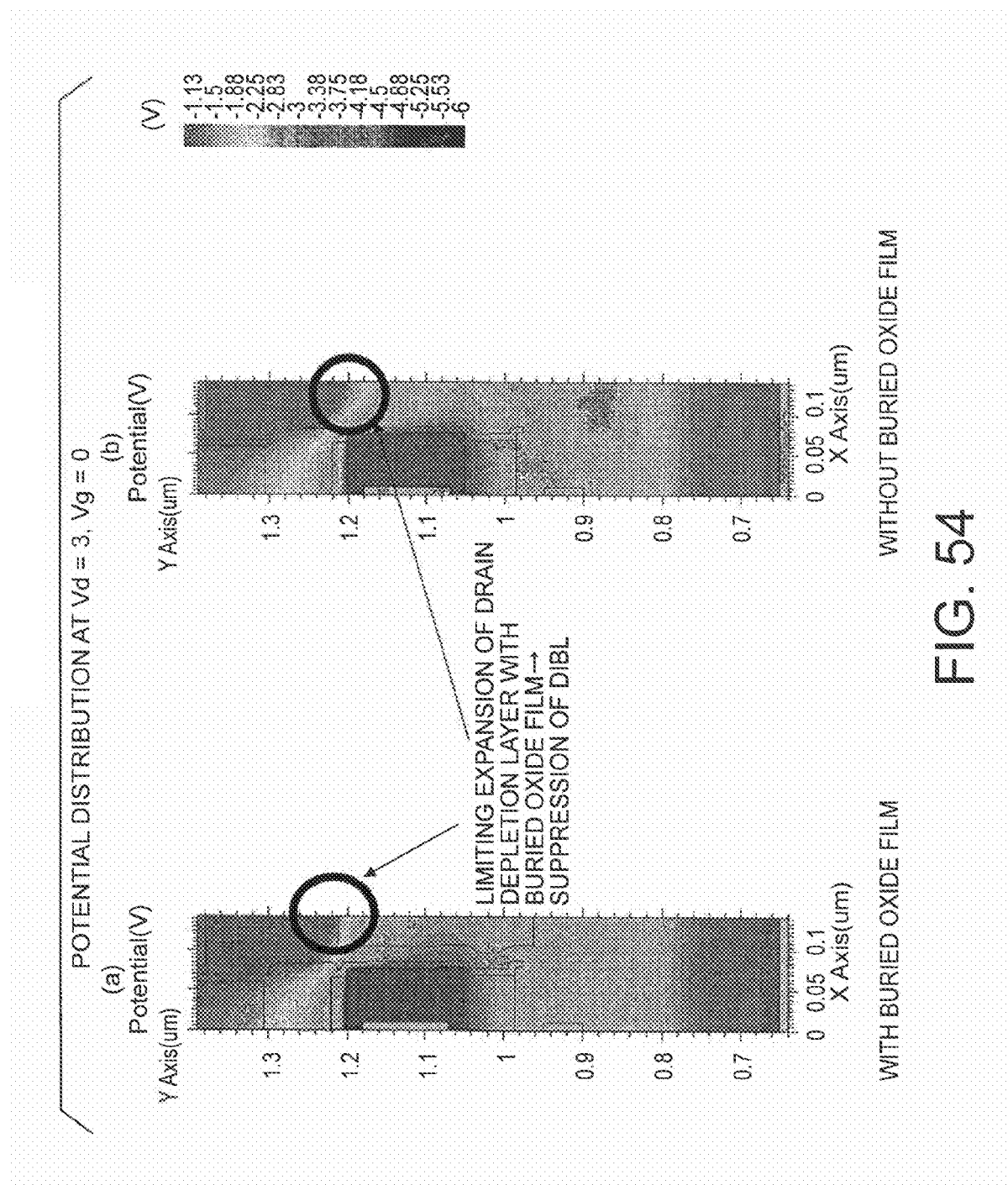
FIG. 54 is a diagram showing the results of the simulation of potential distribution in a semiconductor device according to a comparative example.

FIG. 54 shows the results of the simulations for potential distribution when the drain voltage Vd is 3 V, the gate voltage Vg is 0 V, and when no buried oxide film is contained, specifically, the body is buried by amorphous silicon (FIG. 54 (b)); and a buried oxide film (dielectric constants $\in=11.7$) is contained in the body and the thickness of the body (amorphous silicon) below the gate electrode is 20 nm (FIG. 54 (a)).

From the results of the simulations, it is known that containing the buried oxide film restricts the expansion of the deplete layer in the drain, and DIBL is suppressed.

In the semiconductor device according to the above-described embodiments, by the void or the buried oxide film in the body, the body below the gate electrode can be thinned, DIBL due to the expansion of the deplete layer in the drain can be restricted, and cutoff characteristics can be improved.

In the above-described embodiments, although a buried oxide film is contained in the body, a buried nitride film wherein a silicon nitride film is buried may be contained in place of the buried oxide film.

The source region and the drain region in the above-described embodiments are defined for the convenience of description, but the source region may be replaced by the drain region, and the drain region may be replaced by the source region.

What is claimed is:

1. A semiconductor device comprising:
    a source region surrounded by a first insulating film;
    a second insulating film formed on the first insulating film and the source region;
    a plurality of third insulating films and gate electrodes alternately laminated on the second insulating film;
    a body section connected with the source region, penetrating through the plurality of third insulating films, gate electrodes and the second insulating film, and containing a void;
    a fourth insulating film surrounding the body section, having a charge accumulating ability formed between the body section and the gate electrode; and
    a drain region formed on the body section.

2. The semiconductor device according to claim 1, wherein the diameter of the body section on the third insulating film portion is larger than the diameter on the gate electrode portion.

3. The semiconductor device according to claim 1, wherein the diameter of the body section on the gate electrode portion is larger than the diameter on the third insulating film portion.

4. The semiconductor device according to claim 1, wherein the void is filled with an insulating film.

* * * * *